United States Patent
Chou et al.

(10) Patent No.: US 10,062,859 B2
(45) Date of Patent: Aug. 28, 2018

(54) DISPLAY PANEL

(71) Applicant: AU OPTRONICS CORPORATION, Hsin-chu (TW)

(72) Inventors: Chia-Tien Chou, Hsin-chu (TW); Ya-Chun Chang, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/642,638

(22) Filed: Jul. 6, 2017

(65) Prior Publication Data
US 2018/0013086 A1 Jan. 11, 2018

(30) Foreign Application Priority Data

Jul. 11, 2016 (TW) .............................. 105121779 A

(51) Int. Cl.
*H01L 51/50* (2006.01)
*G02F 1/1345* (2006.01)

(52) U.S. Cl.
CPC ............ *H01L 51/50* (2013.01); *G02F 1/1345* (2013.01); *H01L 51/5012* (2013.01); *G02F 1/13452* (2013.01)

(58) Field of Classification Search
CPC ... H01L 51/50; H01L 51/5012; G02F 1/1345; G02F 1/13452
See application file for complete search history.

(56) References Cited

U.S. PATENT DOCUMENTS 7,009,203 B2 * 3/2006 Kim ................... H01L 27/3246
257/59
7,554,644 B2 6/2009 Chang
(Continued)

FOREIGN PATENT DOCUMENTS

CN 1632683 A 6/2005
CN 101059738 A 10/2007
(Continued)

OTHER PUBLICATIONS

Office Action issued by (TIPO) Intellectual Property Office, Ministry of Economic Affairs, R. O. C. dated Dec. 15, 2016 for Application No. 105121779, Taiwan.
(Continued)

*Primary Examiner* — Kevin Quarterman
(74) *Attorney, Agent, or Firm* — Tim Tingkang Xia, Esq.; Locke Lord LLP

(57) ABSTRACT

A display panel includes a substrate, a conductive bump, a capacitor dielectric layer, a sensing electrode, a counter substrate opposite to the substrate, an electroluminescent layer, and a counter electrode. The conductive bump protrudes from an inner surface of the substrate and includes an upper capacitor electrode and a bump covered by the upper capacitor electrode. The bump is disposed between the inner surface of the substrate and the upper capacitor electrode. The capacitor dielectric layer covers the conductive bump and a portion of the inner surface of the substrate. The sensing electrode is disposed on the inner surface of the substrate or an inner surface of the counter substrate. The counter substrate has at least one pixel electrode and a first capacitor electrode separated from the pixel electrode. The electroluminescent layer is disposed between the pixel electrode and the counter electrode.

43 Claims, 38 Drawing Sheets

(56) References Cited

U.S. PATENT DOCUMENTS

| | | |
|---|---|---|
| 7,872,724 B2 | 1/2011 | Yoon |
| 8,269,310 B2 | 9/2012 | Chen |
| 8,772,075 B2 | 7/2014 | Cho et al. |
| 8,970,520 B2 | 3/2015 | Teraguchi et al. |
| 2007/0064164 A1 | 3/2007 | Tasaka et al. |
| 2012/0249454 A1 | 10/2012 | Teraguchi et al. |
| 2013/0181923 A1 | 7/2013 | Chen et al. |
| 2014/0193934 A1 | 7/2014 | Kim |
| 2015/0049030 A1 | 2/2015 | Her |
| 2015/0380467 A1 | 12/2015 | Su |

FOREIGN PATENT DOCUMENTS

| | | |
|---|---|---|
| CN | 101339314 A | 1/2009 |
| CN | 101398572 A | 4/2009 |
| CN | 101464603 A | 6/2009 |
| CN | 202351848 U | 7/2012 |
| CN | 104716157 A | 6/2015 |
| TW | I485902 B | 5/2015 |

OTHER PUBLICATIONS

Office Action issued by (TIPO) Intellectual Property Office, Ministry of Economic Affairs, R. O. C. dated May 12, 2017 for Application No. 105121779, Taiwan.

\* cited by examiner

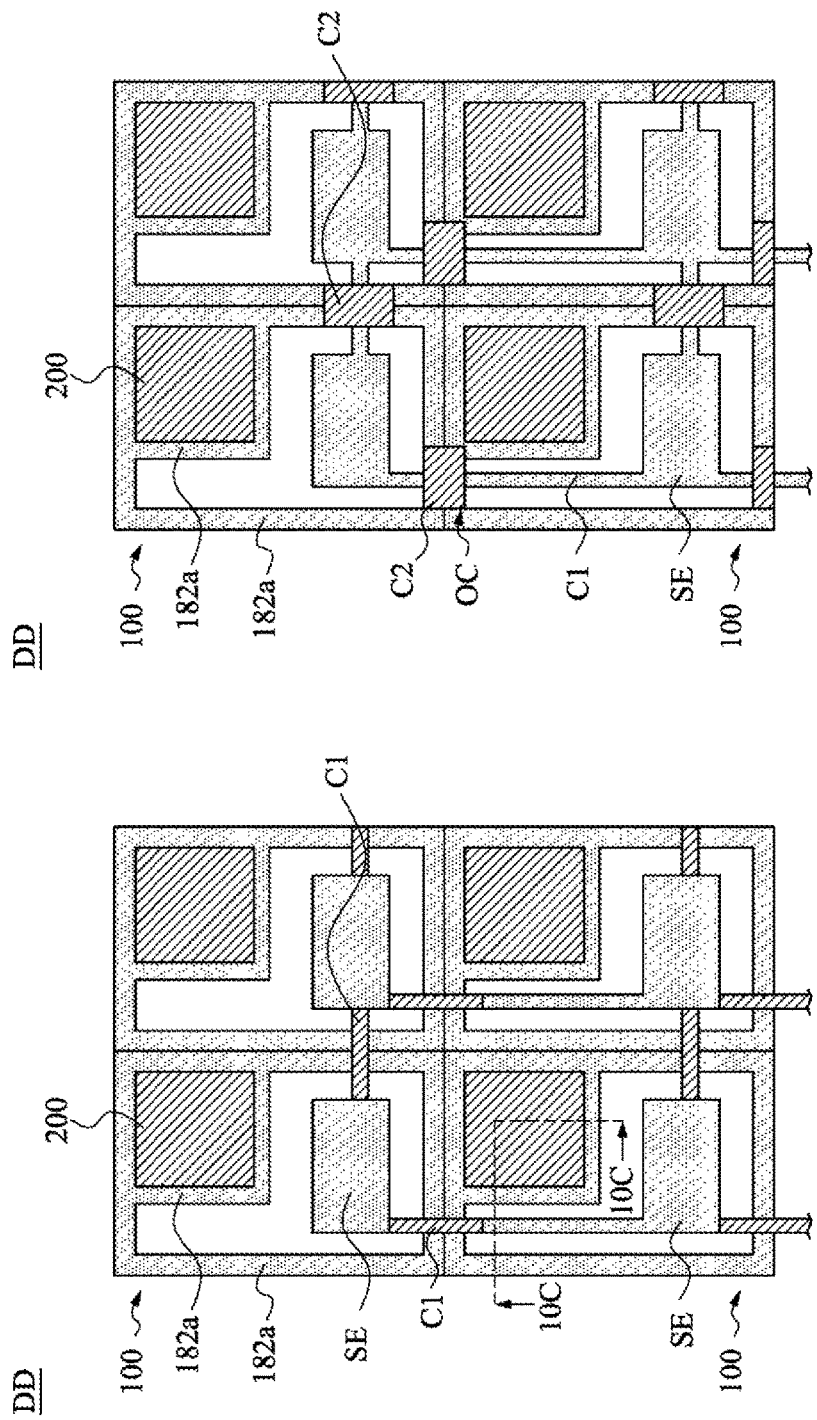

DISPLAY PANEL

CROSS-REFERENCE TO RELATED PATENT APPLICATION

This application claims the benefit of priority to Taiwan Patent Application No. 105121779, filed Jul. 11, 2016. The entire content of the above identified application is incorporated herein by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present disclosure relates to a display panel.

BACKGROUND

In various flat panel displays, Organic Light Emitting Display (OLED for short) has advantages such as a wide viewing angle, a good color contrast effect, a fast response time, and low costs, and therefore is expected to become the mainstream of a next generation of flat panel displays.

OLED has a plurality of types, for example, a top-emitting type, a bottom-emitting type, and a dual-sides emitting type. In order to maintain a required storage capacitor, an area large enough needs to be reserved. For the bottom-emitting display or the dual-sides emitting display, arrangement of a storage capacitor leads to problems of a very small effective light emitting region and a relatively small aperture ratio. Besides, if an additional touch sensing element is to be designed in an OLED, a manufacturing process becomes more complex, and an aperture ratio becomes even smaller.

SUMMARY

A plurality of implementation manners of the present disclosure provides a sub-pixel of a display panel. By means of design of providing a capacitor dielectric layer in a sub-pixel, an area of a storage capacitor is increased, that is, a storage capacitor element (e.g. solid-state storage capacitor element) is located between two substrates, and an aperture ratio is improved. In some implementation manners, a self-capacitance or mutual-capacitance sensing electrode is designed, and the sensing electrode and a patterned conductive layer in a sub-pixel are together formed, so as to enable the sub-pixel to have sensing (e.g. touch) and display functions, to simplify steps of a manufacturing process, and to reduce costs. Besides, the sensing electrode may be designed to be near a wire, so as to prevent the sensing electrode from affecting a light emitting region.

An aspect of the present disclosure provides a display panel, having a first substrate and a second substrate disposed on the first substrate, and the display panel is defined to include a plurality of sub-pixels. Each of the sub-pixels includes a data line, a scan line, a power line, a switching element, a driving element, a protective layer, a patterned electrode layer, an electroluminescent layer, a counter electrode, a conductive bump, and a capacitor dielectric layer. The data line is disposed on the first substrate, and extends along a first direction. The scan line is disposed on the first substrate, and extends along a second direction, wherein the second direction is not parallel to the first direction. The power line is disposed on the first substrate, and is electrically connected to a first voltage source. The switching element is disposed on the first substrate, and includes two end points and a first gate electrode, wherein one of the end points is electrically connected to the data line, and the first gate electrode is electrically connected to the scan line. The driving element includes two end points and a second gate electrode, wherein one of the end points is electrically connected to the power line, and the second gate electrode is electrically connected to the other end point of the switching element through a connecting wire. The protective layer covers the scan line, the data line, the power line, the switching element, the driving element, the connecting wire, and the first substrate, and includes a first through hole and a second through hole. The patterned electrode layer is disposed on the protective layer, wherein the patterned electrode layer includes a first capacitor electrode and a pixel electrode separated from the first capacitor electrode; the pixel electrode is electrically connected to the other end point of the driving element through the first through hole; and the first capacitor electrode is electrically connected to the connecting wire through the second through hole. The electroluminescent layer is disposed on the pixel electrode. The counter electrode is disposed on the electroluminescent layer and is electrically connected to a second voltage source, wherein the second voltage source is different from the first voltage source. The conductive bump protrudes from an inner surface of the second substrate, wherein the conductive bump includes a conductive material, and the conductive bump is disposed corresponding to the first capacitor electrode in a vertical projection direction. The capacitor dielectric layer covers the conductive bump and the inner surface of the second substrate, wherein the conductive bump, the capacitor dielectric layer, and the first capacitor electrode form a storage capacitor.

In some implementation manners of the present disclosure, the display panel further includes a second capacitor electrode, disposed on the capacitor dielectric layer, wherein the second capacitor electrode is located at a top portion of the conductive bump, two opposite surfaces of the second capacitor electrode are in contact with the capacitor dielectric layer and the first capacitor electrode, respectively, and the conductive bump, the capacitor dielectric layer, the second capacitor electrode, and the first capacitor electrode form the storage capacitor.

In some implementation manners of the present disclosure, the second capacitor electrode further extends to cover the capacitor dielectric layer at a lateral side of the conductive bump or to cover the capacitor dielectric layer at the lateral side of the conductive bump and on the inner surface of the second substrate.

In some implementation manners of the present disclosure, the display panel further includes a conductive buffer layer, disposed on the first capacitor electrode, wherein the conductive buffer layer is in contact with the first capacitor electrode, and the conductive bump, the capacitor dielectric layer, the conductive buffer layer, and the first capacitor electrode form the storage capacitor.

In some implementation manners of the present disclosure, the display panel further includes a second capacitor electrode, disposed on the capacitor dielectric layer, wherein two opposite surfaces of the second capacitor electrode are in contact with the capacitor dielectric layer and the conductive buffer layer, respectively, and the conductive bump, the capacitor dielectric layer, the second capacitor electrode, the conductive buffer layer, and the first capacitor electrode form the storage capacitor.

In some implementation manners of the present disclosure, the conductive bump includes an upper capacitor electrode and a bump; each of the sub-pixels has a light emitting region corresponding to the electroluminescent layer and a non-light emitting region at least disposed at a side of the light emitting region; the bump is located at the non-light emitting region; and the upper capacitor electrode at least covers the bump.

In some implementation manners of the present disclosure, the upper capacitor electrode completely covers the second substrate and the bump.

In some implementation manners of the present disclosure, the display panel further includes a second capacitor electrode, disposed on the capacitor dielectric layer, wherein two opposite surfaces of the second capacitor electrode are in contact with the capacitor dielectric layer and the first capacitor electrode, respectively, and the upper capacitor electrode, the capacitor dielectric layer, the second capacitor electrode, and the first capacitor electrode form the storage capacitor.

In some implementation manners of the present disclosure, the sub-pixels are defined with at least two first sensing electrode regions and at least two second sensing electrode regions separated from the first sensing electrode regions; the display panel further includes: a plurality of sensing electrode, disposed at the first sensing electrode regions and the second sensing electrode regions, respectively; each of the sensing electrodes partially overlaps the non-light emitting region; and sensing electrodes at the first sensing electrode regions are separated from sensing electrodes at the second sensing electrode regions.

In some implementation manners of the present disclosure, the display panel further includes at least one first connection electrode and a second capacitor electrode. The first connection electrode is disposed on the second substrate, wherein the first connection electrode is connected to the upper capacitor electrodes of two adjacent sub-pixels, and the first connection electrode is separated from and partially overlaps sensing electrodes of the two adjacent sub-pixels. The second capacitor electrode is disposed on the second substrate, and is located at a side of the capacitor dielectric layer that faces the patterned electrode layer, wherein the second capacitor electrode at least partially overlaps the upper capacitor electrode.

In some implementation manners of the present disclosure, the sub-pixels are defined with a first bridge electrode region and a second bridge electrode region separated from and interlaced with the first bridge electrode region, and the display panel further includes a second connection electrode and a third connection electrode. The second connection electrode is disposed on the second substrate, and is located at each of the sub-pixels of the first bridge electrode region, so as to be connected to one of sensing electrodes located at each of the first sensing electrode regions. The third connection electrode is disposed on the second substrate, and is located at each of the sub-pixels of the second bridge electrode region, so as to be connected to another one of sensing electrodes at each of the second sensing electrode regions, wherein the second connection electrode is separated from and interlaced with the third connection electrode.

In some implementation manners of the present disclosure, the second connection electrode includes at least one first sub-pixel segment and at least one second sub-pixel segment. The first sub-electrode segment is located between two adjacent sub-pixels of the first bridge electrode region, wherein the first sub-electrode segment partially overlaps sensing electrodes of the two adjacent sub-pixels at the first bridge electrode region. The second sub-electrode segment is located at each of the sub-pixels of the first bridge electrode region, so as to be connected to the first sub-electrode segment.

In some implementation manners of the present disclosure the sub-pixels are defined with at least two first sensing electrode regions and at least two second sensing electrode regions separated from the first sensing electrode regions, wherein the display panel further includes a sensing electrode and at least one first connection electrode. A plurality of sensing electrodes are disposed on the first sensing electrode regions and the second sensing electrode regions, respectively, and each of the sensing electrodes partially overlaps the light emitting region, wherein sensing electrodes at the first sensing electrode regions are separated from sensing electrodes at the second sensing electrode regions. The display panel further includes the first connection electrode, disposed on the second substrate, wherein the first connection electrode is connected to the sensing electrodes of two adjacent sub-pixels.

In some implementation manners of the present disclosure, the display panel further includes a second capacitor electrode and at least one second connection electrode. The second capacitor electrode is disposed on the second substrate, and is located at a side of the capacitor dielectric layer that faces the patterned electrode layer, wherein the second capacitor electrode partially overlaps the upper capacitor electrode. The second connection electrode is disposed on the second substrate, wherein the second connection electrode is connected to the upper capacitor electrodes of two adjacent sub-pixels, and the second connection electrode is separated from the first connection electrode.

In some implementation manners of the present disclosure, the sub-pixels are defined with a first bridge electrode region and a second bridge electrode region separated from and interlaced with the first bridge electrode region, wherein the display panel further includes a second capacitor electrode and at least one second connection electrode. The second capacitor electrode is disposed on the second substrate, and is located at a side of the capacitor dielectric layer that faces the patterned electrode layer, wherein the second capacitor electrode partially overlaps the upper capacitor electrode. The second connection electrode is disposed on the second substrate, and extends to pass through the sub-pixels at the second bridge electrode region, so as to be electrically connected to the sensing electrode at each of the second sensing electrode regions, wherein the second connection electrode is separated from the first connection electrode, and the second connection electrode is not connected to any sensing electrode at the second bridge electrode region.

In some implementation manners of the present disclosure, the sub-pixels are defined with a first bridge electrode region and a second bridge electrode region separated from and interlaced with the first bridge electrode region, wherein the display panel further includes a third connection electrode, disposed on the second substrate, and located at each of the sub-pixels of the second bridge electrode region, so as to be connected to the sensing electrode at each of the second sensing electrode regions, wherein the third connection electrode is separated from the sensing electrode of each of the sub-pixels at the second bridge electrode region.

In some implementation manners of the present disclosure, the display panel further includes a bank, disposed on the protective layer, and having a first opening and a second opening, wherein the first opening does not shelter at least a portion of the first capacitor electrode; the second opening does not shelter at least a portion of the pixel electrode; and the electroluminescent layer and the counter electrode are located in the second opening.

In some implementation manners of the present disclosure, the sub-pixels are defined with at least two first sensing electrode regions and at least two second sensing electrode regions separated from the first sensing electrode regions; the patterned electrode layer further includes: a sensing electrode, each of the first sensing electrode regions and the second sensing electrode regions on the first substrate is disposed with a sensing electrode; the sensing electrode partially overlaps the non-light emitting region; the pixel electrode and the first capacitor electrode of each of the sub-pixels are separated from the sensing electrode of each of the sub-pixels; and the sensing electrodes of the first sensing electrode regions are separated from the sensing electrodes of the second sensing electrode regions.

In some implementation manners of the present disclosure, the display panel further includes a bank, disposed on the protective layer, and having a first opening and a second opening, wherein the first opening does not shelter at least a portion of the first capacitor electrode; the second opening does not shelter at least a portion of the pixel electrode; the electroluminescent layer and the counter electrode are located in the second opening; and the bank covers the sensing electrode.

In some implementation manners of the present disclosure, the sub-pixels are defined with at least two first sensing electrode regions and at least two second sensing electrode regions separated from the first sensing electrode regions; the display panel further includes: a plurality of sensing electrodes, disposed on each of the first sensing electrode regions and the second sensing electrode regions on the first substrate, respectively; each of the sensing electrodes partially overlaps the non-light emitting region; the pixel electrode, the counter electrode, and the first capacitor electrode of each of the sub-pixels are separated from the sensing electrode; and the sensing electrodes of the first sensing electrode regions are separated from the sensing electrodes of the second sensing electrode regions.

In some implementation manners of the present disclosure, the display panel further includes at least one first connection electrode, disposed between two adjacent sub-pixels of each of the first sensing electrode regions and the second sensing electrode regions respectively, so as to be connected to the counter electrodes of the two sub-pixels, wherein the pixel electrode, the sensing electrode, and the first capacitor electrode of each of the sub-pixels are separated from the first connection electrode.

In some implementation manners of the present disclosure, the display panel further includes a bank, disposed on the protective layer, and having a first opening and a second opening, wherein the first opening does not shelter at least a portion of the first capacitor electrode; the second opening does not shelter at least a portion of the pixel electrode; the electroluminescent layer and the counter electrode are located in the second opening; the sensing electrode is disposed on the bank; and the bank covers the first connection electrode.

In some implementation manners of the present disclosure, the sub-pixels have at least one first sensing electrode region and at least one second sensing electrode region interlaced with and separated from the first sensing electrode region; the patterned electrode layer further includes: at least one first sensing electrode, disposed on each of the sub-pixels of the first sensing electrode region of the first substrate and connected to each other; the first sensing electrode partially overlaps the non-light emitting region; the pixel electrode and the first capacitor electrode of each of the sub-pixels are separated from the first sensing electrode. The display panel further includes a bank and at least one second sensing electrode. The bank is disposed on the protective layer, and has a first opening and a second opening; the first opening does not shelter at least a portion of the first capacitor electrode; the second opening does not shelter at least a portion of the pixel electrode; the electroluminescent layer and the counter electrode are located in the second opening; and the bank covers the first sensing electrode. The second sensing electrode is disposed on each of the sub-pixels of the second sensing electrode region of the first substrate respectively and connected to each other; the second sensing electrode partially overlaps the non-light emitting region; the second sensing electrode is disposed on the bank; the counter electrode of each of the sub-pixels is separated from the second sensing electrode; and the first sensing electrode is separated from the second sensing electrode.

In some implementation manners of the present disclosure, at least one interlacing region is provided at an interlacing position of the first sensing electrode region and the second sensing electrode region; the first and the second sensing electrodes are interlaced at the interlacing region; and the display panel further includes at least one first connection electrode and at least one second connection electrode. The first connection electrode is disposed at each of the sub-pixels of the first substrate, so as to be connected to the second sensing electrode of each of the sub-pixels, wherein the second sensing electrode of each of the sub-pixels is separated from the pixel electrode of the sub-pixel. The second connection electrode is disposed at each of the sub-pixels of the first substrate, the second connection electrode is located at the bank and is connected to the counter electrodes of two adjacent sub-pixels in the interlacing region, and the first connection electrode and the second connection electrode are interlaced at the interlacing region.

In some implementation manners of the present disclosure, the bank further covers the first sensing electrode and a portion of the first connection electrode, and the second connection electrode is located at the bank.

In some implementation manners of the present disclosure, the sub-pixels have at least one first sensing electrode region and at least one second sensing electrode region interlaced with and separated from the first sensing electrode region, wherein the display panel further includes at least one first sensing electrode and at least one second sensing electrode. The first sensing electrodes are disposed on the sub-pixels of the first sensing electrode region of the second substrate respectively and are connected to each other, the first sensing electrodes partially overlap the non-light emitting region, and the upper capacitor electrode and the second capacitor electrode of each of the sub-pixels are separated from the corresponding first sensing electrode. The second sensing electrodes are disposed on the sub-pixels of the second sensing electrode region of the first substrate respectively and are connected to each other, the second sensing electrodes partially overlap the non-light emitting region, the pixel electrode and the first capacitor electrode of each of the sub-pixels are separated from the corresponding second sensing electrode, and the first sensing electrodes are separated from the second sensing electrodes.

In some implementation manners of the present disclosure, the display panel further includes a bank, disposed on the protective layer, and having a first opening and a second opening, wherein the first opening does not shelter at least a portion of the first capacitor electrode; the second opening does not shelter at least a portion of the pixel electrode; and the electroluminescent layer and the counter electrode are located in the second opening.

In some implementation manners of the present disclosure, at least one interlacing region is provided at an interlacing position of the first sensing electrode region and the second sensing electrode region; the first and the second sensing electrodes are interlaced at the interlacing region; and the display panel further includes at least one first connection electrode and at least one second connection electrode. The first connection electrode is disposed at each of the sub-pixels of the second substrate, so as to be connected to the first sensing electrode of each of the sub-pixels, wherein the second capacitor electrode of each of the sub-pixels is separated from the first connection electrode. The second connection electrode is disposed at each of the sub-pixels of the second substrate and is connected to the upper capacitor electrodes of two adjacent sub-pixels, and the first connection electrode is interlaced with the second connection electrode.

In some implementation manners of the present disclosure, the bank covers the second sensing electrode, the capacitor dielectric layer covers the first sensing electrode, the second connection electrode, and the upper capacitor electrode, and the first connection electrode is located at the capacitor dielectric layer.

In some implementation manners of the present disclosure, the display panel further includes: at least one third connection electrode, disposed at each of the sub-pixels of the first substrate and connected to the counter electrodes of two adjacent sub-pixels, wherein the pixel electrode is separated from the third connection electrode, and the third connection electrode is interlaced with the second sensing electrode.

In some implementation manners of the present disclosure, the second sensing electrode is located at the bank, the bank covers a portion of the third connection electrode, the capacitor dielectric layer covers the first sensing electrode, the second connection electrode, and the upper capacitor electrode, and the first connection electrode is located at the capacitor dielectric layer.

In some implementation manners of the present disclosure, at least one interlacing region is provided at an interlacing position of the first sensing electrode region and the second sensing electrode region; the first and the second sensing electrodes are interlaced at the interlacing region; the first sensing electrode is located at the capacitor dielectric layer; and the bank covers a portion of the second sensing electrode.

In some implementation manners of the present disclosure, at least one interlacing region is provided at an interlacing position of the first sensing electrode region and the second sensing electrode region; the first sensing electrodes and the second sensing electrodes are interlaced at the interlacing region; and the display panel further includes at least one first connection electrode and at least one second connection electrode. The first connection electrode is disposed at each of the sub-pixels of the first substrate, so as to be connected to the first sensing electrode of each of the sub-pixels, wherein the second capacitor electrode of each of the sub-pixels is separated from the first connection electrode. The second connection electrode is disposed at each of the sub-pixels of the first substrate and is connected to the counter electrodes of two adjacent sub-pixels, wherein the first connection electrode is interlaced with the second connection electrode.

Another aspect of the present disclosure provides a display panel, including: a substrate, a conductive bump, a capacitor dielectric layer, a first sensing electrode, a counter substrate, an electroluminescent layer, and a counter electrode. The conductive bump protrudes from an inner surface of the substrate, wherein the conductive bump includes an upper capacitor electrode and a bump covered by the upper capacitor electrode, and the bump is disposed between the inner surface of the substrate and the upper capacitor electrode. The capacitor dielectric layer covers the conductive bump and a portion of the inner surface of the substrate. The first sensing electrode is disposed on the inner surface of the substrate. The counter substrate is disposed opposite to the substrate, wherein the counter substrate has at least one pixel electrode and one first capacitor electrode separated from the pixel electrode. The pixel electrode is connected to an end point of a driving element, a gate electrode of the driving element is connected to an end point of a switching element through a connecting wire, and the first capacitor electrode is connected to the connecting wire. The electroluminescent layer is disposed between the substrate and the counter substrate, and is located at the pixel electrode. The counter electrode is disposed on the electroluminescent layer.

In some implementation manners of the present disclosure, the first sensing electrode surrounds the upper capacitor electrode.

In some implementation manners of the present disclosure, the display panel further includes a first connection electrode and a second capacitor electrode. The first connection electrode is disposed on the inner surface of the substrate and is electrically connected to the upper capacitor electrode or the first sensing electrode. The second capacitor electrode is disposed on the inner surface of the substrate, and is located at a side of the capacitor dielectric layer that faces an inner surface of the counter substrate.

In some implementation manners of the present disclosure, the display panel further includes a second sensing electrode, disposed on the inner surface of the substrate or an inner surface of the counter substrate, wherein the second sensing electrode is interlaced with the first sensing electrode.

In some implementation manners of the present disclosure, the upper capacitor electrode surrounds the first sensing electrode.

Still another aspect of the present disclosure provides a display panel, including: a substrate, a conductive bump, a capacitor dielectric layer, a counter substrate, a patterned electrode layer, an electroluminescent layer, a counter electrode, and a first sensing electrode. The conductive bump protrudes from an inner surface of the substrate, wherein the conductive bump includes an upper capacitor electrode and a bump covered by the upper capacitor electrode, and the bump is disposed between the inner surface of the substrate and the upper capacitor electrode. The capacitor dielectric layer covers the conductive bump and a portion of the inner surface of the substrate. The counter substrate is disposed opposite to the substrate. The patterned electrode layer is disposed on an inner surface of the counter substrate, wherein the patterned electrode layer includes a first capacitor electrode and a pixel electrode separated from the first capacitor electrode; the pixel electrode is connected to an end point of a driving element; a gate electrode of the driving element is connected to an end point of a switching element through a connecting wire; and the first capacitor electrode is connected to the connecting wire. The electroluminescent layer is located at the pixel electrode. The counter electrode is disposed on the electroluminescent layer. The first sensing electrode is disposed on the inner surface of the counter substrate.

In some implementation manners of the present disclosure, the patterned electrode layer further includes a first connection electrode, disposed on the counter substrate and electrically connected to the counter electrode.

In some implementation manners of the present disclosure, the display panel further includes a second sensing electrode, and the second sensing electrode is disposed on the counter substrate and interlaced with the first sensing electrode.

In some implementation manners of the present disclosure, the patterned electrode layer further includes a second connection electrode, and the second connection electrode is electrically connected to the second sensing electrode.

In some implementation manners of the present disclosure, the display panel further includes a bank, disposed on the patterned electrode layer, and having a first opening and a second opening, wherein the first opening does not shelter at least a portion of the first capacitor electrode; the second opening does not shelter at least a portion of the pixel electrode; and the electroluminescent layer and the counter electrode are located in the second opening.

BRIEF DESCRIPTION OF THE DRAWINGS

FIG. 10A is a partial top view of a display panel according to some implementation manners of the present disclosure;

FIG. 10B is a partial top view of the display panel according to some implementation manners of the present disclosure;

DETAILED DESCRIPTION

Figures 1A, 1B:
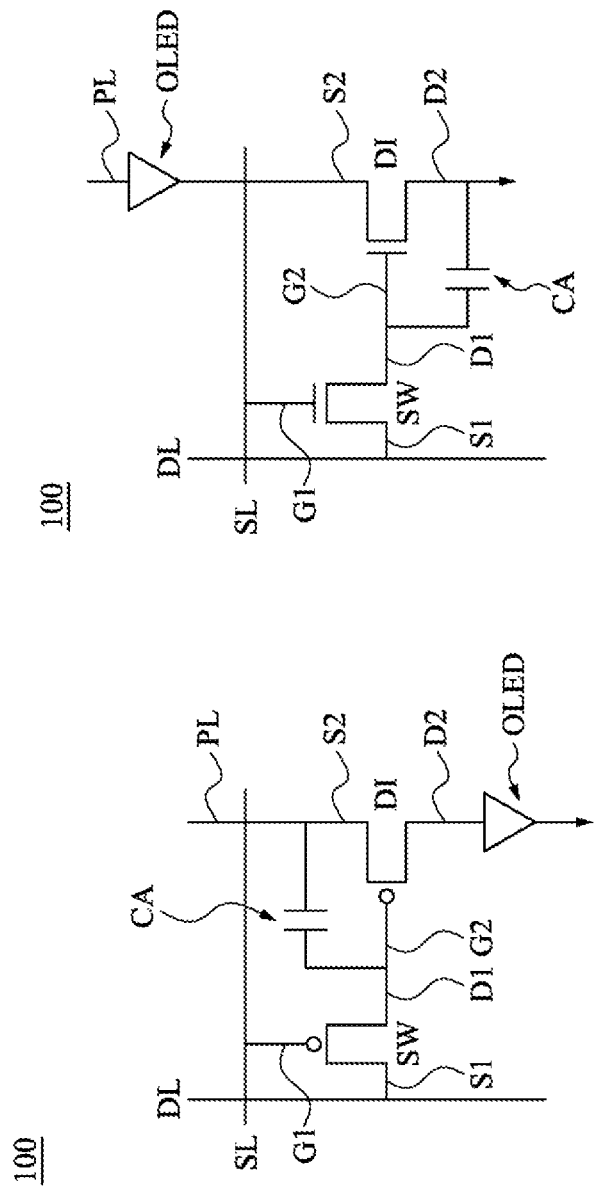
FIG. 1A is an equivalent circuit diagram of a sub-pixel of a display panel according to some implementation manners of the present disclosure.
FIG. 1B is an equivalent circuit diagram of a sub-pixel of a display panel according to some implementation manners of the present disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element, it can be directly on or connected to the other element or intervening elements may also be present. In contrast, when an element is referred to as being "directly on" or "directly connected to" another element, there are no intervening elements present. As used herein, "connected" may refer to a physical and/or electrical connection.

"About" or "substantially/approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, ±5%, ±3% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

A plurality of implementation manners of the present disclosure are disclosed with reference to drawings. To make the description clear, many practical details are described in the description below. However, it should be understood that the practical details shall not be used to limit the present disclosure. That is, in some implementation manners of the present disclosure, the practical details are not necessary. Besides, in order to simplify the drawings, some conventional and common structures and elements are shown in the drawings in a simple and schematic manner.

A display panel according to some implementation manners of the present disclosure is defined to include a plurality of sub-pixels 100. FIG. 1A is an equivalent circuit diagram of a sub-pixel 100 of a display panel according to some implementation manners of the present disclosure. As shown in FIG. 1A, the sub-pixel 100 of some implementation manners of the present disclosure includes at least a data line DL, a scan line SL, a power line PL, a switching element SW, a driving element DI, a capacitor element CA, and an electroluminescent element OLED. It should be noted that according to design requirements, the sub-pixel 100 of the present disclosure may include another thin film transistor (TFT), and there may be a plurality of capacitor elements CA.

In a plurality of implementation manners of the present disclosure, the switching element SW includes two end points S1, D1 and a first gate electrode G1, wherein one of the end points S1, D1 is electrically connected to the data line DL, and the first gate electrode G1 is electrically connected to the scan line SL. The driving element DI includes two end points S2, D2 and a second gate electrode G2, wherein one of the end points S2, D2 is electrically connected to the power line PL, the other of the end points S2, D2 is electrically connected to the electroluminescent element OLED, the second gate electrode G2 is electrically connected to the other of the end points S1, D1 of the switching element SW. One end of the capacitor element CA is electrically connected to the second gate electrode G2, the other end of the capacitor element CA is electrically connected to the power line PL.

In some implementation manners of the present disclosure, the capacitor element CA is a storage capacitor (e.g. a solid-state storage capacitor), and when an electrical signal is transmitted to the second gate electrode G2 through the switching element SW, the capacitor element CA can maintain voltage stability of the second gate electrode G2.

Here, the switching element SW and the driving element DI may be TFTs, including bottom-gate type TFT, top-gate type TFT, or another appropriate type TFT. P-type TFTs are used as examples of the switching element SW and the driving element DI in FIG. 1A of the present disclosure. However, in practical configuration, the switching element SW and the driving element DI may be N-type TFTs, as the switching element SW and the driving element DI shown in FIG. 1B, so as to design a pixel circuit, or one of the switching element SW and the driving element DI is a P-type TFT, and the other is an N-type TFT. A semiconductor layer of each TFT may be a single-layer structure or a multi-layer structure, and a material of the semiconductor layer includes amorphous silicon, polycrystalline silicon, microcrystalline silicon, monocrystalline silicon, a metal oxide semiconductor material, a metal nitride semiconductor material, metal nitride oxide semiconductor material, an organic semiconductor material, or another appropriate material.

Figure 2A:
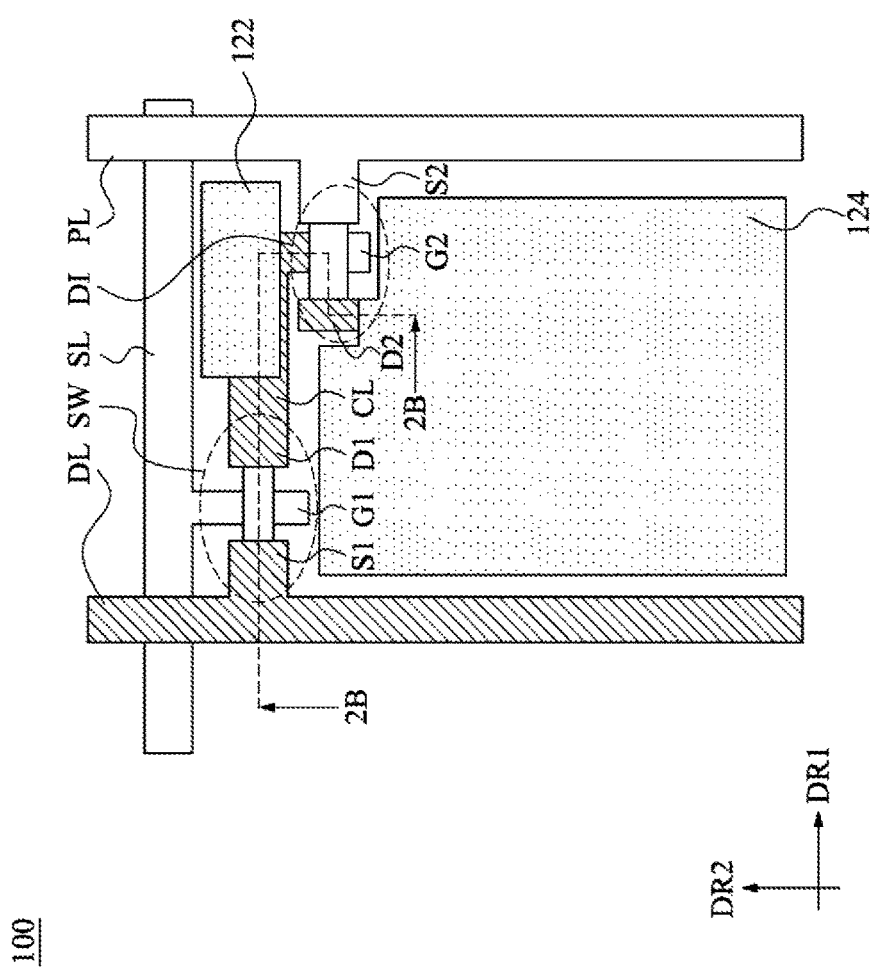
FIG. 2A is a top view of a sub-pixel of a display panel according to a first implementation manner of the present disclosure.
Figure 2B:
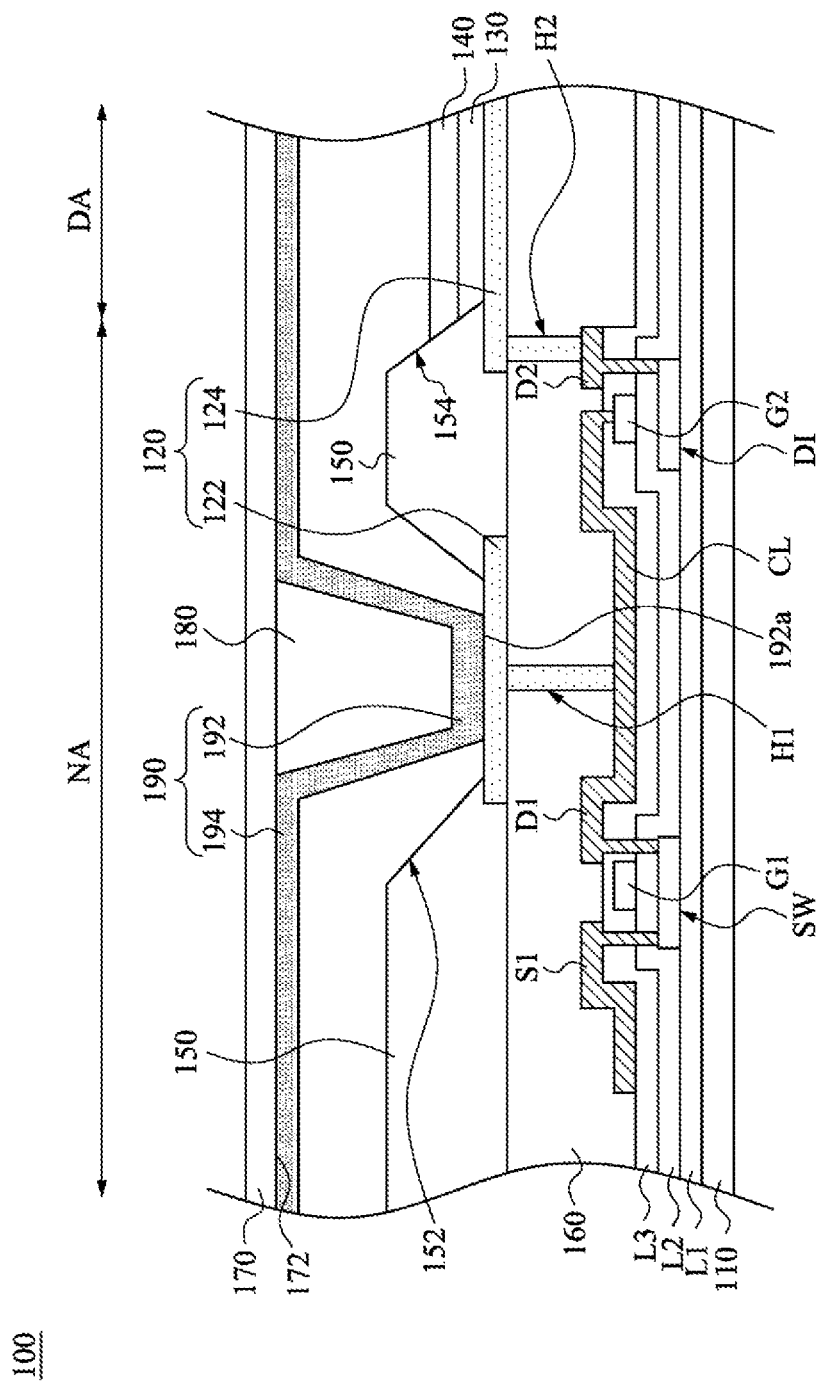
FIG. 2B is a sectional view taken along a line 2B-2B according to FIG. 2A.

FIG. 2A is a top view of a sub-pixel 100 of a display panel according to a first implementation manner of the present disclosure. FIG. 2B is a sectional view taken along a line 2B-2B according to FIG. 2A. The display panel has a first substrate 110 and a second substrate 170 disposed on the first substrate 110. Reference is made to FIG. 1A, FIG. 2A, and FIG. 2B at the same time. In some implementation manners of the present disclosure, each sub-pixel 100 includes at least a data line DL, a scan line SL, a power line PL, a switching element SW, a driving element DI, a protective layer 160, a patterned electrode layer 120, an electroluminescent layer 130, a counter electrode 140, a conductive bump 180, and a capacitor dielectric layer 190.

The switching element SW, the driving element DI, the data line DL, the scan line SL, and the power line PL are disposed on the first substrate 110. The scan line SL extends along a first direction DR1, the data line DL extends along a second direction DR2, wherein the second direction DR2 is not parallel to the first direction DR1, that is, the first direction DR1 is interlaced (or namely crossed) with the second direction DR2. In a plurality of implementation manners of the present disclosure, the first direction DR1 and the second direction DR2 being substantially perpendicular to each other is used as an example, but the present disclosure is not limited thereto. The power line PL is electrically connected to a first voltage source (not shown). In this implementation manner, a second gate electrode G2 of the driving element DI is electrically connected to the other of the end points S1, D1, of the switching element SW through the connecting wire CL. Configuration of the switching element SW and the driving element DI is approximately as described in the earlier FIG. 1A or FIG. 1B, and details are not described in detail herein again. Top-gate type TFTs are used as examples of the switching element SW and the driving element DI shown in FIG. 2B, and other types are as described earlier. To be simple, for example, a top-gate TFT includes a semiconductor layer (not shown), a first gate electrode G1/a second gate electrode G2, disposed on the semi-conductor layer (not shown), a gate insulation layer L2, disposed between the semiconductor layer (not shown) and the first gate electrode G1/the second gate electrode G2, an inter-layer dielectric layer L3, covering the first gate electrode G1/the second gate electrode G2 and the gate insulation layer L2, and two ends S1/D1 of the TFT, respectively connected to the semiconductor layer (not shown). For a bottom-gate type TFT, the bottom-gate type TFT includes a first gate electrode G1/a second gate electrode G2, a semiconductor layer (not shown), disposed on the first gate electrode G1/the second gate electrode G2, a gate insulation layer L2, disposed between the semiconductor layer (not shown) and the first gate electrode G1/the second gate electrode G2, an inter-layer dielectric layer L3, covering the semiconductor layer (not shown) and the gate insulation layer L2, and two ends S1/D1 of the TFT, respectively connected to the semiconductor layer (not shown). A buffer layer L1 may be optionally disposed on an inner surface of the first substrate 110.

The protective layer 160 covers the scan line SL, the data line DL, the power line PL, the switching element SW, the driving element DI, the connecting wire CL, and the first substrate 110, and the protective layer 160 includes a first through hole H1 and a second through hole H2. The protective layer 160 may be a single-layer structure or a multi-layer structure, and a material thereof may be an inorganic material (e.g. silicon oxide, silicon nitride, silicon oxynitride, or another appropriate material), an organic material (e.g. a photoresist material, polyimide (PI), benzocyclobutene (BCB), or another appropriate material), or another appropriate material.

The patterned electrode layer 120 is disposed on the protective layer 160, wherein the patterned electrode layer 120 includes a first capacitor electrode 122 and a pixel electrode 124 separated from the first capacitor electrode 122; the pixel electrode 124 is electrically connected to the other of the end points S2, D2 of the driving element DI through the second through hole H2; and the first capacitor electrode 122 is electrically connected to the connecting wire CL through the first through hole H1. The first capacitor electrode 122 and the connecting wire CL at least partially overlap, so as to be electrically connected by means of the first through hole H1. The first capacitor electrode 122 does not overlap the semiconductor layers (not shown, as shown in FIG. 2A or FIG. 2B) of the driving element DI and the switching element SW, so as to reduce a coupling effect of the first capacitor electrode 122 on the driving element DI and the switching element SW. The connecting wire CL is located between the driving element DI and the switching element SW, and is made of a conductive material such as a metal, an alloy, a material in ohmic contact with a semiconductor layer (e.g. a heavily-doped semiconductor layer), a resistor whose resistance is less than resistance of the semiconductor layer (e.g. an intrinsic layer or a lightly-doped semiconductor layer), another appropriate material, or a combination thereof.

The patterned electrode layer 120 may be a single-layer structure or a multi-layer structure, and a material thereof includes a transparent conductive material (e.g. indium tin oxide, indium zinc oxide, zinc oxide, carbon nanotube, indium gallium zinc oxide, or another appropriate material), a non-transparent material (e.g. a metal, an alloy, or another appropriate material), or another appropriate material. For example, if the display panel is a bottom-emitting type (that is, light is only emitted from an outer surface of the first substrate 110) or a dual-sides emitting type (that is, light is separately emitted from outer surfaces of the first substrate 110 and the second substrate 170), the patterned electrode layer 120 is made of a transparent conductive material. If the display panel is a top-emitting type (that is, light is only emitted from an outer surface of the second substrate 170), the patterned electrode layer 120 is made of a non-transparent conductive material.

The electroluminescent layer 130 is located at the pixel electrode 124. The counter electrode 140 is disposed on the electroluminescent layer 130 and is electrically connected to a second voltage source (not shown), wherein the second voltage source is different from the first voltage source. The electroluminescent layer 130 may be formed by an organic light emitting material, an inorganic light emitting material, or a combination thereof. In this way, the pixel electrode 124, the electroluminescent layer 130, and the counter electrode 140 together form the foregoing electroluminescent element OLED (e.g. referring to FIG. 1A or FIG. 1B). The counter electrode 140 may be a single-layer structure or a multi-layer structure, and a material thereof includes a transparent conductive material (e.g. indium tin oxide, indium zinc oxide, zinc oxide, carbon nanotube, indium gallium zinc oxide, or another appropriate material), a non-transparent material (e.g. a metal, an alloy, or another appropriate material), or another appropriate material. For example, if the display panel is a bottom-emitting type (that is, light is only emitted from an outer surface of the first substrate 110), the counter electrode 140 is made of a non-transparent conductive material. If the display panel is a top-emitting type (that is, light is only emitted from an outer surface of the second substrate 170) or a dual-sides emitting type (that is, light is separately emitted from outer surfaces of the first substrate 110 and the second substrate 170), the patterned electrode layer 120 is made of a transparent conductive material.

The conductive bump 180 protrudes from an inner surface 172 of the second substrate 170. The conductive bump 180 may include a single-layer structure or a multi-layer structure, and a material thereof includes a conductive polymer (e.g. a polymer with a formula containing a metal, an intrinsically conductive polymer, a polymer with a nano particle, or a micro particle (that is, a conductive adhesive), or another appropriate material), a non-transparent conductive material (e.g. a metal, an alloy, or an appropriate material), a transparent conductive material (e.g. indium tin oxide, indium zinc oxide, zinc oxide, carbon nanotube, indium gallium zinc oxide, or another appropriate material), or another appropriate material. Generally, in order to improve a conductive capability of the conductive bump 180, preferably, the material thereof selects a non-transparent material (e.g. a metal, an alloy, or another appropriate material). The conductive bump 180 is disposed corresponding to the first capacitor electrode 122 in a vertical projection direction, that is, the conductive bump 180 is on the first capacitor electrode 122 in the vertical projection direction, and overlaps the first capacitor electrode 122.

The capacitor dielectric layer 190 covers the conductive bump 180 and the inner surface 172 of the second substrate 170. Here, the capacitor dielectric layer 190 includes a first portion 192 disposed at a top portion of the conductive bump 180 and a second portion 194 (a side wall of the conductive bump 180 and a portion of the inner surface of the second substrate 170) not disposed at the top portion of the conductive bump 180. The first portion 192 disposed at the top portion of the conductive bump 180 corresponds to the first capacitor electrode 122, that is, the first portion 192 of the conductive bump 180 is on the first capacitor electrode 122 in the vertical projection direction, and overlaps the first capacitor electrode 122. The capacitor dielectric layer 190 may be a single-layer structure or a multi-layer structure, and a material thereof includes a non-self-luminous material (that is, a non-electroluminescent material), for example, an inorganic material (e.g. silicon nitride, silicon oxide, silicon oxynitride, hafnium oxide, or another appropriate material), an organic material (e.g. a photoresist material, PI, BCB, or another appropriate material), a light conversion material (e.g. a color photoresist material, a quantum dot/bar, or another appropriate material), or another appropriate material. In this implementation manner, the first portion 192 of the capacitor dielectric layer 190 is in contact with the first capacitor electrode 122. The conductive bump 180, the capacitor dielectric layer 190, and the first capacitor electrode 122 form a storage capacitor, that is, the foregoing capacitor element CA (e.g. referring to FIG. 1A or FIG. 1B).

In a plurality of implementation manners of the present disclosure, the display panel may further optionally include a bank 150, disposed on the protective layer 160, and having a first opening 152 and a second opening 154. The first opening 152 does not shelter at least a portion of the first capacitor electrode 122, that is, the first opening 152 reveals (or called enables appearance of or exposes) at least a portion of the first capacitor electrode 122. The second opening 154 does not shelter at least a portion of the pixel electrode 124, that is, the second opening 154 reveals (or enables appearance of or exposes) at least a portion of the pixel electrode 124. In other words, the first opening 152 is vertically projected on the first capacitor electrode 122, and the first opening 152 at least partially overlaps the first capacitor electrode 122, which can be regarded as that the first opening 152 is located at at least a portion of the first capacitor electrode 122; the second opening 154 is vertically projected on the pixel electrode 124, and the second opening 154 at least partially overlaps the pixel electrode 124, which can be regarded as that the second opening 154 is located at at least a portion of the pixel electrode 124. The electroluminescent layer 130 and the counter electrode 140 are located in the second opening 154, such that the bank 150 may make it easy for the electroluminescent layer 130 to be located in the second opening 154, and the conductive bump 180 is inserted (or called extends or enters) into the first opening 152, so as to form a structure of the foregoing storage capacitor of this embodiment (the capacitor element CA). The bank 150 may be a single-layer structure or a multi-layer structure, and a material thereof may be an inorganic material (e.g. silicon oxide, silicon nitride, silicon oxynitride, or another appropriate material), an organic material (e.g. a photoresist material, PI, BCB, or another appropriate material), or another appropriate material. In the embodiments of the present disclosure, an organic material is used as an example, but the present disclosure is not limited thereto. In a plurality of implementation manners of the present disclosure, each sub-pixel 100 has a light emitting region DA corresponding to the electroluminescent layer 130 and a non-light emitting region NA at least disposed at a side of the light emitting region DA. In some implementation manners, the data line DL, the scan line SL, the power line PL, the switching element SW, and the driving element DI are disposed in the non-light emitting region NA, so as to avoid an impact thereof on a display effect.

In a plurality of implementation manners of the present disclosure, by means of the conductive bump 180, the capacitor dielectric layer 190, and the first capacitor electrode 122, a gap between the second substrate 170 and the first substrate 110 can be maintained, and the capacitor element CA is formed, so as to maintain a stable display effect of the sub-pixel. Further, the capacitor element CA of the present disclosure separately involves relevant design of the first capacitor electrode 122 on the first substrate 110 and relevant design of the conductive bump 180 on the second substrate 170, and may solve the problem of a relatively small aperture ratio caused by a relatively large capacitor element area designed on a first substrate 110 of a bottom-emitting or dual-sides emitting display panel, that is, may improve resolution and/or brightness, for example, may improve the resolution and/or brightness by at least 50%. Further, layout of the capacitor element CA of the present disclosure may be relatively loose. In another embodiment, the capacitor element CA is also applicable to a top-emitting display panel. Moreover, the capacitor dielectric layer 190 is designed to completely cover the second substrate 170, so as to avoid an additional step of a manufacturing process derived from the patterned capacitor dielectric layer 190, thereby reducing the manufacturing costs and time.

Figure 3:
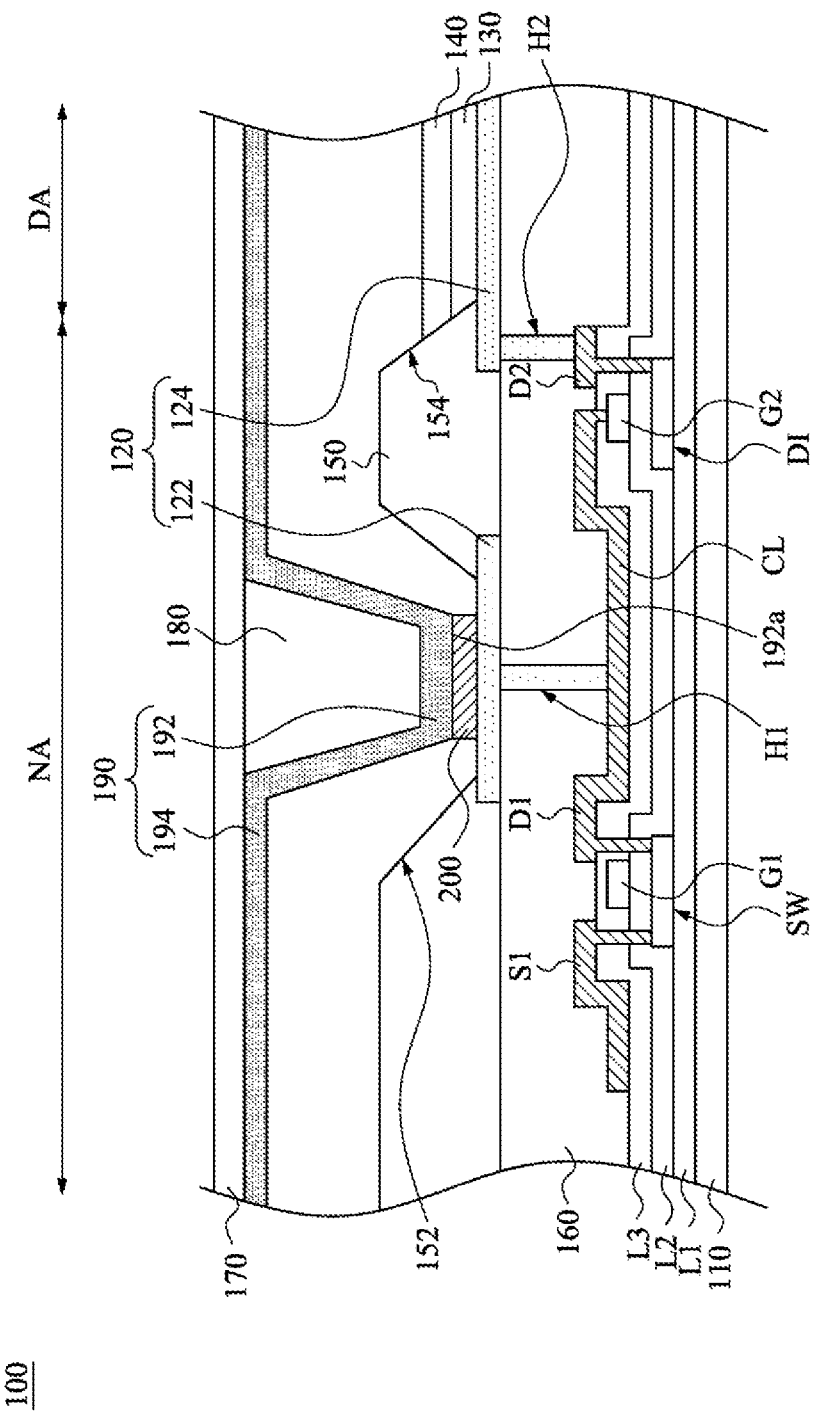
FIG. 3 is a sectional view of a sub-pixel of a display panel according to a second implementation manner of the present disclosure.

FIG. 3 is a sectional view of a sub-pixel 100 of a display panel according to a second implementation manner of the present disclosure. This implementation manner is similar to the implementation manner of FIG. 2B, and differs from the implementation manner of FIG. 2B in that: in this implementation manner, the display panel further includes a second capacitor electrode 200, at least disposed on the first portion (that is, the top portion) 192 of the capacitor dielectric layer 190; two opposite surfaces of the second capacitor electrode 200 are in contact with and connected to the first portion 192 of the capacitor dielectric layer 190 and the first capacitor electrode 122, respectively; and the conductive bump 180, the capacitor dielectric layer 190, the second capacitor electrode 200, and the first capacitor electrode 122 form the storage capacitor (e.g. solid-state storage capacitor). That is, the second capacitor electrode 200 and the first capacitor electrode 122 function as one electrode (e.g. a lower electrode) of the storage capacitor, and the conductive bump 180 functions as the other electrode (e.g. an upper electrode) of the storage capacitor.

In some cases, due to a factor that a protruding structure is unbeneficial to planarization, a surface 192a of the capacitor dielectric layer 190 may be coarse (or namely rough) to a particular extent, and consequently, an electrode layer may be not in complete contact with the capacitor dielectric layer 190, thereby affecting a capacitance value.

In this implementation manner, by means of directly disposing the second capacitor electrode 200 on the capacitor dielectric layer 190, the second capacitor electrode 200 is in complete contact with the capacitor dielectric layer 190. Specifically, the second capacitor electrode 200 is formed by depositing and coating a conductive material on the capacitor dielectric layer 190. The second capacitor electrode 200 may be a single-layer structure or a multi-layer structure, and a material thereof includes a conductive polymer (e.g. a polymer with a formula containing a metal element, an intrinsically conductive polymer, a polymer with a nano particle (that is, a conductive adhesive), or another appropriate material), a non-transparent conductive material (e.g. a metal, an alloy, or an appropriate material), a transparent conductive material (e.g. indium tin oxide, indium zinc oxide, zinc oxide, carbon nanotube, indium gallium zinc oxide, or another appropriate material), or another appropriate material. In order to increase adhesiveness of the second capacitor electrode 200, the material (e.g. a conductive polymer) of the second capacitor electrode 200 may have appropriate adhesiveness, so as to adhere to the surface 192a of the capacitor dielectric layer 190 and to fill into uneven recessed portions of the surface 192a.

In this implementation manner, if respective electrode surfaces of the second capacitor electrode 200 and the first capacitor electrode 122 have a plurality of contact points, a voltage may be easily transferred from the first capacitor electrode 122 to the second capacitor electrode 200. Therefore, by means of the second capacitor electrode 200, a good electrical connection between one end of the capacitor dielectric layer 190 and the first capacitor electrode 122 may be achieved. In this way, the second capacitor electrode 200 (and the first capacitor electrode 122), the capacitor dielectric layer 190, and the conductive bump 180 together form the foregoing capacitor element CA (e.g. referring to FIG. 1A or FIG. 1B), so as to avoid an impact of the coarseness of the surface 192a of the capacitor dielectric layer 190 of the capacitance value. Other details of this implementation manner are approximately as described in the foregoing implementation manners, and details are not described herein again.

Figure 4:
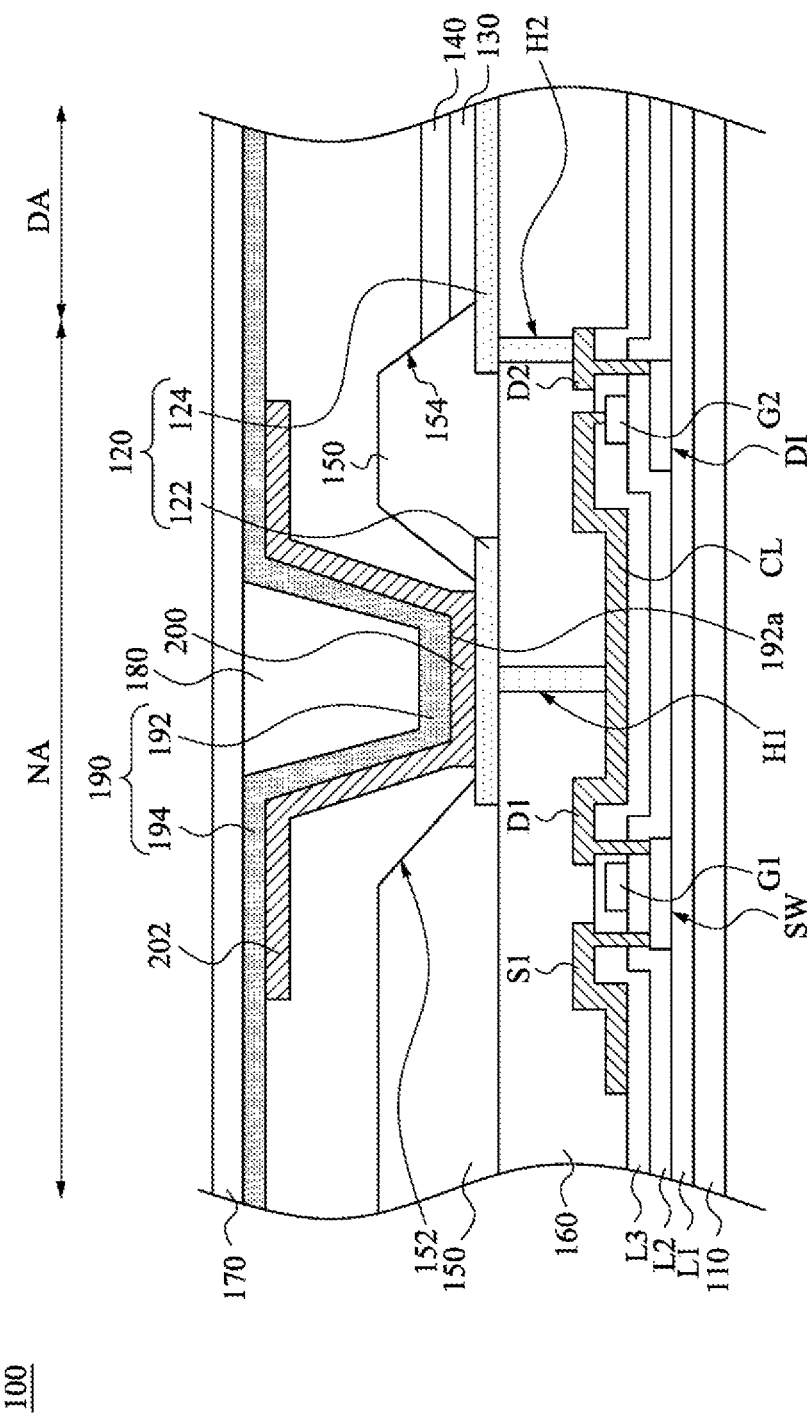
FIG. 4 is a sectional view of a sub-pixel of a display panel according to a third implementation manner of the present disclosure.

FIG. 4 is a sectional view of a sub-pixel 100 of a display panel according to a third implementation manner of the present disclosure. This implementation manner is similar to the implementation manner of FIG. 3, and differs from the implementation manner of FIG. 3 in that: in this implementation manner, the second capacitor electrode 200 further extends to cover the capacitor dielectric layer 190 at a lateral side of the conductive bump 180 or to cover the capacitor dielectric layer 190 at the lateral side of the conductive bump 180 and on the inner surface of the second substrate 170. In other words, the second capacitor electrode 200 has an extension section 202, and the extension section 202 covers the second portion 194 of the capacitor dielectric layer 190.

In this implementation manner, by means of the extension section 202, a contact area of the second capacitor electrode 200 and the capacitor dielectric layer 190 is increased, so as to strengthen adhesiveness therebetween. Besides, according to a formula of a capacitance value of a flat-plate capacitor, $C=(\varepsilon*A)/d$, wherein C is capacitance, c is a dielectric constant of the capacitor dielectric layer 190, A is an overlapping area of the second capacitor electrode 200 and the conductive bump 180, d is a thickness of the capacitor dielectric layer 190, the arrangement of the extension section 202 enables the area of the capacitor dielectric layer 190 between the second capacitor electrode 200 and the conductive bump 180 to be increased, so as to increase the capacitance value, for example, increase the capacitance value by at least 50%. The second capacitor electrode 200 is located at the top portion and the side wall of the conductive bump 180, and therefore, the second capacitor electrode 200, the capacitor dielectric layer 190, and the first capacitor electrode 122 form a three-dimensional capacitor element (e.g. three dimensional solid-state capacitor element). Other details of this implementation manner are approximately as described in the foregoing implementation manners, and details are not described herein again.

Figure 5:
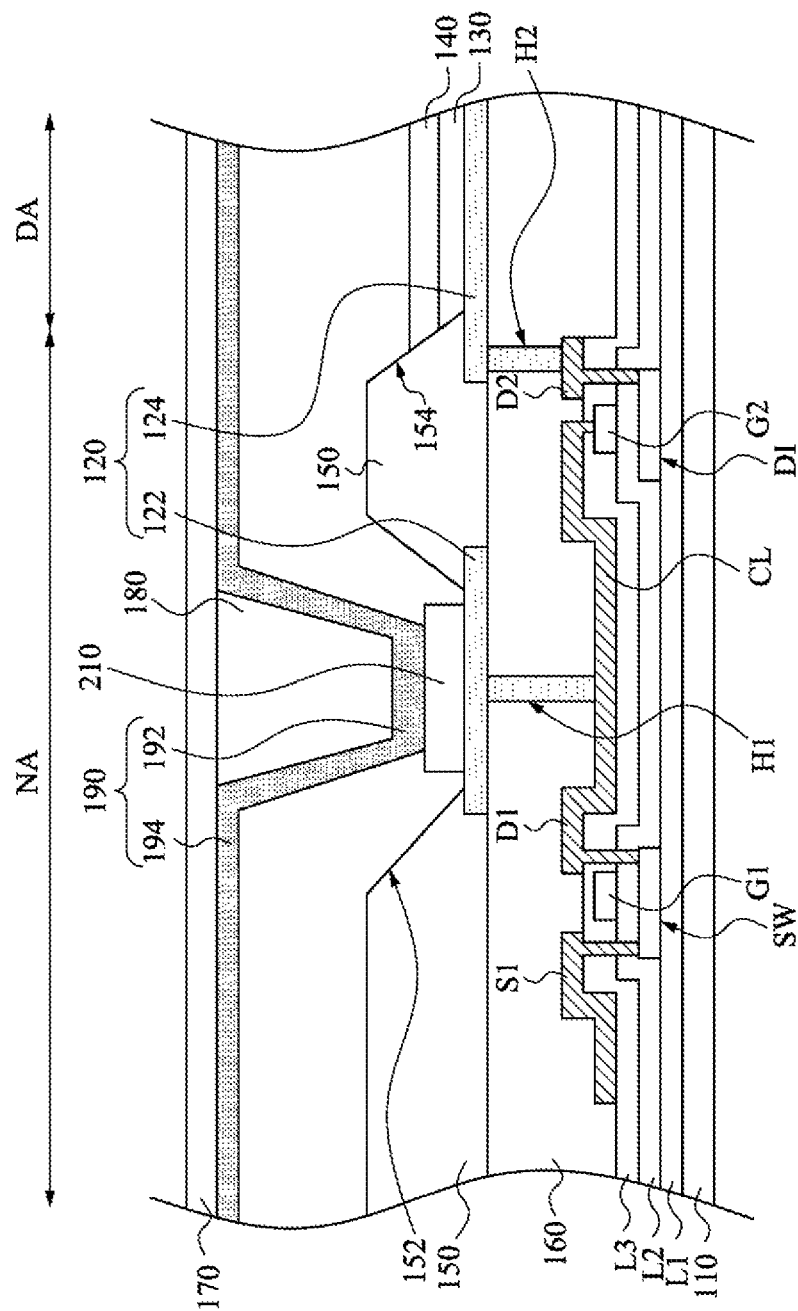
FIG. 5 is a sectional view of a sub-pixel of a display panel according to a fourth implementation manner of the present disclosure.

FIG. 5 is a sectional view of a sub-pixel 100 of a display panel according to a fourth implementation manner of the present disclosure. This implementation manner is similar to the implementation manner of FIG. 2B, and differs from the implementation manner of FIG. 2B in that: in this implementation manner, the display panel further includes a conductive buffer layer 210, disposed on the first capacitor electrode 122, wherein the conductive buffer layer 210 is in contact with the first capacitor electrode 122, and the conductive bump 180, the capacitor dielectric layer 190, the conductive buffer layer 210, and the first capacitor electrode 122 form the storage capacitor (e.g. solid state storage capacitor). That is, the conductive buffer layer 210 and the first capacitor electrode 122 function as one electrode (e.g. a lower electrode) of the storage capacitor, and the conductive bump 180 functions as the other electrode (e.g. an upper electrode) of the storage capacitor.

Here, the conductive buffer layer 210 may be a single-layer structure or a multi-layer structure, and a material thereof includes a conductive polymer (e.g. a polymer with a formula containing a metal, an intrinsically conductive polymer, a polymer with a nano particle (that is, a conductive adhesive), or another appropriate material), a non-transparent conductive material (e.g. a metal, an alloy, or an appropriate material), a transparent conductive material (e.g. indium tin oxide, indium zinc oxide, zinc oxide, carbon nanotube, indium gallium zinc oxide, or another appropriate material), or another appropriate material. Preferably, the conductive buffer layer 210 and the counter electrode 140 may be at a same film layer, but the present disclosure is not limited thereto. The conductive buffer layer 210 may be of an appropriate height (e.g. thickness), so as to elevate surfaces of elements on the first substrate 100 that are in contact with elements on the second substrate 170. By means of this design, a height (e.g. thickness) of the conductive bump 180 may be decreased. Moreover, an inclination degree of a side surface of the bank 150 is less than an inclination degree of a side surface of the conductive bump 180, and therefore, with the elevating of a connection position, an allowable error when positions of the elements on the first substrate 100 are aligned with positions of the elements on the second substrate 170 may be increased. Other details of this implementation manner are approximately as described in the foregoing implementation manners, and details are not described herein again.

Figure 6:
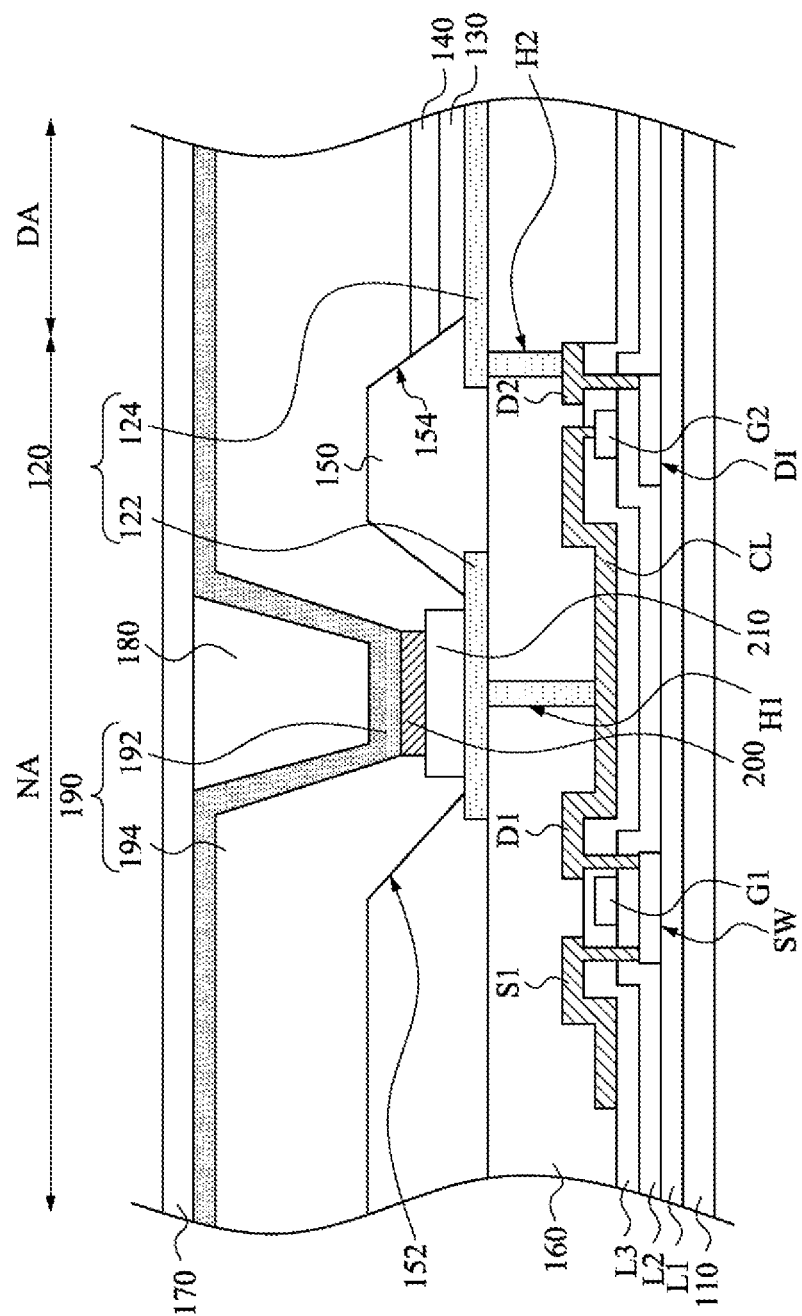
FIG. 6 is a sectional view of a sub-pixel of a display panel according to a fifth implementation manner of the present disclosure.

FIG. 6 is a sectional view of a sub-pixel 100 of a display panel according to a fifth implementation manner of the present disclosure. This implementation manner is similar to the implementation manner of FIG. 5, and differs from the implementation manner of FIG. 5 in that: in this implementation manner, the display panel further includes a second capacitor electrode 200, disposed on the first portion 192 of the capacitor dielectric layer 190; two opposite surfaces of the second capacitor electrode 200 are in contact with the capacitor dielectric layer 190 and the conductive buffer layer 210, respectively; and the conductive bump 180, the capacitor dielectric layer 190, the second capacitor electrode 200, the conductive buffer layer 210, and the first capacitor electrode 122 form the storage capacitor (e.g. solid-state storage capacitor). That is, the conductive buffer layer 210, the second capacitor electrode 200, and the first capacitor electrode 122 function as one electrode (e.g. a lower electrode) of the storage capacitor, and the conductive bump 180 functions as the other electrode (e.g. an upper electrode) of the storage capacitor.

As described earlier, the second capacitor electrode 200 is formed by depositing and coating a conductive material on the capacitor dielectric layer 190. The second capacitor electrode 200 may be a single-layer structure or a multi-layer structure, and a material thereof includes a conductive polymer (e.g. a polymer with a formula containing a metal element, an intrinsically conductive polymer, a polymer with a nano particle (that is, a conductive adhesive), or another appropriate material), a non-transparent conductive material (e.g. a metal, an alloy, or an appropriate material), a transparent conductive material (e.g. indium tin oxide, indium zinc oxide, zinc oxide, carbon nanotube, indium gallium zinc oxide, or another appropriate material), or another appropriate material. In order to increase adhesiveness of the second capacitor electrode 200 and the first capacitor electrode 122, the material (e.g. a conductive polymer) of the second capacitor electrode 200 may have appropriate adhesiveness and relative small particles, so as to adhere to the surface 192a of the capacitor dielectric layer 190 and to fill into uneven recessed portions of the surface 192a.

Other details of this implementation manner are approximately as described in the foregoing implementation manners and have the foregoing effects, and details are not described herein again.

Figure 7A:
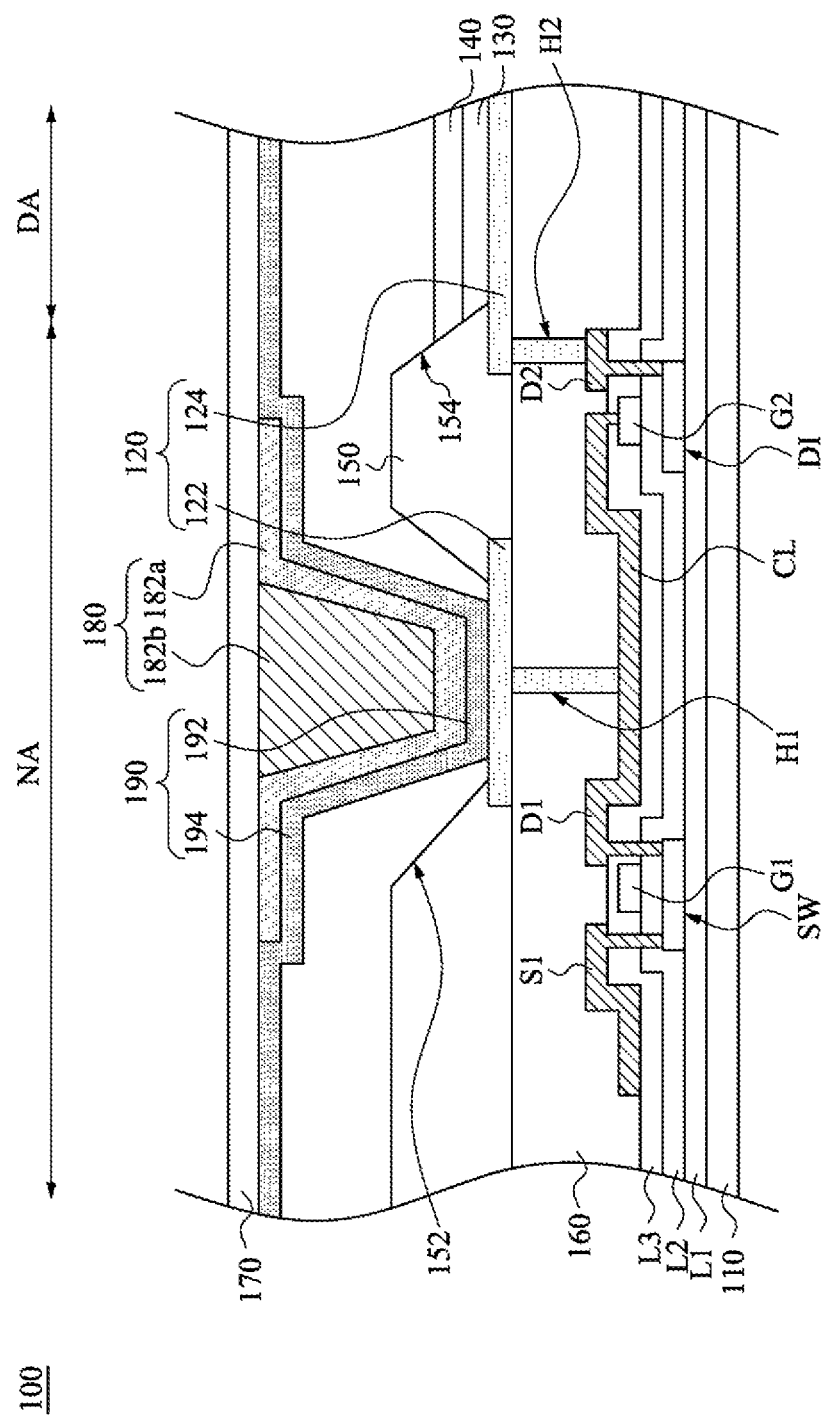
FIG. 7A is a sectional view of a sub-pixel of a display panel according to a sixth implementation manner of the present disclosure.

FIG. 7A is a sectional view of a sub-pixel 100 of a display panel according to a sixth implementation manner of the present disclosure. This implementation manner is similar to the implementation manner of FIG. 2B, and differs from the implementation manner of FIG. 2B in that: in this implementation manner, the conductive bump 180 is a composite film layer, the conductive bump 180 includes an upper capacitor electrode 182a and a bump 182b, the bump 182b is located at the non-light emitting region NA, and the upper capacitor electrode 182a at least covers the bump 182b.

Here, the bump 182b may be a single-layer structure or a multi-layer structure, and a material thereof includes an insulation material (e.g. reference may be made to the foregoing organic material, inorganic material, another appropriate material, or a combination thereof), a conductive material (e.g. reference may be made to the foregoing conductive polymer, non-transparent conductive material, transparent conductive material, or another appropriate material, or a combination thereof), or a combination thereof.

The upper capacitor electrode 182a may be a single-layer structure or a multi-layer structure, and a material thereof includes a conductive polymer (e.g. a polymer with a formula containing a metal, an intrinsically conductive polymer, a polymer with a nano particle (that is, a conductive adhesive), or another appropriate material), a non-transparent conductive material (e.g. a metal, an alloy, or an appropriate material), a transparent conductive material (e.g. indium tin oxide, indium zinc oxide, zinc oxide, carbon nanotube, indium gallium zinc oxide, or another appropriate material), or another appropriate material. Further, when the bump 182b is made of a non-transparent conductive material or a non-transparent material, the bump 182b is only located at the non-light emitting region NA, and the bump 182b corresponds to the forgoing first capacitor electrode 122, that is, the bump 182b is vertically projected on the first capacitor electrode 122, and the bump 182b at least partially overlaps the first capacitor electrode 122. The match between the material of the upper capacitor electrode 182a and the type of the display panel is as described later.

Figure 7B:
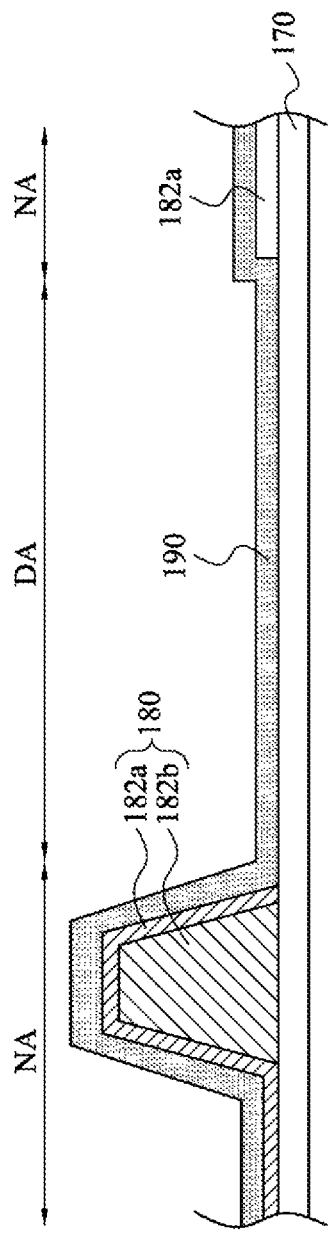
FIG. 7B and FIG. 7C are sectional views of some elements of a second substrate according to some implementation manners of the present disclosure.

Referring to FIG. 7B, FIG. 7B is a sectional view of some elements of a second substrate according to some implementation manners of the present disclosure. In some implementation manners, the display panel is a top-emitting display panel or a dual-sides emitting display panel, and the upper capacitor electrode 182a is made of a non-transparent conductive material and may be not disposed at the light emitting region DA (e.g., the upper capacitor electrode 182a is only disposed at the non-light emitting region NA), or the upper capacitor electrode 182a is made of a transparent conductive material at the light emitting region DA and is made of a non-transparent conductive material at the non-light emitting region NA. In this way, light may be emitted from the electroluminescent layer 130 (referring to FIG. 7A), may pass the capacitor dielectric layer 190 and the outer surface of the second substrate 170, and may be only output from the outer surface of the second substrate 170 (top-emitting type), or light may be emitted from the electroluminescent layer 130 (referring to FIG. 7A), may separately pass the capacitor dielectric layer 190, the outer surface of the second substrate 170, and the outer surface of the first substrate 110, and may be subsequently output (dual-sides emitting type). The upper capacitor electrode 182a does not affect light in the light emitting region DA.

Figure 7C:
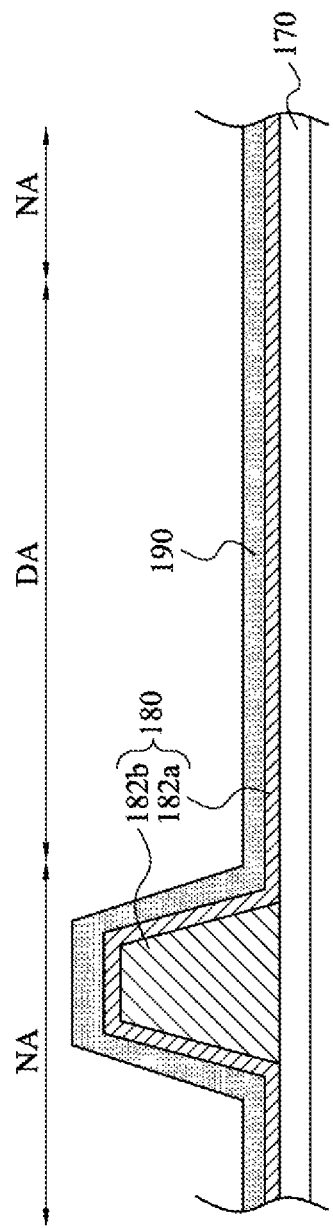

Referring to FIG. 7C, FIG. 7C is a sectional view of some elements of a second substrate according to some implementation manners of the present disclosure. In some implementation manners, when the display panel is a bottom-emitting display panel, the upper capacitor electrode 182a is made of a non-transparent conductive material and may completely cover the second substrate 170 and the bump 182b, such that the upper capacitor electrode 182a is disposed at the light emitting region DA and the non-light emitting region NA. In this way, light may be emitted from the electroluminescent layer 130 (referring to FIG. 7A), may pass the pixel electrode 124 (referring to FIG. 7A), the protective layer 160 (referring to FIG. 7A), the buffer layer L1 (referring to FIG. 7A), the inter-layer dielectric layer L2 (referring to FIG. 7A), the inter-layer dielectric layer L3 (referring to FIG. 7A), and the outer surface of the first substrate 110 (referring to FIG. 7A), and may be only output from the outer surface of the first substrate 110 (referring to FIG. 7A). In some implementation manners, when the display panel is a top-emitting display panel or a dual-sides emitting display panel, the upper capacitor electrode 182a is made of a transparent conductive material and may completely cover the second substrate 170 and the bump 182b, such that the upper capacitor electrode 182a is disposed at the light emitting region DA and the non-light emitting region NA. In this way, light may be emitted from the electroluminescent layer 130 (referring to FIG. 7A), and may be separately output from the outer surface of the first substrate 110 (referring to FIG. 7A) and the outer surface of the second substrate 170 (referring to FIG. 7A) (dual-sides emitting type), or may be only output from the outer surface of the second substrate 170 (referring to FIG. 7A) (top-emitting type). Other details of this implementation manner are approximately as described in the foregoing implementation manners, and details are not described herein again.

Figure 8:
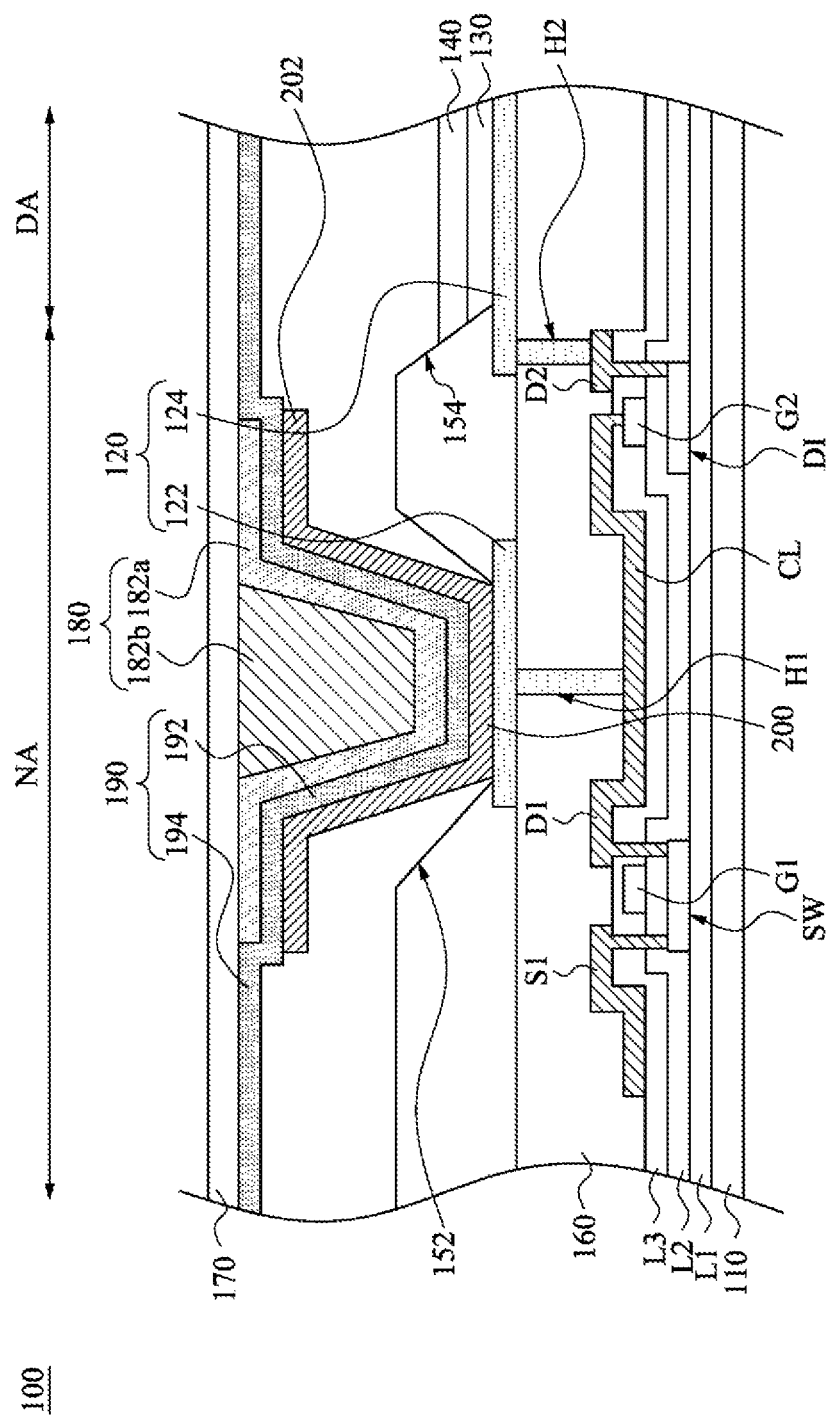
FIG. 8 is a sectional view of a sub-pixel of a display panel according to a seventh implementation manner of the present disclosure.

FIG. 8 is a sectional view of a sub-pixel 100 of a display panel according to a seventh implementation manner of the present disclosure. This implementation manner is similar to the implementation manner of FIG. 7A, and differs from the implementation manner of FIG. 7A in that: in this implementation manner, the display panel further includes a second capacitor electrode 200, disposed on the capacitor dielectric layer 190; two opposite surfaces of the second capacitor electrode 200 (that is, surfaces in a thickness direction) are in contact with the capacitor dielectric layer 190 and the first capacitor electrode 122, respectively; and the upper capacitor electrode 182a, the capacitor dielectric layer 190, the second capacitor electrode 200, and the first capacitor electrode 122 form the storage capacitor. That is, the second capacitor electrode 200 and the first capacitor electrode 122 function as one electrode (e.g. a lower electrode) of the storage capacitor, and the conductive bump 180 functions as the other electrode (e.g. an upper electrode) of the storage capacitor.

Here, the second capacitor electrode 200 further has the extension section 202, and the extension section 202 and the upper capacitor electrode 182a correspondingly function as the upper electrode and the lower electrode of the capacitor. By means of arrangement of the extension section 202 and outwards extension of the upper capacitor electrode 182a, a contact area of the capacitor dielectric layer 190 and the upper electrode and a contact area of the capacitor dielectric layer 190 and the lower electrode are increased, that is, as the three-dimensional capacitor element described in FIG. 4, so as to increase the capacitance.

In this implementation manner, a projection of the second capacitor electrode 200 on the second substrate 170 approximately overlaps a projection of the upper capacitor electrode 182a on the second substrate 170. In another implementation manner, a projection of the second capacitor electrode 200 on the second substrate 170 only partially overlaps a projection of the upper capacitor electrode 182a on the second substrate 170. Besides, in some implementation manners, the second capacitor electrode 200 or the capacitor dielectric layer 190 may not extend and may be only adjacent to a top surface of the bump 182b. Other details of this implementation manner are approximately as described in the foregoing implementation manners, and details are not described herein again. Besides, shapes of projections of the foregoing openings 152 and 154 when being vertically projected on the first substrate 110 may be polygons. Rectangles are used as examples in the present disclosure, but the present disclosure is not limited thereto. An easily manufactured trapezoid is used as an example of a sectional shape of the foregoing conductive bump 180 or the bump 182b of the present disclosure, but the present disclosure is not limited thereto. In another embodiment, a section of the conductive bump 180 or the bump 182b may be step-shaped, such that the second capacitor electrode 200 can climb the conductive bump 180 or the bump 182b easily and the conductive bump 180 or the bump 182b is hardly broken, or may be of another appropriate shape.

The plurality of implementation manners above separately introduces structures of a plurality of types of sub-pixels. With regard to the foregoing structures of the sub-pixels, further applications are provided below, for example, a sensing element is built in a display panel, that is, the sensing element is located between the inner surface of the first substrate and the inner surface of the second substrate, wherein the sensing element may include a capacitive touch sensing element adapted to sense position, a capacitive touch sensing element adapted to sense force, a fingerprint recognition sensing element, an electromagnetic induction element (e.g. near-field communications sensing element, wireless charging sensing element, or another appropriate element), or another appropriate element, or a combination of at least two of the foregoing. Specifically, a sensing electrode and a connection electrode are disposed in the sub-pixel; one of the sensing electrode and the connection electrode may be formed by a patterned layer the same as that of any conductive layer (e.g. the patterned electrode layer 120, the counter electrode 140, the upper capacitor electrode 182a, or the second capacitor electrode 200) in the sub-pixel 100, and the other of the sensing electrode and the connection electrode may be formed by a patterned layer the same as that of a corresponding conductive layer; the sensing electrode and the connection electrode are integrated in a pixel structure array in the display panel, so as to achieve a sensing function and a display function, to reduce an additional film layer and steps of a manufacturing process, and to reduce manufacturing costs and time.

FIG. 9A to FIG. 14C below describe situations that an interlacing (or namely crossing) sensing array is configured and a non-interlacing (or namely non-crossing) sensing array is configured.

Figure 9A:
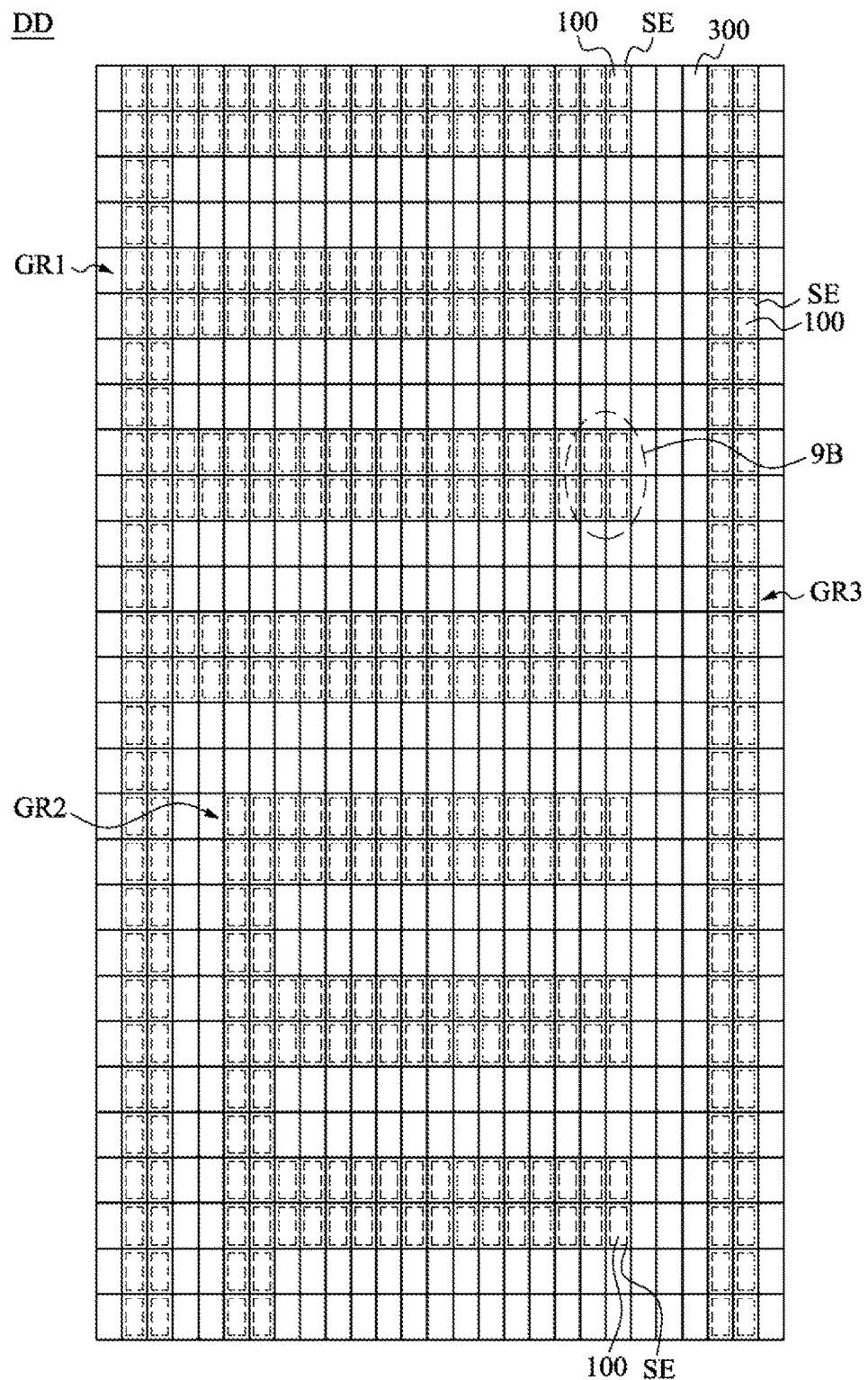
FIG. 9A is a top view of a display panel according to an eighth implementation manner of the present disclosure.

FIG. 9A is a top view of a display panel DD according to an eighth implementation manner of the present disclosure. The display panel of this implementation manner is similar to the display panel of the implementation manner of FIG. 8, the display panel DD includes a plurality of the foregoing sub-pixels 100, and the display panel of this implementation manner differs from the display panel of the implementation manner of FIG. 8 in that: the display panel of this implementation manner further includes sensing electrodes SE, disposed on the second substrate 170. Specifically, the display panel DD includes sub-pixels 100 with sensing electrodes SE and sub-pixels 300 without sensing electrodes. For the convenience of description, only some structures of the display panel DD are drawn, and a sensing electrode SE being disposed around at least part of a sub-pixel 100 is used as an example, but in practical applications, the scope of the present disclosure is not limited thereto.

In this implementation manners, the plurality of sub-pixels 100 may be approximately divided into (or namely defined) a first sensing electrode region GR1, a second sensing electrode region GR2, and an optionally arranged third sensing electrode region GR3. In other words, the display panel DD includes first sensing electrode region GR1, a second sensing electrode region GR2, and an optionally arranged third sensing electrode region GR3, wherein the above-mentioned sensing electrode region (GR1, GR2, GR3) has several sub-pixels 100, respectively. The sensing electrodes SE are disposed on the first sensing electrode region GR1, the second sensing electrode region GR2, and the optionally arranged third sensing electrode region GR3; and the sensing electrodes SE of the first sensing electrode region GR1, the sensing electrodes SE of the second sensing electrode region GR2, and the sensing electrodes SE of the optionally arranged third sensing electrode region GR3 are separated from each other. The sensing electrodes SE of the sub-pixels 100 on the first sensing electrode region GR1 are electrically connected to each other, the sensing electrodes SE of the sub-pixels 100 on the second sensing electrode region GR2 are electrically connected to each other, and the sensing electrodes SE of the sub-pixels 100 on the optionally arranged third sensing electrode region GR3 are electrically connected to each other. The sensing electrodes SE of the sub-pixels 100 on the optionally arranged third sensing electrode region GR3 may be connected to a ground terminal (not shown) or may be floating. When a user touches the display panel DD, capacitance of the sensing electrodes SE of the sub-pixels 100 on the first sensing electrode region GR1 and the second sensing electrode region GR2 changes, so as to sense at least one of a position, a force, and a fingerprint pattern of a finger.

Figure 9B:
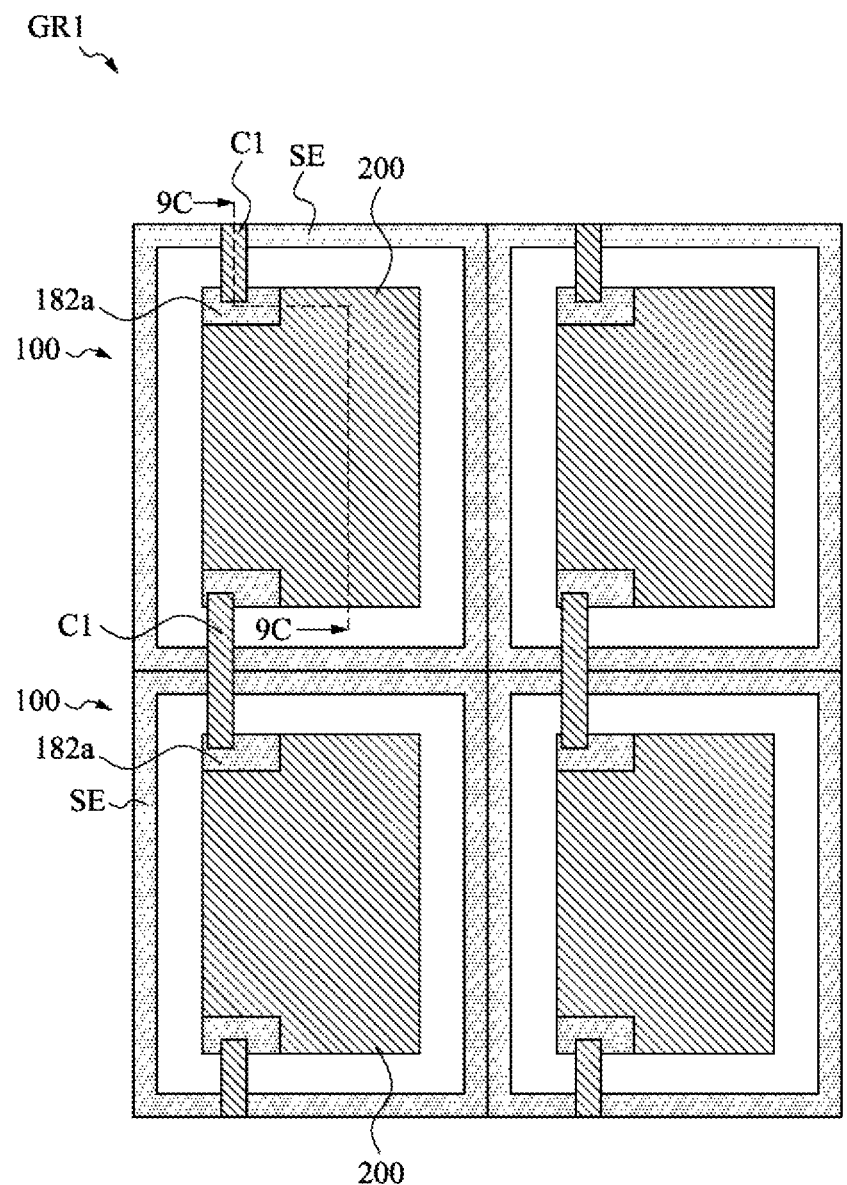
FIG. 9B is a partially enlarged view of the display panel according to FIG. 9A.
Figure 9C:
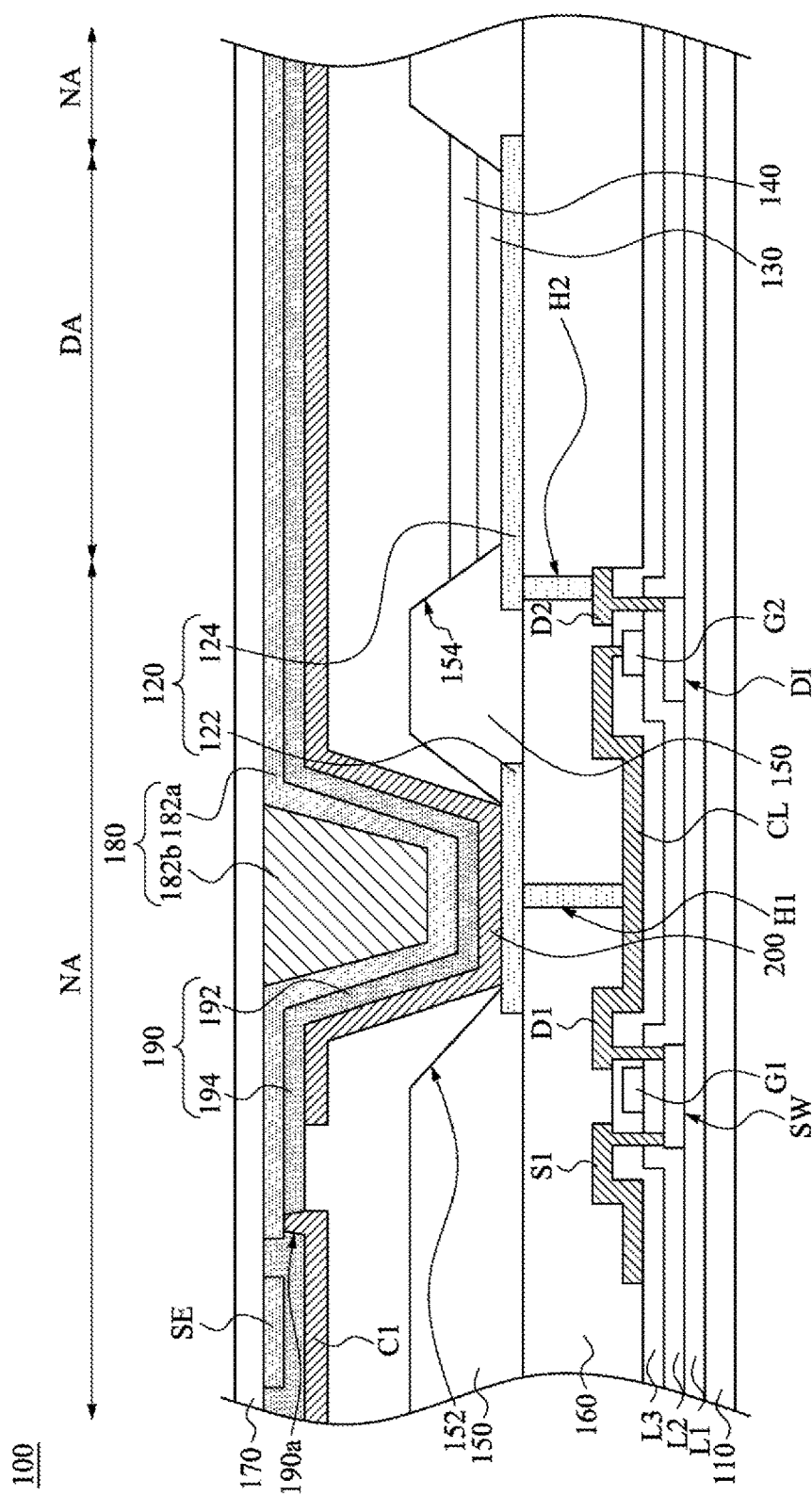
FIG. 9C is a sectional view taken along a line 9C-9C according to FIG. 9B.

Specifically, reference is made to FIG. 9A to FIG. 9C at the same time. FIG. 9B is a partially enlarged view of a portion 9B of the display panel DD according to FIG. 9A. FIG. 9C is a sectional view taken along a line 9C-9C according to FIG. 9B. Here, the sensing electrode SE and the upper capacitor electrode 182a of each sub-pixel 100 on the first sensing electrode region GR1 may be formed by a same patterned layer (referring to the foregoing implementation manners). The sensing electrode SE is located around at least part of the upper capacitor electrode 182a, for example, the sensing electrode SE surrounds at least part of the upper capacitor electrode 182a, and the sensing electrodes SE of adjacent sub-pixels 100 may be directly connected to each other.

Although not drawn herein, a structure of each of the sub-pixels 100 on the second sensing electrode region GR2 and the sub-pixels 100 on the optionally arranged third sensing electrode region GR3 may be approximately the same as the structure of each of the sub-pixels 100 on the first sensing electrode region GR1. The sensing electrodes SE of the sub-pixels 100 on the second sensing electrode region GR2, the sensing electrodes SE of the sub-pixels 100 on the third sensing electrode region GR3, and the corresponding upper capacitor electrodes 182a may be formed by a same patterned layer (referring to the foregoing implementation manners).

In some implementation manners of the present disclosure, the display panel further includes at least one first connection electrode C1 and a second capacitor electrode 200. The first connection electrode C1 is disposed on the second substrate 170, wherein the first connection electrode C1 is connected to the upper capacitor electrodes 182a of two adjacent sub-pixels 100, and the first connection electrode C1 is separated from and partially overlaps the sensing electrodes SE of the two adjacent sub-pixels 100. The configuration of the second capacitor electrode 200 is as described earlier, wherein the second capacitor electrode 200 at least partially overlaps the upper capacitor electrode 182a. Here, the first connection electrode C1 and the second capacitor electrode 200 may be formed by a same patterned layer. Alternatively, in another implementation manner, the sensing electrode SE is located around at least part of the upper capacitor electrode 182a, the sensing electrode SE has at least one opening, and the upper capacitor electrodes 182a of adjacent sub-pixels 100 are directly connected to each other through the openings of the sensing electrodes SE. The first connection electrode C1 and the second capacitor electrode 200 may be formed by a same patterned layer, and the first connection electrode C1 crosses the opening, so as to be connected to the sensing electrode SE of the sub-pixel 100, and the first connection electrode C1 is separated from and partially overlaps the upper capacitor electrode 182a. Here, the sensing electrode SE and the first connection electrode C1 partially overlap the non-light emitting region NA separately.

In some implementation manners, the first connection electrode C1 may cross the sensing electrode SE, and may be connected to the upper capacitor electrode 182a through an opening 190a of the capacitor dielectric layer 190, wherein the first connection electrode C1 is electrically connected to an upper capacitor electrode 182a of a sub-pixel 100 and an upper capacitor electrode 182a of another sub-pixel 100.

Here, go back to FIG. 9A, the sub-pixel 300 may be of a structure of any sub-pixel in the foregoing implementation manners. However, the capacitor element structure (as shown in FIG. 8) described in the present disclosure still needs to be included, and reference may be made to other drawings of the present disclosure for the remaining structures.

Figure 9E:
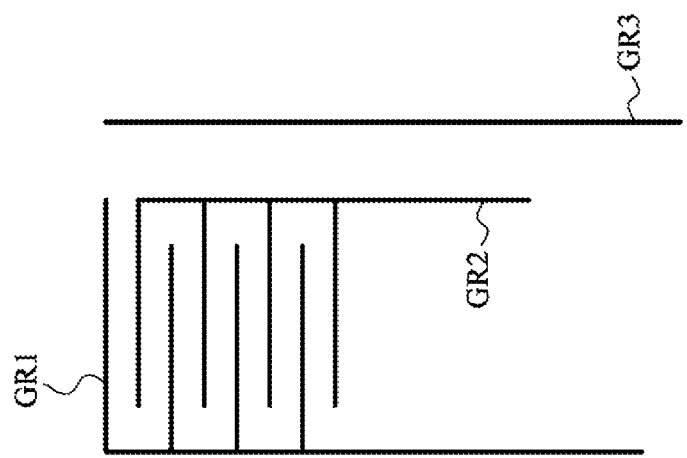
FIG. 9E is a top view of a display panel according to some implementation manners of the present disclosure.
Figure 9D:
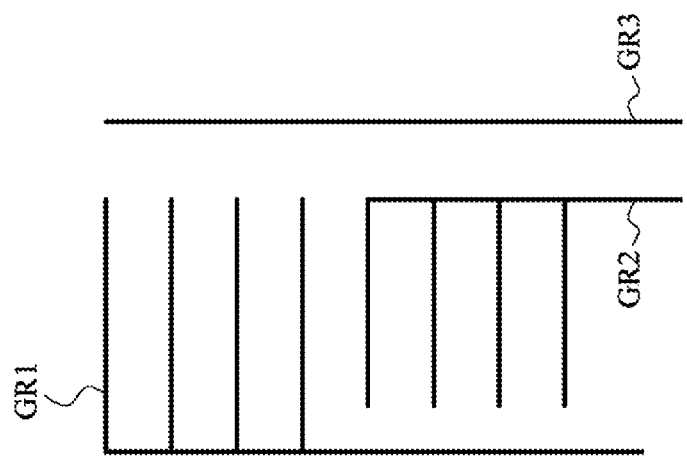
FIG. 9D is a top view of a display panel according to some implementation manners of the present disclosure.

It should be understood that the arrangement of the sub-pixels 100 on the first sensing electrode region GR1 and the second sensing electrode region GR2 in FIG. 9A, that is, openings of the first sensing electrode region GR1 and openings of the second sensing electrode region GR2 being directed to a same direction, shall not be used to limit the scope of the present disclosure. Referring to FIG. 9D and FIG. 9E, FIG. 9D and FIG. 9E are top views of a display panel according to some implementation manners of the present disclosure. In other implementation manners, the sub-pixels 100 on the first sensing electrode region GR1 and the second sensing electrode region GR2 may have different arrangement patterns, that is, openings of the first sensing electrode region GR1 and openings of the second sensing electrode region GR2 are directed to different directions or are interlaced, which also achieves the foregoing sensing effect.

The sensing electrode SE is located around at least part of the upper capacitor electrode 182a, and the upper capacitor electrodes 182a of adjacent sub-pixels 100 are connected by means of the arrangement of the first connection electrode C1, but the present disclosure is not limited thereto. In another implementation manner, the sub-pixel 100 may have another structure, for example, the upper capacitor electrode 182a is located around at least part of the sensing electrode SE. An implementation manner that the upper capacitor electrode 182a is located around the sensing electrode SE is described below with reference to FIG. 10A and FIG. 10B.

Figure 10C:
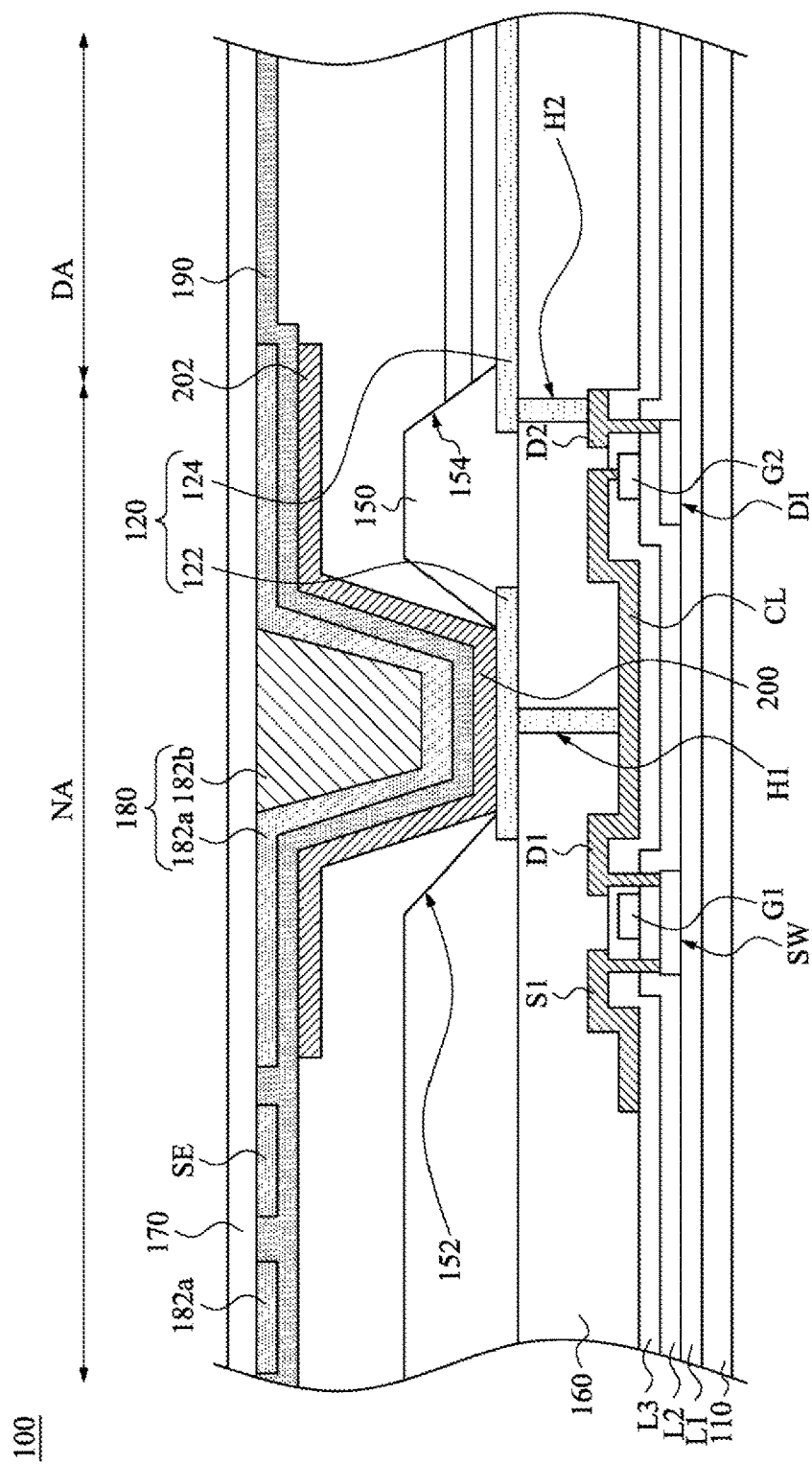
FIG. 10C is a sectional view taken along a line 10C-10C according to FIG. 10B.

Reference is made to FIG. 10A, FIG. 10B, and FIG. 10C at the same time. FIG. 10A is a partial top view of a display panel DD according to one implementation manner of some implementation manners of the present disclosure. FIG. 10B is a partial top view of the display panel DD according to another implementation manner of some implementation manners of the present disclosure. FIG. 10C is a sectional view taken along a line 10C-10C according to FIG. 10A. The implementation manners of FIG. 10A to FIG. 10C are similar to the implementation manner of FIG. 9A to FIG. 9C, and differ from the implementation manner of FIG. 9A to FIG. 9C in that: in the implementation manners of FIG. 10A to FIG. 10C, the display panel further includes at least one first connection electrode C1 for connecting the sensing electrodes SE of two adjacent sub-pixels 100. In this implementation manner, at least a portion of an upper capacitor electrode 182a may be located around a sensing electrode SE, for example, at least a portion of an upper capacitor electrode 182a may surround at least part of a sensing electrode SE. For the convenience of description, only structures of some elements (referring to FIG. 9C) on the second substrate 170 are drawn in FIG. 10A and FIG. 10B.

Referring to FIG. 10A, the first connection electrode C1 and the second capacitor electrode 200 may be formed by a same patterned layer, the upper capacitor electrode 182a forms an accommodation region, such that the sensing electrode SE can be located in the accommodation region. The first connection electrode C1 and the second capacitor electrode 200 are formed by a same patterned layer. The first connection electrode C1 crosses the upper capacitor electrodes 182a, and is electrically connected to the sensing electrodes SE of two adjacent sub-pixels 100.

Alternatively, in another implementation manner, referring to FIG. 10B, here, the first connection electrode C1, the sensing electrode SE, and the upper capacitor electrode 182a are formed by a same patterned layer, the display panel DD further includes at least one second connection electrode C2, and the second connection electrode C2 and the second capacitor electrode 200 are formed by a same patterned layer. The second connection electrode C2 is disposed on the second substrate 170, for example, the second connection electrode C2 is disposed on the capacitor dielectric layer 190, wherein the second connection electrode C2 is connected to the upper capacitor electrodes 182a of two adjacent sub-pixels 100, and the second connection electrode C2 is separated from and partially overlaps the first connection electrode C1. Here, the second connection electrode C2 partially overlaps the upper capacitor electrodes 182a. The second connection electrode C2 and the second capacitor electrode 200 are formed by a same patterned layer. The sensing electrodes SE of FIG. 10A or FIG. 10B partially overlap the light emitting region DA of FIG. 10A or FIG. 10B.

The upper capacitor electrodes 182a of FIG. 10B have openings OC, and the first connection electrode C1 extends through the openings OC, so as to be electrically connected to a sensing electrode SE of a sub-pixel 100 and a sensing electrode SE of another sub-pixel 100. The second connection electrode C2 is disposed on the second substrate 170, the second connection electrode C2 crosses the openings OC, so as to be connected to the upper capacitor electrodes 182a at two sides of the first connection electrode C1, and the second connection electrode C2 is separated from and partially overlaps the first connection electrode C1. It should be understood that in the plurality of implementation manners of the present disclosure, a plurality of types of sensing electrodes and connection electrodes may be arranged synchronously with the upper capacitor electrodes 182a and the second capacitor electrodes 200, and the scope of the present disclosure is not limited to the figures.

Other details of this implementation manner are approximately as described in the foregoing implementation manners, and details are not described herein again.

The FIG. 9A to FIG. 9C and FIG. 10A to FIG. 10C above separately describe a plurality of implementation manners of a non-interlacing type (or namely non-crossing type) when the sensing electrodes SE and the upper capacitor electrodes 182a are formed by a same patterned layer, and a plurality of implementation manners of an interlacing type (or namely crossing type) when the sensing electrodes SE and the upper capacitor electrodes 182a are formed by a same patterned layer is to be described below.

Figure 11A:
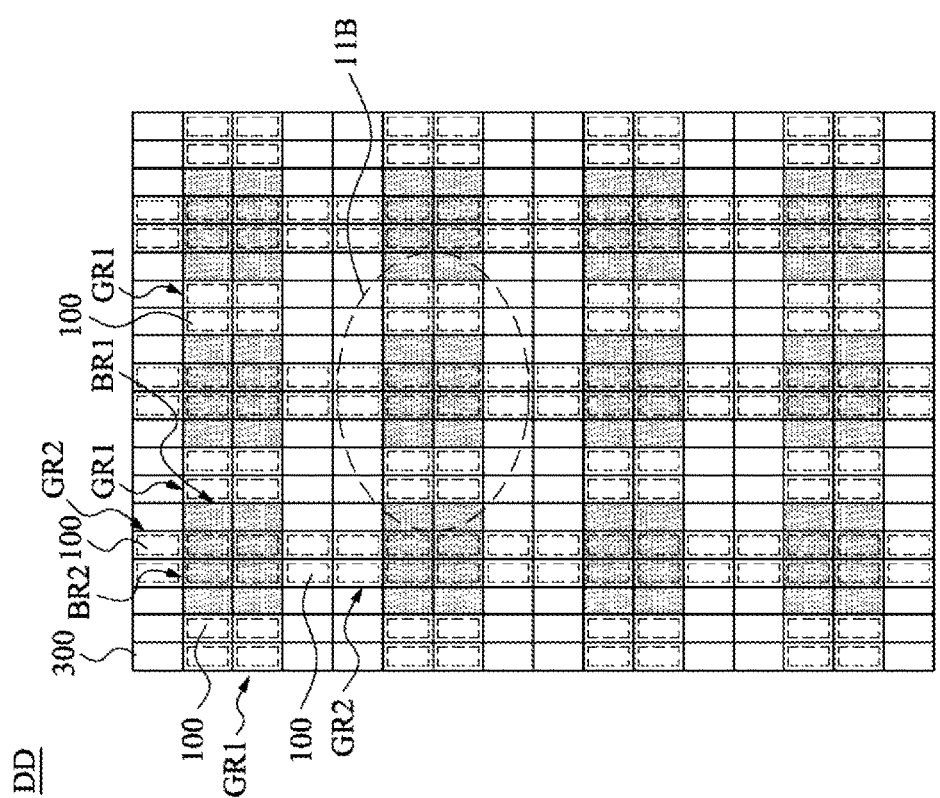
FIG. 11A is a top view of a display panel according to a ninth implementation manner of the present disclosure.

Referring to FIG. 11A, FIG. 11A is a top view of a display panel DD according to a ninth implementation manner of the present disclosure. The display panel DD of this implementation manner is similar to the display panel DD of the implementation manner of FIG. 9A, and differs from the display panel DD of the implementation manner of FIG. 9A in that this implementation manner uses interlacing type (or namely crossing type) configuration. Specifically, in this implementation manner, the sub-pixels 100 have (or namely divided, or defined) at least two first sensing electrode regions GR1, at least two second sensing electrode regions GR2 separated from the first sensing electrode regions GR1, a first bridge electrode region BR1, and a second bridge electrode region BR2 separated from and interlaced (or namely crossed) with the first bridge electrode region BR1, so as to form, by means of arrangement, a mutual-capacitance sensing array. In other words, the display panel DD includes the at least two first sensing electrode regions GR1, the at least two second sensing electrode regions GR2 separated from the first sensing electrode regions GR1, the first bridge electrode region BR1, and the second bridge electrode region BR2 separated from and interlaced (or namely crossed) with the first bridge electrode region BR1, wherein the foregoing regions (GR1, GR2, BR1, BR2) at least has several sub-pixels 100, respectively. The display panel DD further includes sub-pixels 300 without sensing electrodes.

Figure 11B:
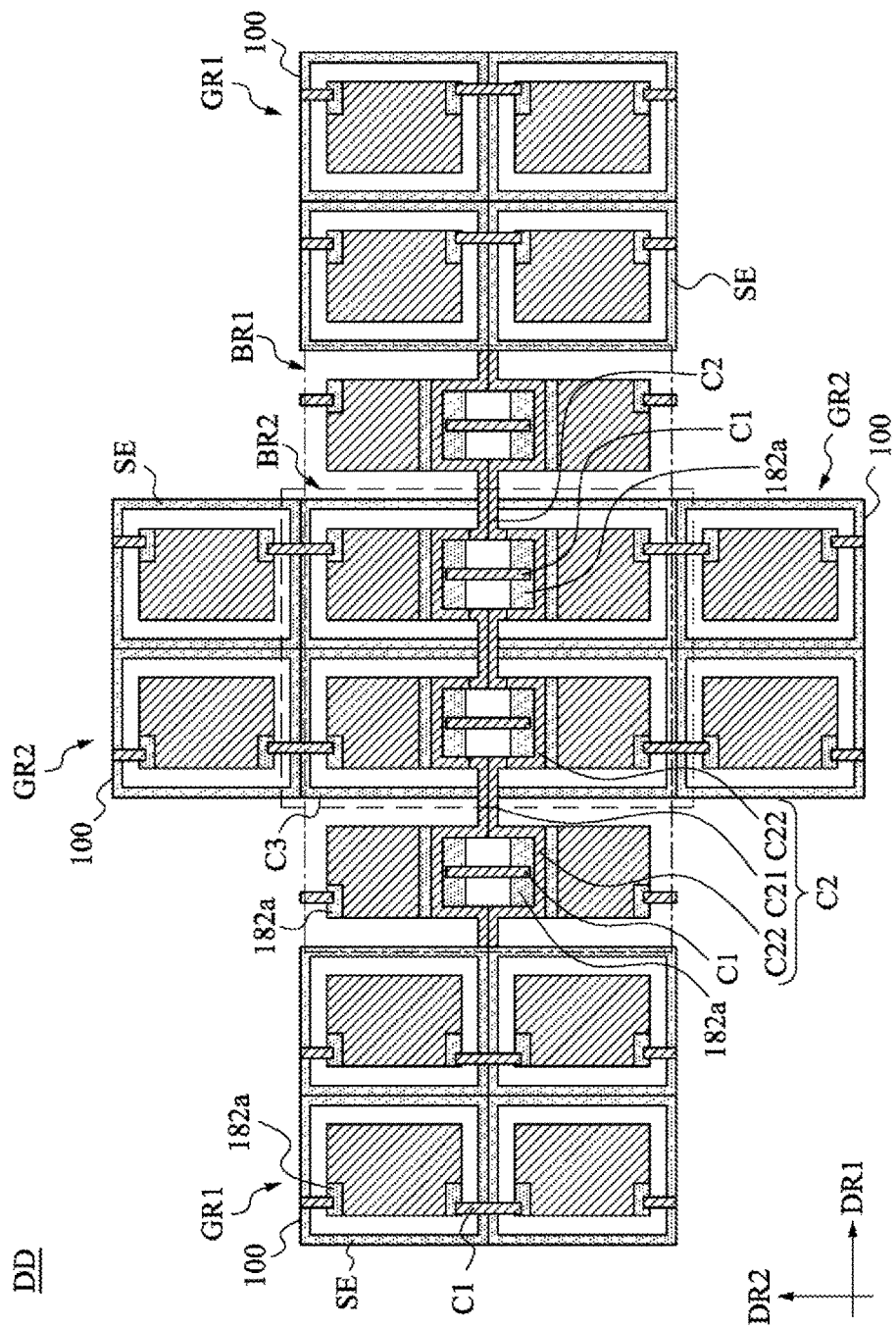
FIG. 11B is a partially enlarged view of the display panel according to FIG. 11A.

Specifically, referring to FIG. 11B, FIG. 11B is a partially enlarged view of a portion 11B of the display panel DD according to FIG. 11A. In this implementation manner, the display panel DD includes a first connection electrode C1, a second connection electrode C2, and a third connection electrode C3.

The first connection electrode C1 is disposed on the second substrate 170 and is located at each of the sub-pixels 100, so as to be connected to the upper capacitor electrodes 182a of two adjacent sub-pixels 100.

The second connection electrode C2 is disposed on the second substrate 170 and is located at each of the sub-pixels 100 of the first bridge electrode region BR1, so as to be connected to the sensing electrodes SE at each of the first sensing electrode regions GR1. In some implementation manners of the present disclosure, the second connection electrode C2 includes at least one first sub-electrode segment C21 and at least one second sub-electrode segment C22. The first sub-electrode segment C21 is located between two adjacent sub-pixels 100 of the first bridge electrode region BR1, and the first sub-electrode segment C21 partially overlaps the sensing electrodes SE of the two adjacent sub-pixels 100 at the first bridge electrode region BR1. The second sub-electrode segment C22 is located at each of the sub-pixels 100 of the first bridge electrode region BR1, so as to be connected to the first sub-electrode segment C21.

The third connection electrode C3 is disposed on the second substrate 170 and located at each of the sub-pixels 100 of the second bridge electrode region BR2, so as to be connected to the sensing electrodes SE at each of the second sensing electrode regions GR2, wherein the second connection electrode C2 is separated from and interlaced (or namely crossed) with the third connection electrode C3, for example, the third connection electrode C3 is interlaced (or namely crossed) with the second sub-electrode segment C22 of the second connection electrode C2. Preferably, the third connection electrode C3 may be a portion of a sensing electrode SE of the second bridge electrode region BR2, and the third connection electrode C3 may extend from a sensing electrode SE of one second sensing electrode region GR2, pass through the sub-pixels 100 of the second bridge electrode region BR2, and be subsequently connected to a sensing electrode SE of the other second sensing electrode region GR2, thereby simplifying a manufacturing process and improving a yield. However, the present disclosure is not limited thereto. In this implementation manner, the first connection electrode C1, the second connection electrode C2, and the second capacitor electrode 200 are formed by a same patterned layer, the third connection electrode C3 and the upper capacitor electrode 182a are formed by a same patterned layer, but the present disclosure is not limited thereto.

Here, the first bridge electrode region BR1 being separated from and interlaced (or namely crossed) with the second bridge electrode region BR2 means that the second connection electrode C2 at the first bridge electrode region BR1 is separated from and interlaced (or namely crossed) with the third connection electrode C3 at the second bridge electrode region BR2. The first bridge electrode region BR1 overlapping the second bridge electrode region BR2 drawn in the figures shall not be construed as that the first bridge electrode region BR1 is not interlaced (or namely crossed) with the second bridge electrode region BR2, and the foregoing construing shall not be used to limit the scope of the present disclosure. Besides, the configuration of the first connection electrode C1, the second connection electrode C2, and the third connection electrode C3 is not limited to the figures, and another film layer may be appropriately configured to help the configuration of the connection line segments.

It should be noted that using some elements on the second substrate 170 for description, the first connection electrodes C1 and the second connection electrodes C2 on the second substrate exist in some sub-pixels of the first bridge electrode region BR1 that are located, due to the overlapping of the first bridge electrode region BR1 and the second bridge electrode region BR2, at an interlacing (or namely crossing) position (region) and a portion of the first bridge electrode region BR1 other than the interlacing position (region), and the third connection electrodes C3 exist in the sub-pixels at the interlacing position (region) and a portion of the second bridge electrode region BR2. Further, the first connection electrode C1 exists in the sub-pixels of the first sensing electrode regions GR1 and the second sensing electrode regions GR2. In the foregoing implementation manner, the sensing electrode SE is located around at least part of the upper capacitor electrode 182a, for example, the sensing electrode SE surrounds at least part of the upper capacitor electrode 182a, but the present disclosure is not limited thereto. In another implementation manner, the sub-pixel 100 may have another structure, for example, the upper capacitor electrode 182a is located around at least part of the sensing electrode SE, referring to the following implementation manner.

Figure 12A:
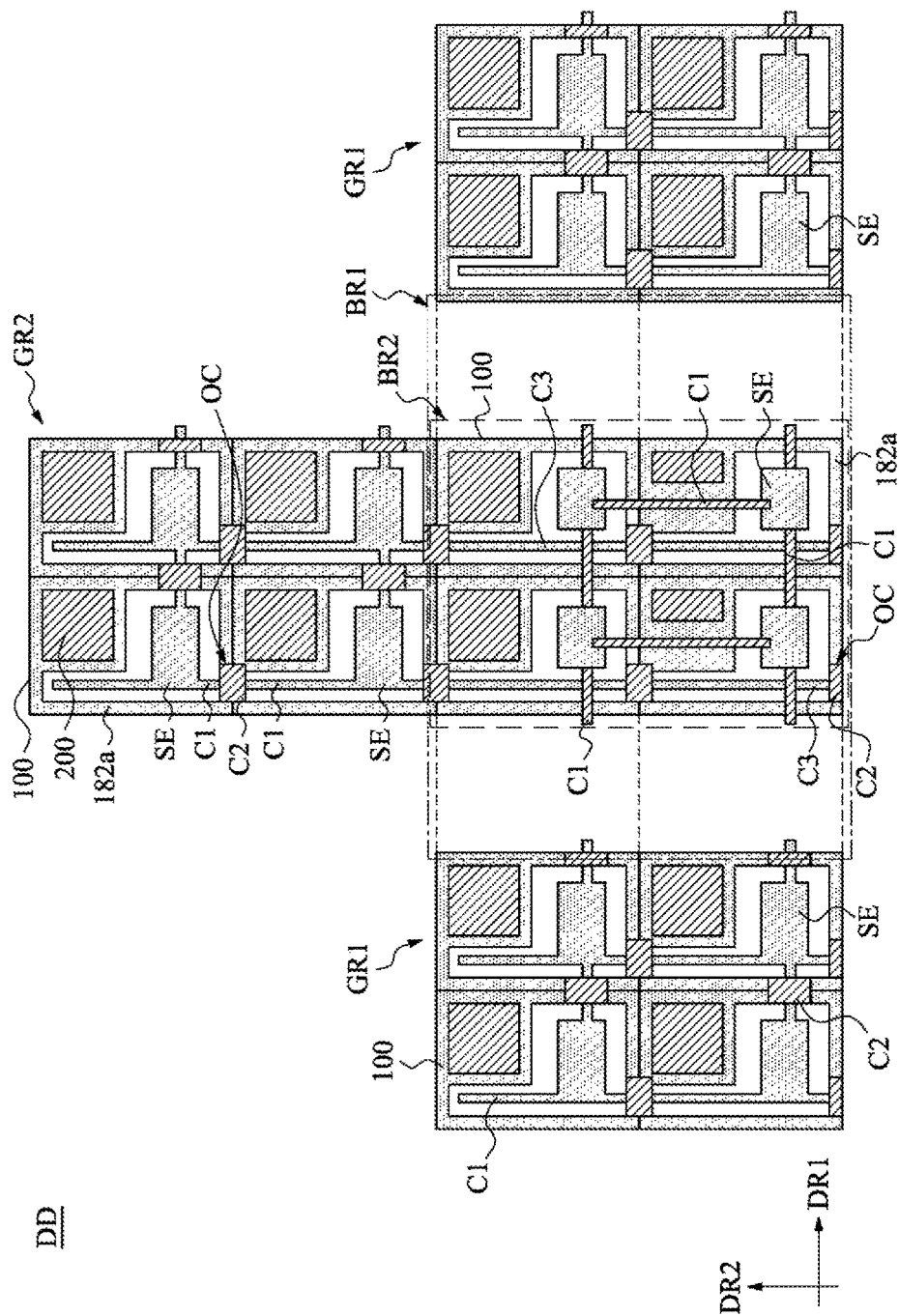
FIG. 12A is a partial top view of a display panel according to some implementation manners of the present disclosure.

Referring to FIG. 12A, FIG. 12A is a partial top view of a display panel DD according to some implementation manners of the present disclosure. Here, the upper capacitor electrode 182a may be located around at least part of the sensing electrode SE by means of an unclosed form. The display panel DD includes the first connection electrode C1, the second connection electrode C2, and the third connection electrode C3. Preferably, the first connection electrode C1, the second connection electrode C2, and the second capacitor electrode 200 are formed by a same patterned layer, the third connection electrode C3 and the upper capacitor electrode 182a are formed by a same patterned layer, but the present disclosure is not limited thereto. In some embodiments, the first connection electrodes C1 of the sub-pixels located at the interlacing (or namely crossing) position (region) due to the overlapping of the first bridge electrode region BR1 and the second bridge electrode region BR2 and the first connection electrodes C1 of the sub-pixels located at the first bridge electrode region BR1 and the second bridge electrode region BR2 are formed by different patterned layers, and the first connection electrodes C1 and the second connection electrodes C2 of the sub-pixels at the interlacing (or namely crossing) position (region) are formed by a same patterned layer. The third connection electrodes C3 of the sub-pixels located at the interlacing (or namely crossing) position (region) due to the overlapping of the first bridge electrode region BR1 and the second bridge electrode region BR2 and the first connection electrodes C1 of the sub-pixels located at the first bridge electrode region BR1 and the second bridge electrode region BR2 are formed by a same patterned layer.

The first connection electrodes C1 are disposed on the second substrate 170 and located at each of the sub-pixels 100 of the first bridge electrode region BR1, so as to be connected to the sensing electrodes SE at the first bridge electrode region BR1, and to be electrically connected to the sensing electrodes at the first sensing electrode regions GR1. For example, directions of the first connection electrodes C1 at the first bridge electrode region BR1 include a first direction DR1 and a second direction DR2 different from the first direction DR1, and each first connection electrode C1 in the first direction DR1 are connected to two adjacent sub-pixels 100, so as to be electrically connected to the sensing electrodes SE of each of the first sensing electrode regions GR1. The first connection electrodes C1 in the second direction DR2 are only connected to the sensing electrodes SE at the first bridge electrode region BR1.

The second connection electrode C2 is disposed on the second substrate 170 and located at each of the sub-pixels of the first bridge electrode region BR1, the second bridge electrode region BR2, the first sensing electrode regions GR1, and the second sensing electrode regions GR2, so as to be connected to upper capacitor electrodes 182a of two adjacent sub-pixels 100, and the second connection electrode C2 is separated from the first connection electrode C1. The second connection electrode C2 is at least located at the first bridge electrode region BR1, and the second connection electrode C2 crosses the openings OC, so as to be connected to the upper capacitor electrodes 182a at two sides of the third connection electrode C3.

The third connection electrode C3 is disposed on the second substrate 170 and is located at each of the sub-pixels 100 of the second bridge electrode region BR2, so as to be connected to the sensing electrodes SE located at each of the second sensing electrode regions GR2. Specifically, the upper capacitor electrodes 182a have openings OC, and the third connection electrode C3 passes through (extends through) the openings, so as to be electrically connected to a sensing electrode SE of a sub-pixel 100 and a sensing electrode SE of another sub-pixel 100. The third connection electrode C3 is separated from the sensing electrode SE of each of the sub-pixels 100 at the second bridge electrode region BR2. Preferably, the third connection electrode C3 may be a portion of a sensing electrode SE at the second bridge electrode region BR2, for example, a portion of a sensing electrode SE originally at a first sensing electrode region GR1 or a second sensing electrode region GR2, wherein the third connection electrode C3 is not connected to the sensing electrodes SE at the second bridge electrode region BR2, and is not connected to the sensing electrodes SE at the first bridge electrode region BR1, that is, the third connection electrode C3 is separated from the sensing electrodes at the second bridge electrode region BR2, and is separated from the sensing electrodes SE at the first bridge electrode region BR1. In other words, the third connection electrode C3 at the second bridge electrode region BR2 may extend from a sensing electrode SE of one second sensing electrode region GR2, pass through the sub-pixels 100 of the second bridge electrode region BR2, and be subsequently connected to a sensing electrode SE of the other second sensing electrode region GR2, thereby simplifying a manufacturing process and improving a yield. However, the present disclosure is not limited thereto. It should be noted that using some elements on the second substrate 170 for description, the first connection electrodes C1 and the second connection electrodes C2 on the second substrate exist in some sub-pixels of the first bridge electrode region BR1 that are located, due to the overlapping of the first bridge electrode region BR1 and the second bridge electrode region BR2, at an interlacing (or namely crossing) position (region) and a portion of the first bridge electrode region BR1 other than the interlacing (or namely crossing) position (region), and the third connection electrodes C3 exist in the sub-pixels at the interlacing (or namely crossing) position (region) and a portion of the second bridge electrode region BR2. Further, the first connection electrodes C1 and the second connection electrodes C2 exist in the sub-pixels of the first sensing electrode regions GR1 and the second sensing electrode regions GR2.

Figure 12B:
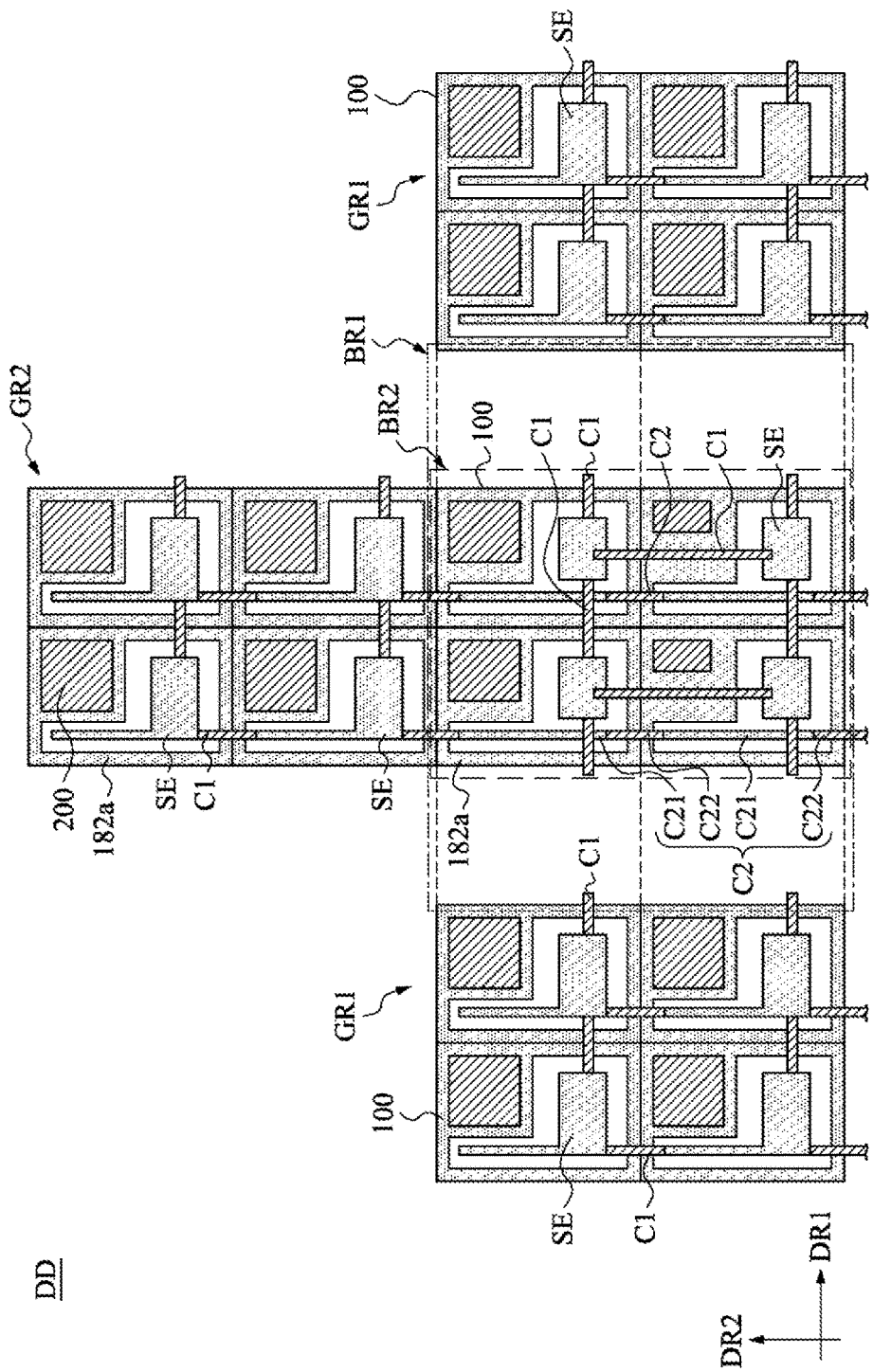
FIG. 12B is a partial top view of a display panel according to some implementation manners of the present disclosure.

Alternatively, referring to FIG. 12B, FIG. 12B is a top view of sub-pixels 100 of a display panel DD according to some implementation manners of the present disclosure. This implementation manner is similar to the implementation manner of FIG. 12A, and differs from the implementation manner of FIG. 12A in that in this implementation manner, an upper capacitor electrode 182a is located around at least part of a sensing electrode SE to form an accommodation region, so as to enable the sensing electrode SE to be located in the accommodation region. The display panel DD includes first connection electrodes C1 and second connection electrodes C2. Here, a portion of each of the first connection electrodes C1, a portion of each of the second connection electrodes C2, and a second capacitor electrode 200 are formed by a same patterned layer, but the present disclosure is not limited thereto. Each first connection electrode C1 crosses upper capacitor electrodes 182a, so as to be electrically connected to a sensing electrode SE of one sub-pixel 100 and a sensing electrode SE of another sub-pixel 100, such that the sensing electrodes SE of each of the first sensing electrode regions GR1 are electrically connected. For example, directions of the first connection electrodes C1 at the first bridge electrode region BR1 include a first direction DR1 and a second direction DR2 different from the first direction DR1, and each first connection electrode C1 in the first direction DR1 is connected to two adjacent sub-pixels 100, so as to be electrically connected to the sensing electrodes SE of each of the first sensing electrode regions GR1. The first connection electrodes C1 in the second direction DR2 are only connected to the sensing electrodes SE at the first bridge electrode region BR1.

The second connection electrodes C2 are disposed on the second substrate 170, and extend to pass through the sub-pixels 100 at the second bridge electrode region BR2, so as to be electrically connected to the sensing electrodes SE at each of the second sensing electrode regions GR2. The second connection electrodes C2 are separated from the first connection electrodes C1, and the second connection electrodes C2 are separated from the sensing electrodes SE at the second bridge electrode region BR2. Preferably, each of the second connection electrodes C2 includes a first sub-electrode segment C21 and a second sub-electrode segment C22. The first sub-electrode segments C21 and the sensing electrodes SE of the second bridge electrode region BR2 are formed by a same patterned layer, wherein the first sub-electrode segments C21 of the second connection electrodes C2 are not connected to the sensing electrodes SE at the second bridge electrode region BR2, and are not connected to the sensing electrodes SE at the first bridge electrode region BR1, that is, the first sub-electrode segments C21 are separated from the sensing electrodes SE at the second bridge electrode region BR2, and are separated from the sensing electrodes SE at the first bridge electrode region BR1. The second sub-electrode segments C22 and a portion of each of the first connection electrodes C1 may be formed by a same patterned layer. In this way, each of the second connection electrodes C2 at the second bridge electrode region BR2 may extend from a first sub-electrode segment C21, pass through the sub-pixels 100 of the second bridge electrode region BR2, and be subsequently connected to a sensing electrode SE of the other second sensing electrode region GR2, thereby simplifying a manufacturing process and improving a yield. However, the present disclosure is not limited thereto. It should be noted that using some elements on the second substrate 170 for description, the first connection electrodes C1 and the second connection electrodes C2 exist in some sub-pixels of the first bridge electrode region BR1 that are located, due to the overlapping of the first bridge electrode region BR1 and the second bridge electrode region BR2, at an interlacing (or namely crossing) position (region) and a portion of the first bridge electrode region BR1 other than the interlacing (or namely crossing) position (region). Further, the first connection electrodes C1 exist in the sub-pixels of the first sensing electrode regions GR1 and the second sensing electrode regions GR2.

Position design of a plurality of types of sensing electrodes is introduced above. It should be understood that a layer relationship of the sensing electrodes and the connection electrodes is not limited to that the upper capacitor electrodes 182a and the second capacitor electrodes 200 are at a same layer. In addition to the foregoing configuration manners of the sensing electrodes, in some implementation manners of the present disclosure, the sensing electrodes may be configured to be formed synchronously with another film layer.

Figure 13A:
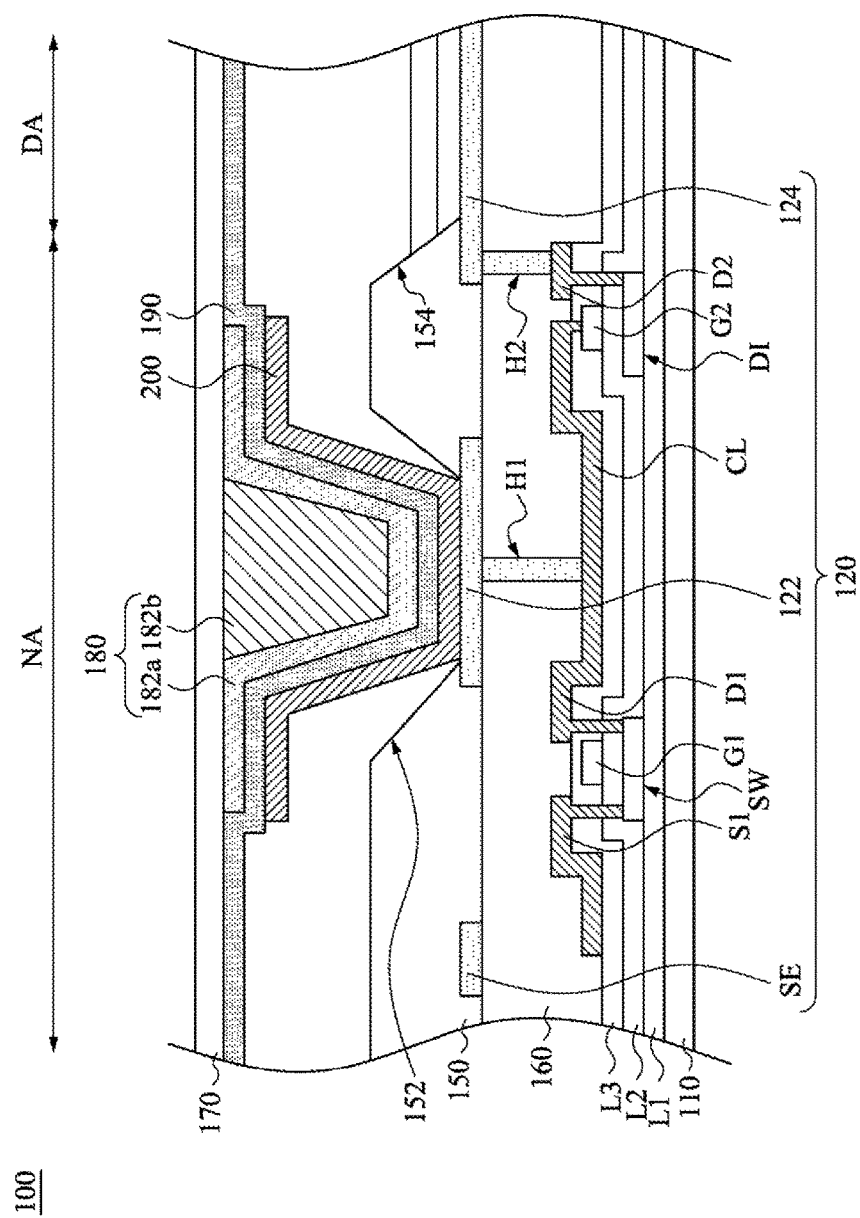
FIG. 13A is a sectional view of a sub-pixel of a display panel according to a tenth implementation manner of the present disclosure.
Figure 13B:
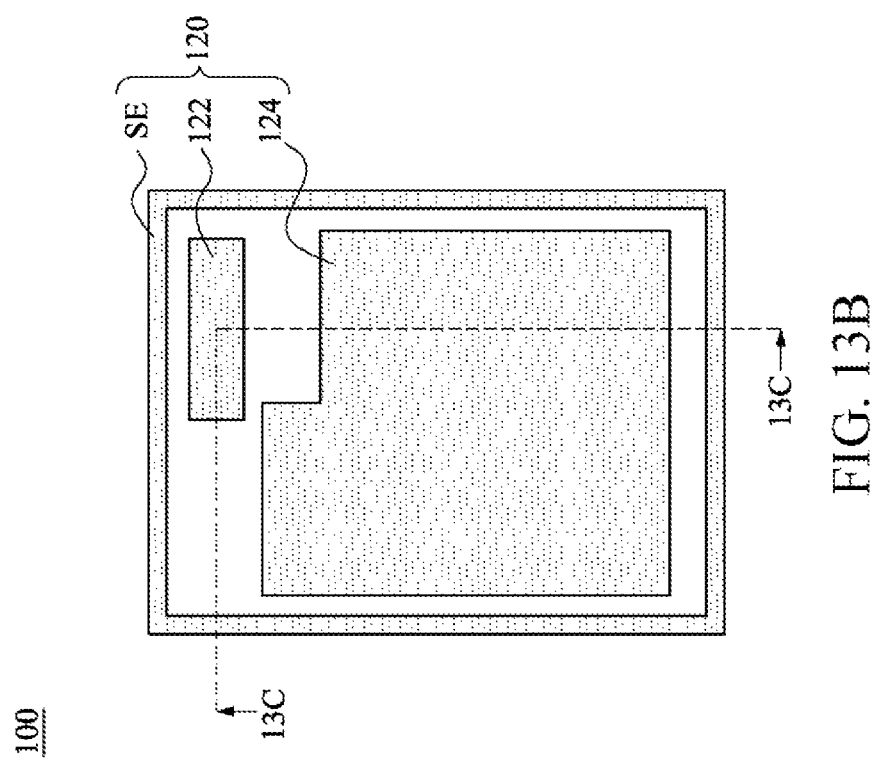
FIG. 13B is a top view of some elements of a first substrate of the sub-pixel of the display panel according to FIG. 13A.
Figure 13C:
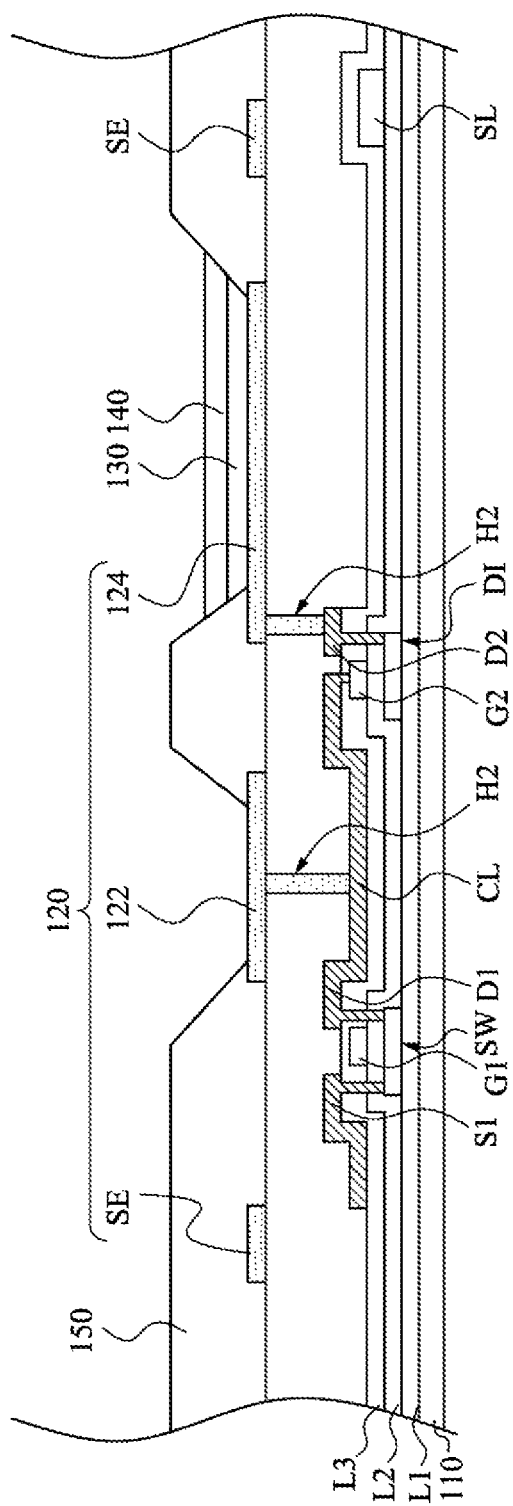
FIG. 13C is a sectional view taken along a line 13C-13C according to FIG. 13B.

FIG. 13A is a sectional view of a sub-pixel 100 of a display panel according to a tenth implementation manner of the present disclosure. FIG. 13B is a top view of some elements of a first substrate 100 of the sub-pixel 100 of the display panel according to FIG. 13A. FIG. 13C is a sectional view taken along a line 13C-13C according to FIG. 13B. The sub-pixel 100 of this implementation manner is similar to the sub-pixel 100 of the implementation manner of FIG. 8, and differs from the sub-pixel 100 of the implementation manner of FIG. 8 in that: in this implementation manner, the patterned electrode layer 120 further includes the sensing electrode SE, the sensing electrode SE partially overlaps the non-light emitting region NA, and the pixel electrode 124 and the first capacitor electrode 122 of each sub-pixel 100 are separated from the sensing electrode SE.

This embodiment uses the configuration manner of FIG. 9A, FIG. 9D, or FIG. 9E, for example, the non-interlacing type (or namely non-crossing type) implementation manner. Sensing electrodes SE may be disposed on each of the first sensing electrode region GR1 and each of the second sensing electrode region GR2, and the sensing electrodes SE of the first sensing electrode regions GR1 are separated from the sensing electrodes SE of the second sensing electrode regions GR2. In another embodiment, the display panel may optionally include at least one third sensing electrode region GR3, the sensing electrodes SE may be disposed on the third sensing electrode region GR3 of the first substrate 110, and the sensing electrodes SE of the first sensing electrode regions GR1 and the sensing electrodes SE of the second sensing electrode regions GR2 are separated from the sensing electrodes SE of the third sensing electrode region GR3. For the remaining features, reference may be made to the foregoing embodiments, and details are not described herein again.

As described earlier, the display panel may further optionally include a bank 150, disposed on the protective layer 160, and having a first opening 152 and a second opening 154. The first opening 152 does not shelter at least a portion of the first capacitor electrode 122, that is, the first opening 152 reveals (or called enables appearance of or exposes) at least a portion of the first capacitor electrode 122. The second opening 154 does not shelter at least a portion of the pixel electrode 124, that is, the second opening 154 reveals (or enables appearance of or exposes) at least a portion of the pixel electrode 124. In other words, the first opening 152 is vertically projected on the first capacitor electrode 122, and the first opening 152 at least partially overlaps the first capacitor electrode 122, which can be regarded as that the first opening 152 is located at at least a portion of the first capacitor electrode 122; the second opening 154 is vertically projected on the pixel electrode 124, and the second opening 154 at least partially overlaps the pixel electrode 124, which can be regarded as that the second opening 154 is located at at least a portion of the pixel electrode 124. The electroluminescent layer 130 and the counter electrode 140 are located in the second opening 154, and the conductive bump 180 is inserted (or called extends, or enters) into the first opening 152, so as to form the structure of the foregoing storage capacitor (the capacitor element CA) of this embodiment. Here, the bank 150 covers the sensing electrode SE.

Here, the sensing electrode SE is located around at least part of the first capacitor electrode 122 and the pixel electrode 124, for example, the sensing electrode SE surrounds at least part of the first capacitor electrode 122 and at least part of the pixel electrode 124. The first capacitor electrode 122 may be electrically connected, by passing through the first through hole H1 of the protective layer 160, to the end point D1 of the switching element SW and the second gate electrode G2 of the driving element DI via the connecting wire CL, the pixel electrode 124 may be electrically connected to the end point D2 of the driving element DI by passing through the second through hole H2 of the protective layer 160. Therefore, design of additional connection lines separately for providing voltages to the first capacitor electrode 122 and the pixel electrode 124 is not required. Other details of this implementation manner are approximately as described in the foregoing implementation manners, and details are not described herein again.

Figure 14A:
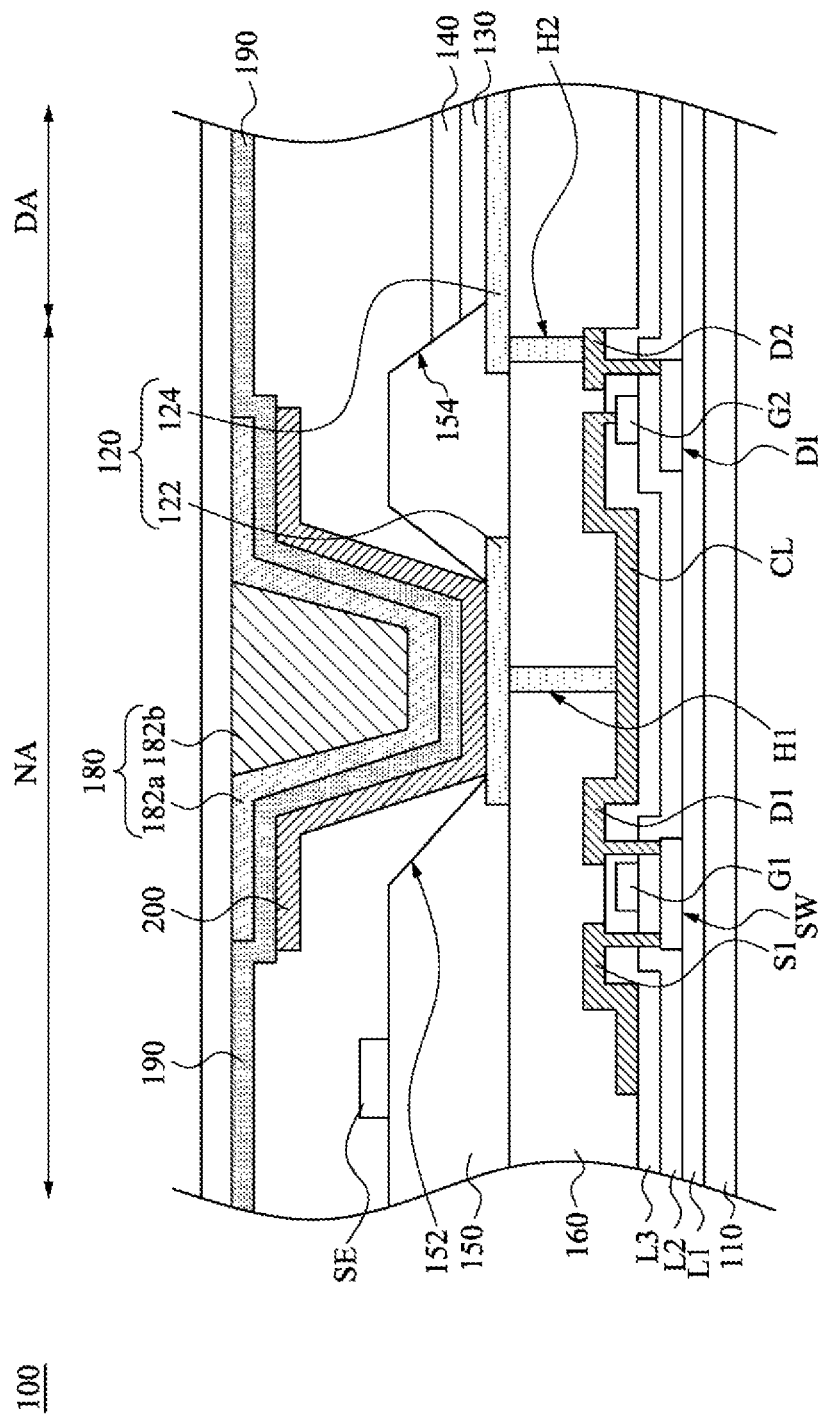
FIG. 14A is a sectional view of a sub-pixel of a display panel according to an eleventh implementation manner of the present disclosure.
Figure 14B:
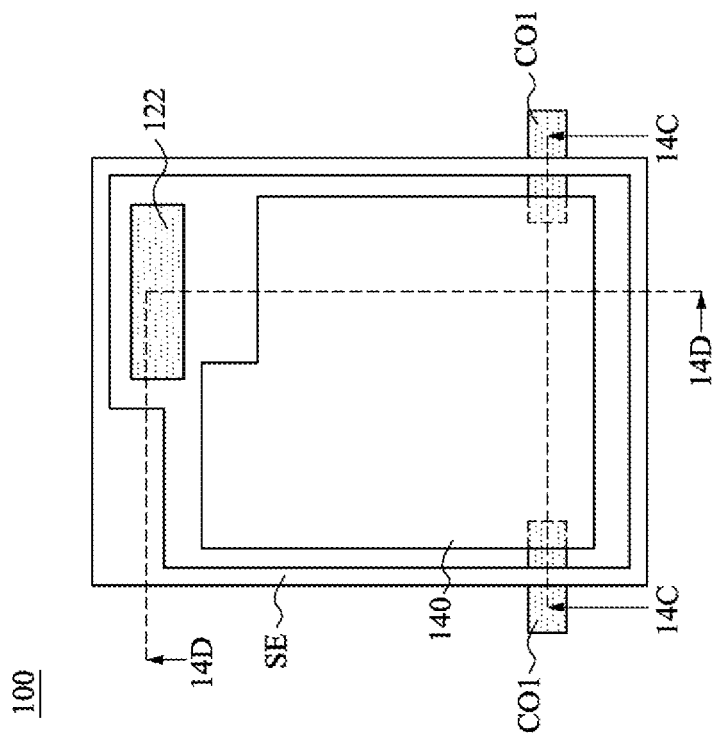
FIG. 14B is a top view of some elements of a first substrate of the sub-pixel of the display panel according to FIG. 14A.
Figure 14C:
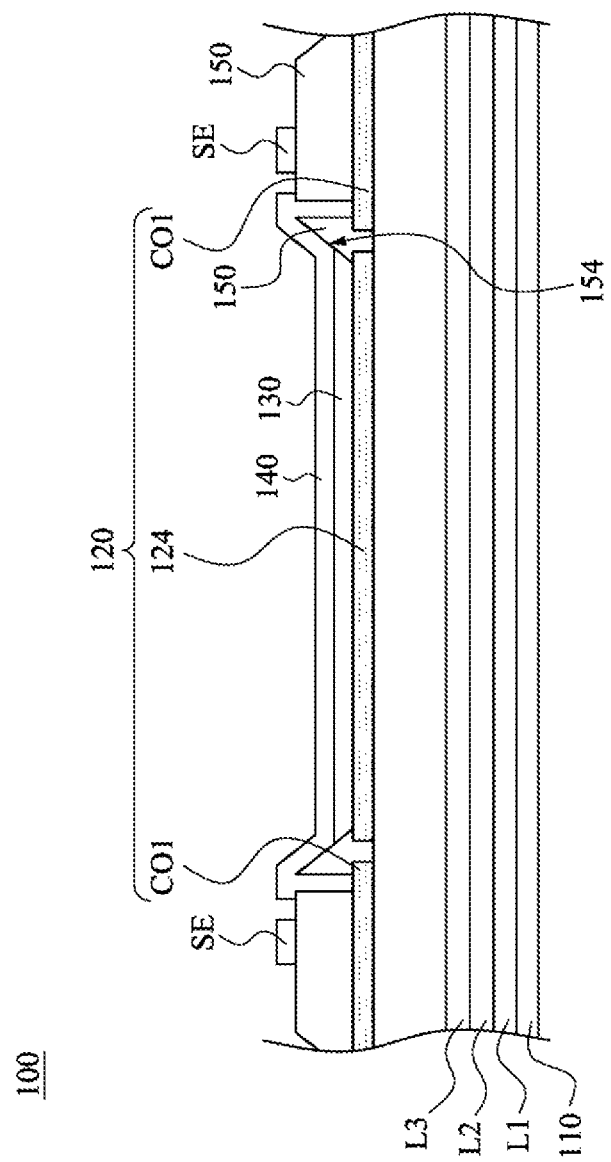
FIG. 14C is a sectional view taken along a line 14D-14D according to FIG. 14B.

FIG. 14A is a sectional view of a sub-pixel 100 of a display panel according to an eleventh implementation manner of the present disclosure. FIG. 14B is a top view of some elements of a first substrate 100 of the sub-pixel 100 of the display panel according to FIG. 14A. FIG. 14C is a sectional view taken along a line 14D-14D according to FIG. 14B. The sub-pixel 100 of this implementation manner is similar to the sub-pixel 100 of the implementation manner of FIG. 8, and differs from the sub-pixel 100 of the implementation manner of FIG. 8 in that: in a plurality of implementation manners of the present disclosure, the display panel further includes sensing electrodes SE, separately disposed on each of the first sensing electrode regions GR1 and the second sensing electrode regions GR2 (referring to FIG. 9A, FIG. 9D, or FIG. 9E), and the sensing electrodes SE partially overlap the non-light emitting region NA, wherein the pixel electrode 124, the counter electrode 140, and the first capacitor electrode 122 of each of the sub-pixels 100 are separated from the corresponding sensing electrode SE, the conductive bump 200 is also separated from the sensing electrode SE, and the sensing electrodes SE of each of the first sensing electrode regions GR1 are separated from the sensing electrodes SE of each of the second sensing electrode regions GR2 (referring to FIG. 9A, FIG. 9D, or FIG. 9E). In another embodiment, the display panel may optionally include at least a third sensing electrode region GR3, the sensing electrodes SE may be disposed on the third sensing electrode region GR3 of the first substrate 110, and the sensing electrodes SE of the first sensing electrode regions GR1 and the sensing electrodes SE of the second sensing electrode regions GR2 are separated from the sensing electrodes SE of the third sensing electrode region GR3. For the remaining features, reference may be made to the foregoing embodiments, and details are not described herein again.

Here, the sensing electrode SE and the counter electrode 140 are formed by a same patterned layer. In a plurality of implementation manners of the present disclosure, a sensing electrode SE surrounds at least part of a counter electrode 140 to form a closed space. In some implementation manners of the present disclosure, the display panel further includes at least one first connection electrode CO1, separately disposed between two adjacent sub-pixels of each of the first sensing electrode regions GR1 and the second sensing electrode regions GR2 (referring to FIG. 9A, FIG. 9D, or FIG. 9E), so as to be connected to the counter electrodes 140 of the two sub-pixels 100, and the pixel electrode 124, the sensing electrode SE, and the first capacitor electrode 122 of each sub-pixel 100 are separated from the first connection electrode CO1. By means of configuring the first connection electrode CO1 to cross the sensing electrodes SE, the counter electrodes 140 of adjacent sub-pixels are electrically connected. Preferably, the first connection electrode CO1 and the pixel electrodes 124 are formed by a same patterned layer, but the present disclosure is not limited thereto.

As described earlier, the display panel includes a bank 150, disposed on the protective layer 160, and having a first opening 152 and a second opening 154. The first opening 152 does not shelter at least a portion of the first capacitor electrode 122, that is, the first opening 152 reveals (or called enables appearance of or exposes) at least a portion of the first capacitor electrode 122. The second opening 154 does not shelter at least a portion of the pixel electrode 124, that is, the second opening 154 reveals (or enables appearance of or exposes) at least a portion of the pixel electrode 124. In other words, the first opening 152 is vertically projected on the first capacitor electrode 122, and the first opening 152 at least partially overlaps the first capacitor electrode 122, which can be regarded as that the first opening 152 is located at at least a portion of the first capacitor electrode 122; the second opening 154 is vertically projected on the pixel electrode 124, and the second opening 154 at least partially overlaps the pixel electrode 124, which can be regarded as that the second opening 154 is located at at least a portion of the pixel electrode 124. The electroluminescent layer 130 and the counter electrode 140 are located in the second opening 154, and the conductive bump 180 is inserted (or called extends, or enters) into the first opening 152, so as to form the structure of the foregoing storage capacitor (the capacitor element CA) of this embodiment, wherein the sensing electrodes SE are disposed on the bank 150, and the bank 150 covers the first connection electrode CO1. Other details of this implementation manner are approximately as described in the foregoing implementation manners, and details are not described herein again.

It should be understood that although not being specifically drawn here, a vertical projection of the foregoing sensing electrode SE on the first substrate 110 may partially overlap a vertical projection of the scan line SL, the power line PL, or the data line DL on the first substrate 110, so as to reduce an impact on a light transmitting region (for example, the light emitting region DA).

Figure 15A:
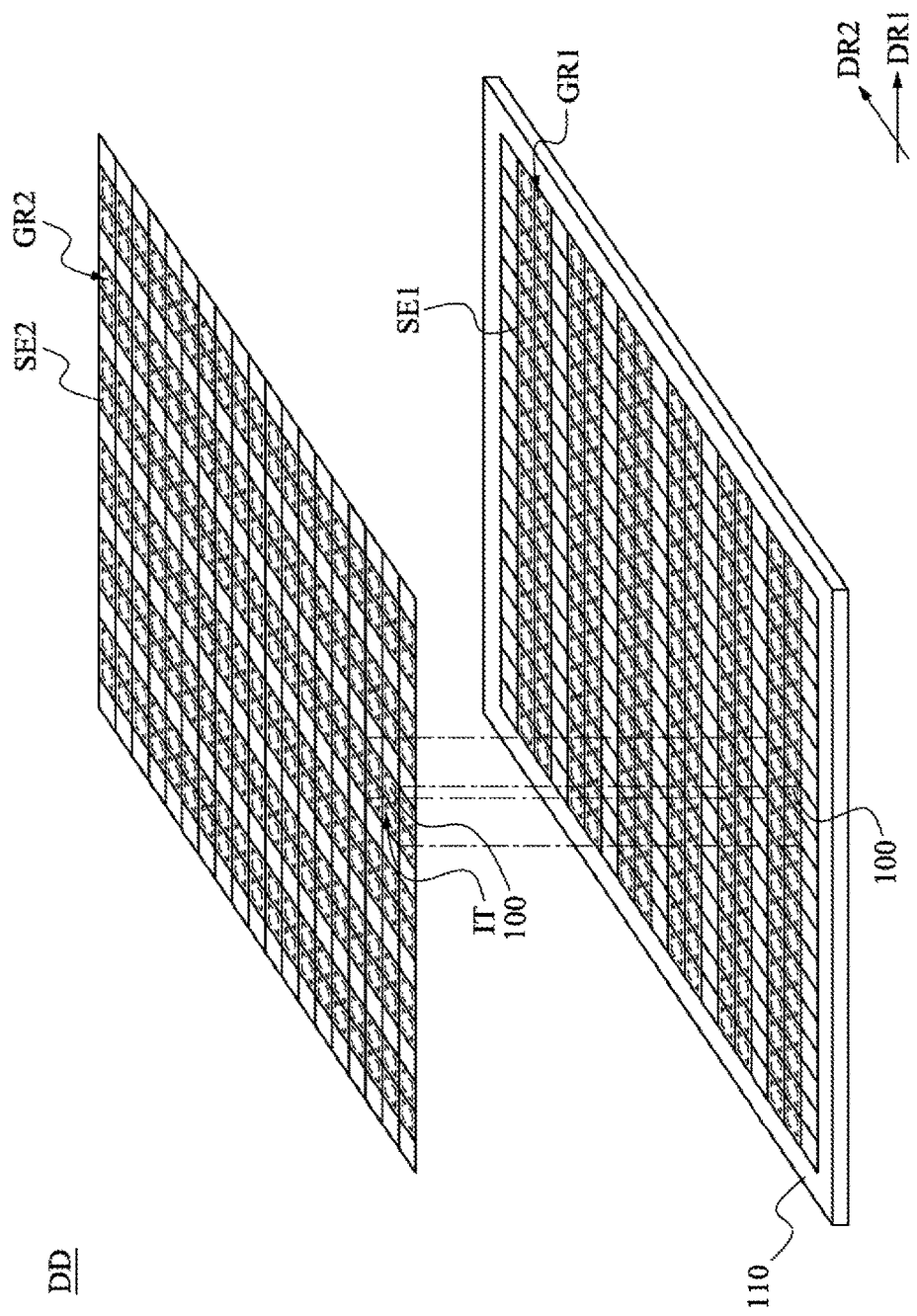
FIG. 15A is a three-dimensional schematic diagram of a display panel according to a twelfth implementation manner of the present disclosure.

FIG. 15A is a three-dimensional schematic diagram of a display panel DD according to a twelfth implementation manner of the present disclosure. This implementation manner is similar to the foregoing implementation manner, and differs from the foregoing implementation manner in that: in this implementation manner, a sub-pixel 100 has (or namely defined, or divided) at least one first sensing electrode region GR1 and at least one second sensing electrode region GR2 interlaced (or namely crossed) with and separated from the first sensing electrode region GR1. In other words, the display panel DD includes the at least one first sensing electrode region GR1 and the at least one second sensing electrode region GR2 interlaced (or namely crossed) with and separated from the first sensing electrode region GR1, wherein the foregoing regions (GR1, GR2) have several sub-pixels 100, respectively. Here, the first sensing electrode region GR1 extends along a first direction DR1, a second sensing electrode SE2 extends along a second direction DR2, wherein the second direction DR2 is not parallel to the first direction DR1, that is, the first direction DR1 is interlaced (or namely crossed) with the second direction DR2. In a plurality of implementation manners of the present disclosure, the first direction DR1 and the second direction DR2 being perpendicular to each other is used as an example, but the present disclosure is not limited thereto. An interlacing (or namely crossed) position (or namely region) of the first sensing electrode region GR1 and the second sensing electrode region GR2 has at least one interlacing region (or namely crossing region) IT. The display panel DD further includes at least one first sensing electrode SE1 and at least one second sensing electrode SE2, separately disposed at the first sensing electrode region GR1 and the second sensing electrode region GR2, wherein the first and the second sensing electrodes SE1, SE2 are interlaced (or namely crossed) at the interlacing region (or namely crossing region) IT, that is, the interlacing region IT includes the first and the second sensing electrodes SE1, SE2 and relevant fitted components.

Figure 15B:
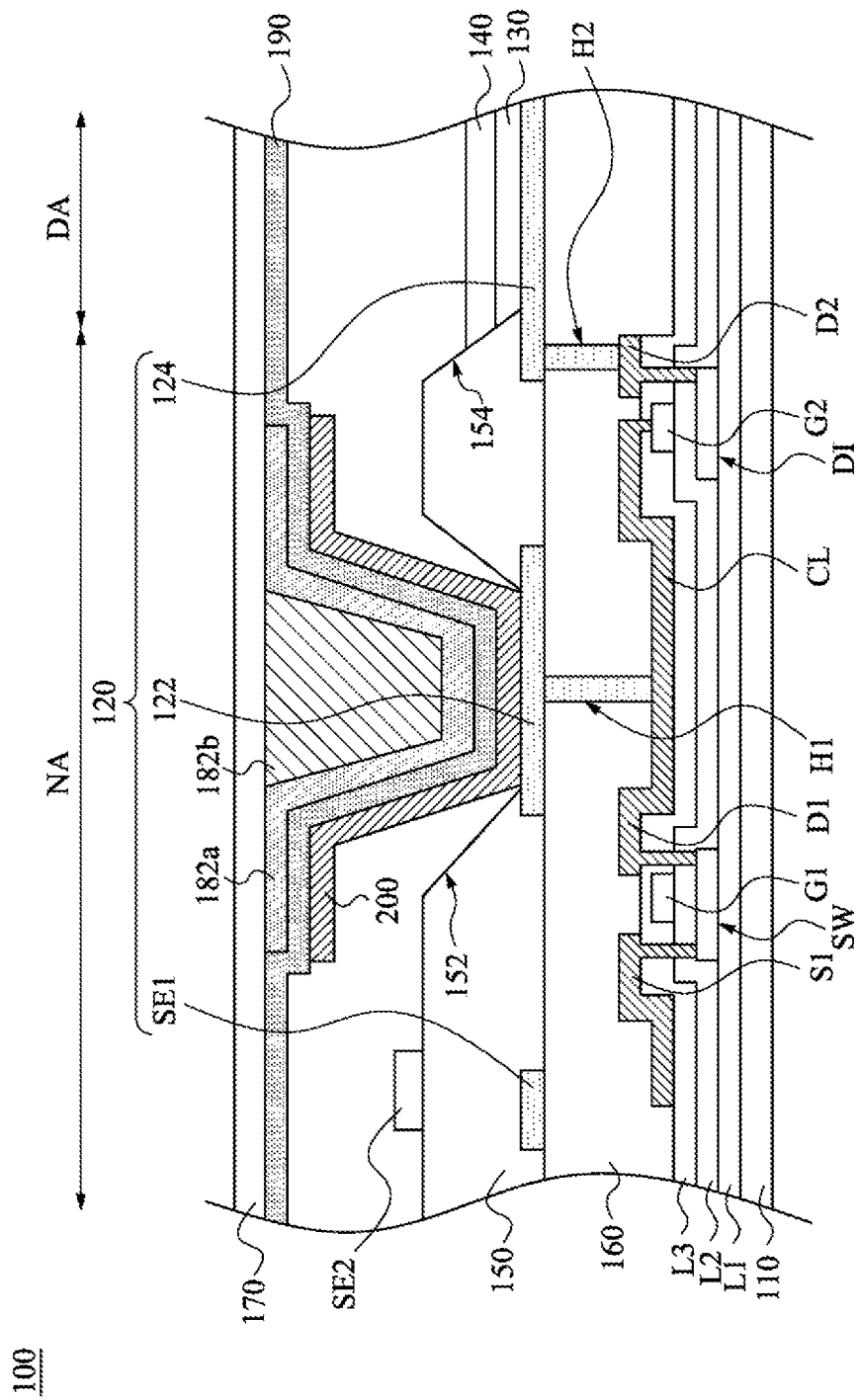
FIG. 15B is a sectional view of a sub-pixel at an interlacing region of the display panel according to FIG. 15A.

FIG. 15B is a sectional view of a sub-pixel 100 at the interlacing region IT of the display panel according to FIG. 15A. Referring Reference is made to FIG. 15A and FIG. 15B at the same time. Specifically, the first sensing electrodes SE1 belong to the patterned electrode layers 120, are disposed on the sub-pixels 100 of the first sensing electrode region GR1 of the first substrate 110, and are connected to each other, the first sensing electrodes SE1 partially overlap the non-light emitting region NA, and the pixel electrode 124 and the first capacitor electrode 122 of each of the sub-pixel 100 are separated from the corresponding first sensing electrode SE1. Preferably, the pixel electrode 124, the first capacitor electrode 122, and the first sensing electrode SE1 are formed by a same patterned layer, but the present disclosure is not limited thereto. The bank 150 covers the first sensing electrode SE1. The second sensing electrodes SE2 are separately disposed on the sub-pixels 100 of the second sensing electrode region GR2 of the first substrate 110 and are connected to each other, and the second sensing electrodes SE2 partially overlap the non-light emitting region NA, wherein the second sensing electrodes SE2 are disposed on the bank 150 (e.g. a top surface), and the counter electrode 140 of each of the sub-pixels 100 is separated from the corresponding second sensing electrode SE2. Preferably, the second sensing electrode SE2 and the counter electrode 140 are formed by a same patterned layer, but the present disclosure is not limited thereto.

Figure 15C:
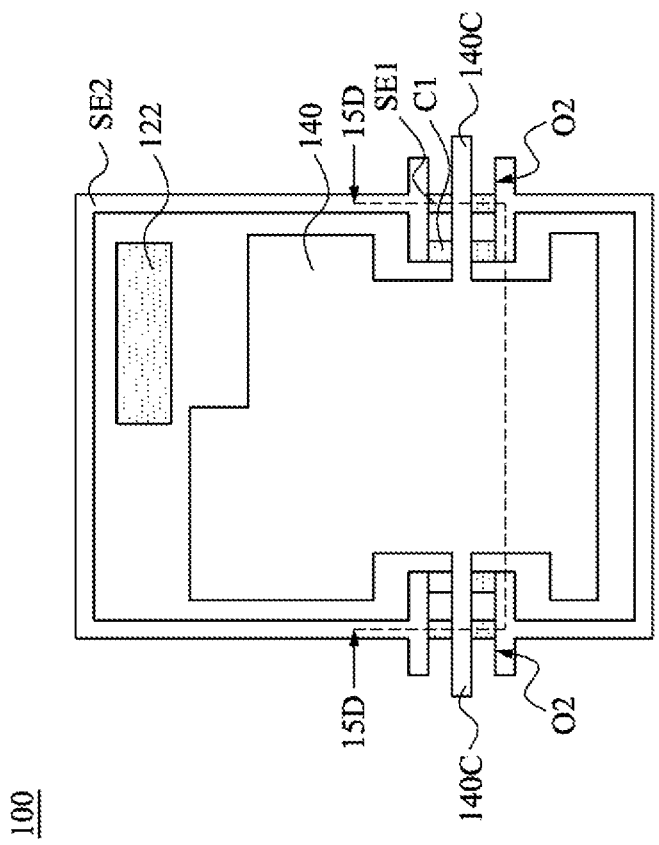
FIG. 15C is a top view of some elements of a first substrate of the sub-pixel of the display panel according to FIG. 15B.
Figure 15D:
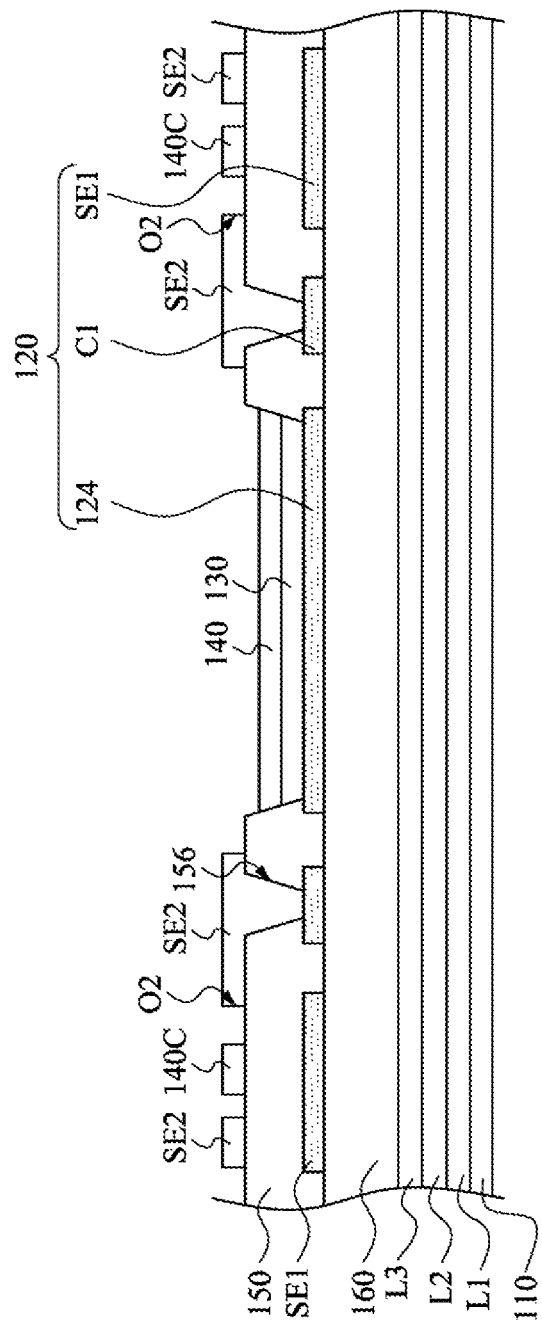
FIG. 15D is a sectional view taken along a line 15D-15D according to FIG. 15C.

FIG. 15C is a top view of some elements of the first substrate 110 of the sub-pixel 100 of the display panel according to FIG. 15B. FIG. 15D is a sectional view taken along a line 15D-15D according to FIG. 15C, and the elements on the second substrate 170 are omitted. Reference is made to FIG. 15B to FIG. 15D at the same time. In this implementation manner, the first sensing electrode SE1 is located below the second sensing electrode SE2 and is located around at least part of the first capacitor electrode 122 and at least part of the pixel electrode 124, for example, the first sensing electrode SE1 surrounds at least part of the first capacitor electrode 122 and the pixel electrode 124.

In some implementation manners of the present disclosure, the display panel further includes at least one first connection electrode C1 and at least one second connection electrode 140C. The first connection electrode C1 is disposed at each of the sub-pixels 100 of the first substrate 110, so as to be connected to the second sensing electrode SE2 of the sub-pixel 100, and the second sensing electrode SE2 of the sub-pixel 100 is separated from the pixel electrode 124 of the sub-pixel 100. The second connection electrode 140C is disposed at each of the sub-pixels 100 of the first substrate 110, the second connection electrode 140C is located at the bank 150 (e.g. the top surface) and is connected to the counter electrodes 140 of two adjacent sub-pixels 100 at the interlacing region IT (referring to FIG. 15A and FIG. 15D). Specifically, the second sensing electrode SE2 includes an opening O2, and the second connection electrode 140C passes through (extends through) the opening O2, so as to be electrically connected to a counter electrode (not shown) of another sub-pixel. The first connection electrode C1 may pass through the opening O2, so as to be electrically connected to the second sensing electrodes SE2 at two sides of the second connection electrode 140C. The first connection electrode C1 and the second connection electrode 140C are interlaced (or namely crossed) at the interlacing region (or namely crossing region) IT (referring to FIG. 15A).

Reference is made to FIG. 15A to FIG. 15D at the same time. It should be noted that besides the interlacing region (or namely crossing region) IT, the first sensing electrode region (extending along the first direction DR1) GR1 includes at least one first sensing electrode SE1 and other relevant elements (using some elements on the first substrate 110 as examples: the TFT, the pixel electrode 124, the first capacitor electrode 122, the counter electrode 140, the second connection electrode 140C, and the like), but does not include the first connection electrode C1 and the second sensing electrode SE2. Besides the interlacing region IT, the second sensing electrode region (extending along the second direction DR2) GR2 includes at least one second sensing electrode SE2 and other relevant elements (using some components on the first substrate 110 as examples: the TFT, the pixel electrode 124, the first capacitor electrode 122, the counter electrode 140, the first connection electrode C1, the second connection electrode 140C, and the like), but does not include the at least one first sensing electrode SE1. Therefore, in addition to the elements forming one of the foregoing embodiments of the present disclosure (e.g. one of FIG. 1 to FIG. 8), each sub-pixel at the interlacing region (or namely crossing region) IT further includes the first sensing electrode SE1, the second sensing electrode SE2, the first connection electrode C1, the second connection electrode 140C, and relevant elements.

In some implementation manners of the present disclosure, the bank 150 further covers the first sensing electrode SE1 and a portion of the first connection electrode C1, and the second connection electrode 140C is located at the bank 150. In addition to the foregoing first opening 152 and the second opening 154, the bank 150 may further include a plurality of openings 156 into which a conductive material is filled, such that each of the openings 156 is electrically connected to the first connection electrode C1 and the second sensing electrode SE2.

In a plurality of implementation manners of the present disclosure, the first connection electrode C1, the first capacitor electrode 122, the first sensing electrode SE1, and the pixel electrode 124 are formed by a same patterned layer. The second sensing electrode SE2, the second connection electrode 140C, and the counter electrode 140 are formed by a same patterned layer. Preferably, a vertical projection of the second sensing electrode SE2 on the patterned electrode layer 120 (that is, the first substrate 110) may be configured to partially overlap the first sensing electrode SE1, so as to achieve a relatively good sensing effect, but the present disclosure is not limited thereto. Other details of this implementation manner are approximately as described earlier, and details are not described herein again.

Figure 16A:
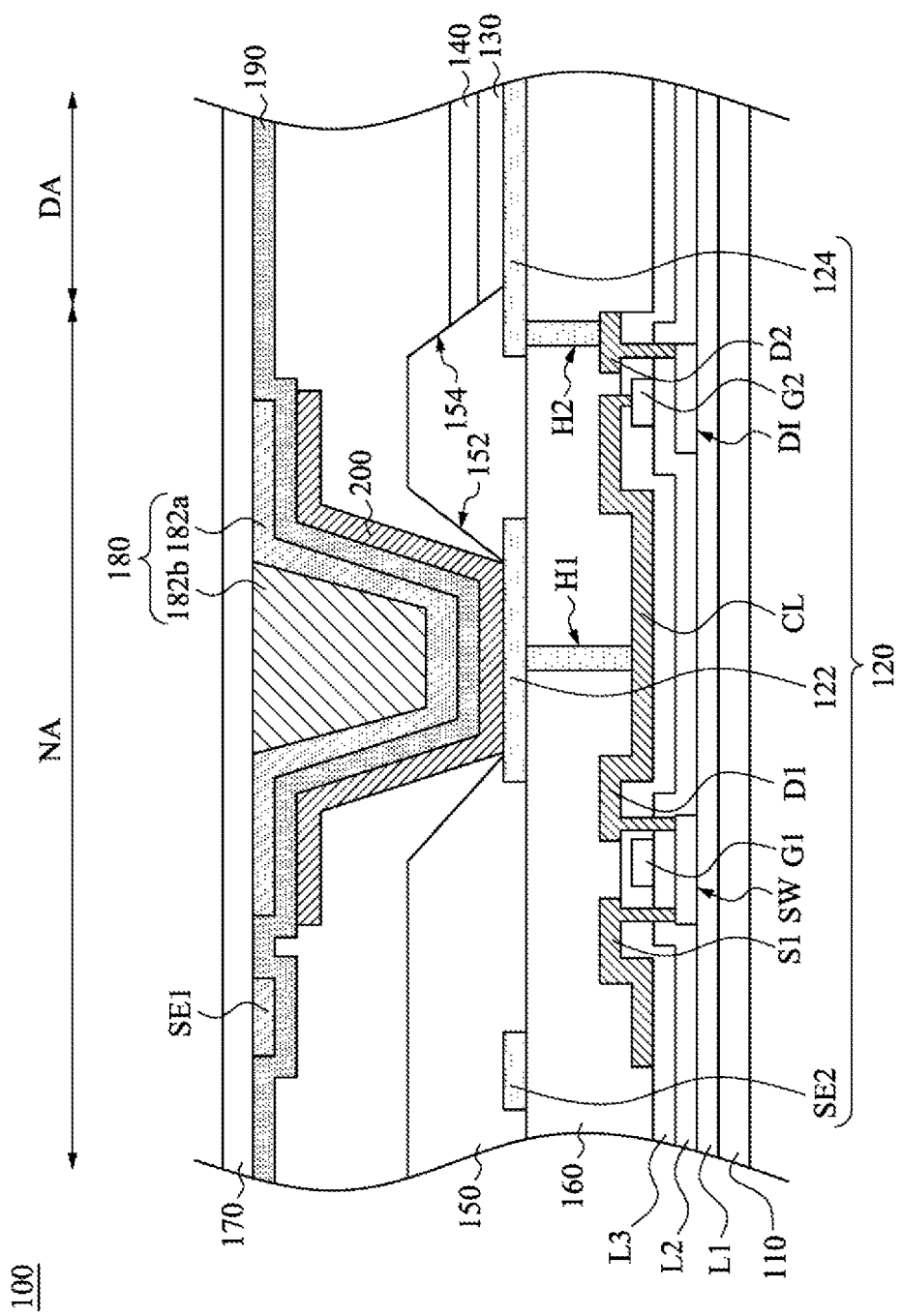
FIG. 16A is a sectional view of a sub-pixel at an interlacing region of a display panel according to a thirteenth implementation manner of the present disclosure.
Figure 16B:
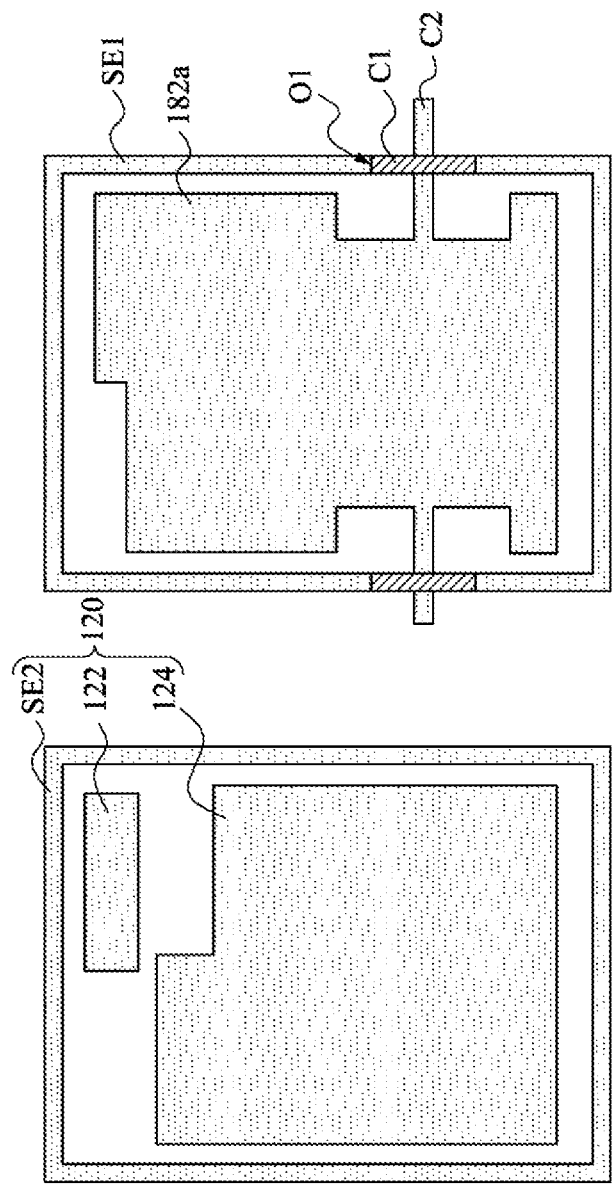
FIG. 16B is a top view of some elements of a second substrate and some elements of a first substrate of the sub-pixel of the display panel according to FIG. 16A.

FIG. 16A is a sectional view of a sub-pixel 100 at an interlacing region IT (referring to FIG. 15A) of a display panel according to a thirteenth implementation manner of the present disclosure. FIG. 16B is a top view of some elements of the second substrate 170 of the sub-pixel 100 (at a right side of the figure) and some elements of the first substrate 110 of the sub-pixel 100 of the display panel (at a left side of the figure) according to FIG. 16A. The sectional view drawn according to the top view of some elements of the second substrate 170 of the sub-pixel 100 of this implementation manner is similar to FIG. 9C, and the top view and the sectional view of some elements of the first substrate 110 of the sub-pixel 100 of this implementation manner are similar to the sectional view of FIG. 13A and the top view of some elements of the first substrate 110 of FIG. 13B, and a main difference lies in that: in this implementation manner, the display panel includes at least one first sensing electrode SE1 at the second substrate 170 and at least one second sensing electrode SE2 at the first substrate 110. However, in the implementation manner of FIG. 9C, a sensing electrode is located at the second substrate 170, or in the implementation manner of FIG. 13A and FIG. 13B, a sensing electrode is located at the first substrate 110.

The first sensing electrodes SE1 are separately disposed at the sub-pixels 100 of the first sensing electrode region GR1 (referring to FIG. 15A) of the second substrate 170. The first sensing electrodes SE1 are connected to each other, the first sensing electrodes SE1 partially overlap a non-light emitting region NA, wherein the upper capacitor electrode 182a and the second capacitor electrode 200 of each of the sub-pixels 100 are separated from the corresponding first sensing electrode SE1. The second sensing electrodes SE2 are disposed at the sub-pixels 100 of the second sensing electrode region GR2 (referring to FIG. 15A) of the first substrate 110 and are connected to each other, and the second sensing electrodes SE2 partially overlap the non-light emitting region NA, wherein the pixel electrode 124 and the first capacitor electrode 122 of each sub-pixel 100 are separated from the corresponding second sensing electrode SE2, and the first sensing electrodes SE1 are separated from the second sensing electrodes SE2.

As described earlier, the display panel includes the bank 150, disposed on the protective layer 160, and having the first opening 152 and the second opening 154. The first opening 152 does not shelter at least a portion of the first capacitor electrode 122, that is, the first opening 152 reveals (or called enables appearance of or exposes) at least a portion of the first capacitor electrode 122. The second opening 154 does not shelter at least a portion of the pixel electrode 124, that is, the second opening 154 reveals (or enables appearance of or exposes) at least a portion of the pixel electrode 124. In other words, the first opening 152 is vertically projected on the first capacitor electrode 122, and the first opening 152 at least partially overlaps the first capacitor electrode 122, which can be regarded as that the first opening 152 is located at at least a portion of the first capacitor electrode 122; the second opening 154 is vertically projected on the pixel electrode 124, and the second opening 154 at least partially overlaps the pixel electrode 124, which can be regarded as that the second opening 154 is located at at least a portion of the pixel electrode 124. The electroluminescent layer 130 and the counter electrode 140 are located in the second opening 154, and the conductive bump 180 is inserted (or called extends, or enters) into the first opening 152, so as to form the structure of the foregoing storage capacitor (the capacitor element CA) of this embodiment.

In this implementation manner, the display panel further includes at least one first connection electrode C1 and at least one second connection electrode C2. The first connection electrode C1 is disposed at each of the sub-pixels 100 of the second substrate 170, so as to be connected to the first sensing electrode SE1 of the sub-pixel 100, and the second capacitor electrode 200 of the sub-pixel 100 is separated from the first connection electrode C1 at which the sub-pixel 100 is located. The second connection electrode C2 is disposed at each of the sub-pixels 100 of the second substrate 170 and is connected to the upper capacitor electrodes 182a of two adjacent sub-pixels 100, and the first connection electrode C1 is interlaced (or namely crossed) with the second connection electrode C2.

Reference is made to FIG. 15A, FIG. 16A, and FIG. 16B at the same time. It should be noted that besides the interlacing region (or namely crossing region) IT, the first sensing electrode region (extending along the first direction DR1) GR1 includes at least one first sensing electrode SE1 and other relevant elements (using some elements on the second substrate 170 as examples: the upper capacitor electrode 182a, the first connection electrode C1, the second connection electrode C2, and the like), but does not include the second sensing electrode SE2 on the first substrate 110. Besides the interlacing region (or namely crossing region) IT, the second sensing electrode region (extending along the second direction DR2) GR2 includes at least one second sensing electrode SE2 and other relevant elements (using some components on the first substrate 110 as examples: the TFT, the pixel electrode 124, the first capacitor electrode 122, and the like), but does not include the at least one first sensing electrodes SE1 and the first connection electrode C1 on the second substrate 170. Therefore, in addition to the elements forming one of the foregoing embodiments of the present disclosure (e.g. one of FIG. 1 to FIG. 8), each sub-pixel at the interlacing region (or namely crossing region) IT further includes the first sensing electrode SE1, the second sensing electrode SE2, the first connection electrode C1, the second connection electrode C2, and relevant elements.

As shown in FIG. 16A, the bank 150 covers the second sensing electrode SE2, the capacitor dielectric layer 190 covers the first sensing electrode SE1, the second connection electrode C2, and the upper capacitor electrode 182a, and the first connection electrode C1 is located at the capacitor dielectric layer 190.

In this implementation manner, preferably, the first sensing electrode SE1 and the upper capacitor electrode 182a are formed by a same patterned layer, and the second sensing electrode SE2, the pixel electrode 124, and the first capacitor electrode 122 are formed by a same patterned layer, but the present disclosure is not limited thereto. The first sensing electrode SE1 has an opening O1, and the second connection electrode C2 passes through (extends through) the opening O1, so as to be electrically connected to the upper capacitor electrode 182a and an upper capacitor electrode (not shown) of another sub-pixel. The first connection electrode C1 passes through the opening O1, so as to be electrically connected to the first sensing electrodes SE1 at two sides of the second connection electrode C2. The second sensing electrode SE2 is located around at least part of the first capacitor electrode 122 and at least part of the pixel electrode 124, for example, the second sensing electrode SE2 surrounds at least part of the first capacitor electrode 122 and at least part of the pixel electrode 124. In some implementation manners, a vertical projection of the first sensing electrode SE1 on the first substrate 110 partially overlaps the second sensing electrode SE2. Other details of this implementation manner are approximately as described earlier, and details are not described herein again.

Figure 17A:
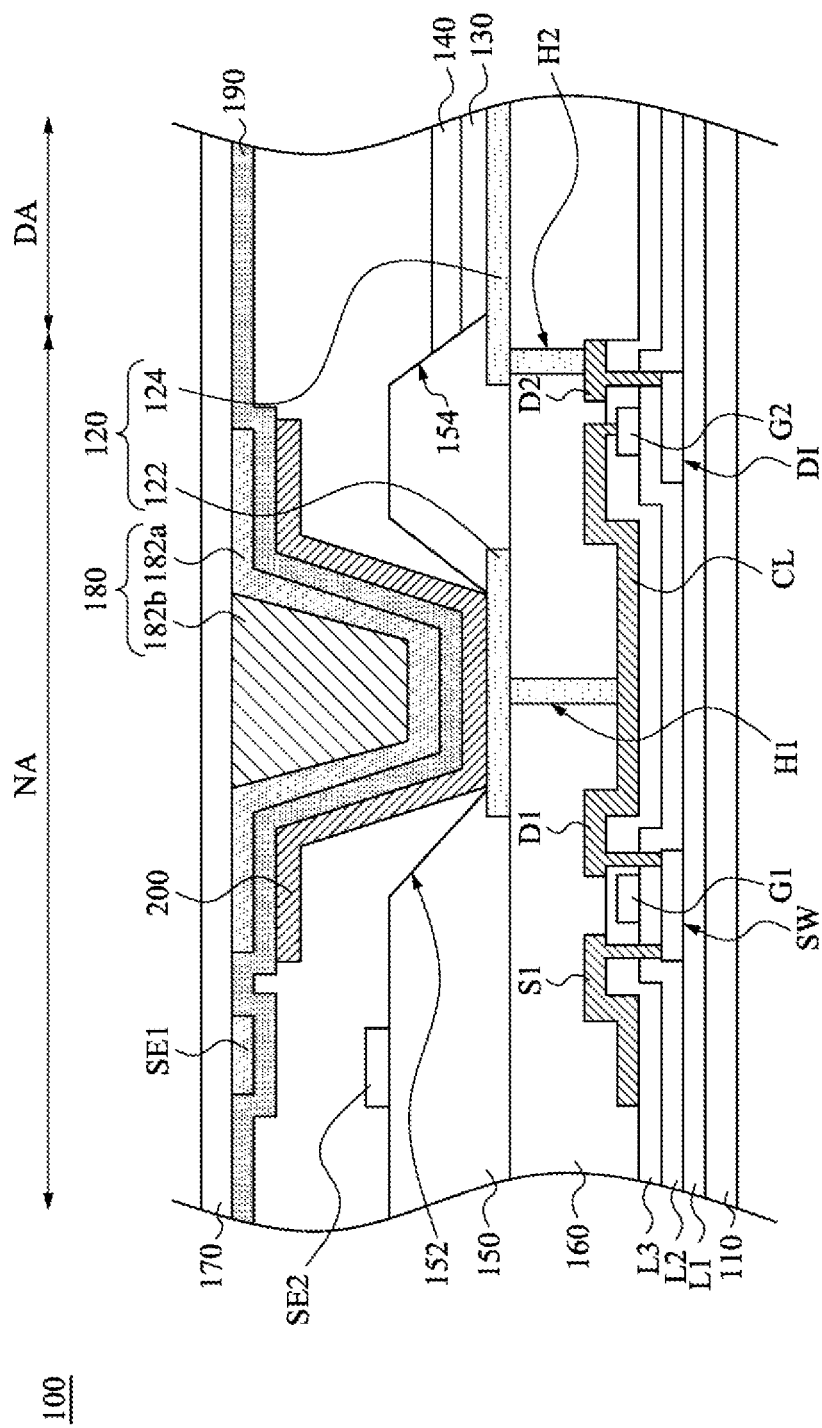
FIG. 17A is a sectional view of a sub-pixel at an interlacing region of a display panel according to a fourteenth implementation manner of the present disclosure.
Figure 17B:
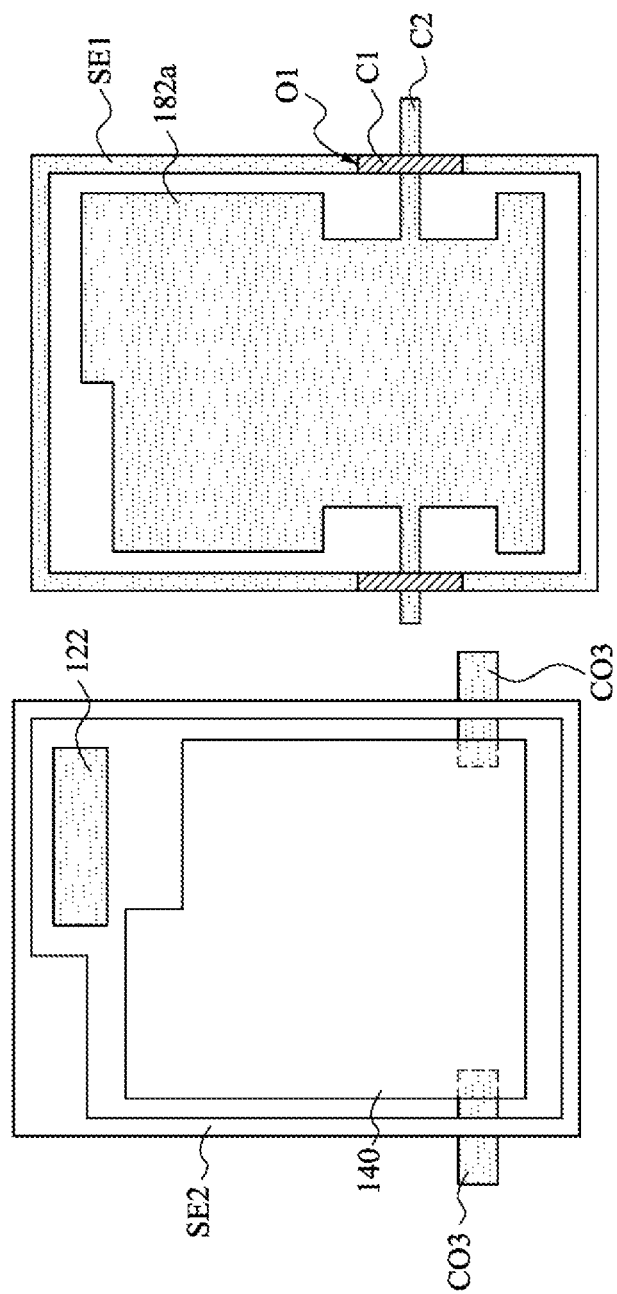
FIG. 17B is a top view of some elements of a second substrate and some elements of a first substrate of the sub-pixel of the display panel according to FIG. 17A.

FIG. 17A is a sectional view of a sub-pixel 100 at an interlacing region IT (referring to FIG. 15A) of a display panel according to a fourteenth implementation manner of the present disclosure. FIG. 17B is a top view of some elements of the second substrate 170 of the sub-pixel 100 (at a right side of the figure) and some elements of the first substrate 110 of the sub-pixel 100 of the display panel (at a left side of the figure) according to FIG. 17A. The sectional view drawn according to the top view of some elements of the second substrate 170 of the sub-pixel 100 of this implementation manner is similar to the implementation manner of FIG. 9C, and the top view and the sectional view of some elements of the first substrate 110 of the sub-pixel 100 of this implementation manner are similar to the sectional view of FIG. 14A and the top view of some elements of the first substrate 110 of FIG. 14B, and a main difference lies in that: the display panel includes at least one first sensing electrode SE1 at the second substrate 170 and at least one second sensing electrode SE2 at the first substrate 110. However, in the implementation manner of FIG. 9C, a sensing electrode SE is located at the second substrate 170, or in the implementation manner of FIG. 14A and FIG. 14B, a sensing electrode SE is located at the first substrate 110.

In a plurality of implementation manners of the present disclosure, the second sensing electrode SE2 is located around at least part of the counter electrode 140, for example, the second sensing electrode SE2 surrounds at least part of the counter electrode 140, so as to form an accommodation region for accommodating the counter electrode 140. The patterned electrode layer 120 of the display panel further includes at least one third connection electrode CO3, disposed at each of the sub-pixels 100 of the first substrate 110. The third connection electrode CO3 is configured to cross the second sensing electrode SE2, so as to be connected to the counter electrodes 140 of two adjacent sub-pixels 100. The pixel electrode 124 is separated from the third connection electrode CO3, and the third connection electrode CO3 is interlaced (or namely crossed) with the second sensing electrode SE2. Preferably, the second sensing electrode SE2 and the counter electrode 140 are formed by a same patterned layer, and the pixel electrode 124 and the first capacitor electrode 122 are formed by a same patterned layer, but the present disclosure is not limited thereto. In some implementation manners of the present disclosure, the second sensing electrode SE2 is located at the bank 150 (e.g. a top surface), and the bank 150 covers a portion of the third connection electrode CO3, as shown in FIG. 17A.

Reference is made to FIG. 15A, FIG. 17A, and FIG. 17B at the same time. It should be noted that besides the interlacing region (or namely crossing region) IT, the first sensing electrode region (extending along the first direction DR1) GR1 includes at least one first sensing electrode SE1 and other relevant elements (using some elements on the second substrate 170 as examples: the upper capacitor electrode 182a, the first connection electrode C1, the second connection electrode C2, and the like), but does not include the second sensing electrode SE2 on the first substrate 110. Besides the interlacing region (or namely crossing region) IT, the second sensing electrode region (extending along the second direction DR2) GR2 includes at least one second sensing electrode SE2 and other relevant elements (using some components on the first substrate 110 as examples: the TFT, the pixel electrode 124, the first capacitor electrode 122, the third connection electrode CO3, the counter electrode 140, and the like), but does not include the at least one first sensing electrodes SE1 and the first connection electrode C1 on the second substrate 170. Therefore, in addition to the elements forming one of the foregoing embodiments of the present disclosure (e.g. one of FIG. 1 to FIG. 8), each sub-pixel at the interlacing region (or namely crossing region) IT further includes the first sensing electrode SE1, the second sensing electrode SE2, the first connection electrode C1, the second connection electrode C2, the third connection electrode CO3, and relevant elements.

In some implementation manners of the present disclosure, the capacitor dielectric layer 190 covers the first sensing electrode SE1, the second connection electrode C2, and the upper capacitor electrode 182a, and the first connection electrode C1 is located at the capacitor dielectric layer 190. The first sensing electrode SE1 is disposed at the non-light emitting region NA, the first sensing electrode SE1 has an opening O1, and the second connection electrode C2 passes through (extends through) the opening O1, so as to be electrically connected to the upper capacitor electrode 182a and an upper capacitor electrode (not shown) of another sub-pixel. The first connection electrode C1 passes through the opening O1, so as to be electrically connected to the first sensing electrodes SE1 at two sides. Preferably, the first connection electrode C1 and the second capacitor electrode 200 are formed by a same patterned layer, the first sensing electrode SE1, the second connection electrode C2, and the upper capacitor electrode 182a are formed by a same patterned layer, but the present disclosure is not limited thereto.

In this implementation manner, a vertical projection of the first sensing electrode SE1 on the patterned electrode layer 120 (that is, the first substrate 110) partially overlaps the second sensing electrode SE2. Other details of this implementation manner are approximately as described earlier, and details are not described herein again.

Figure 18A:
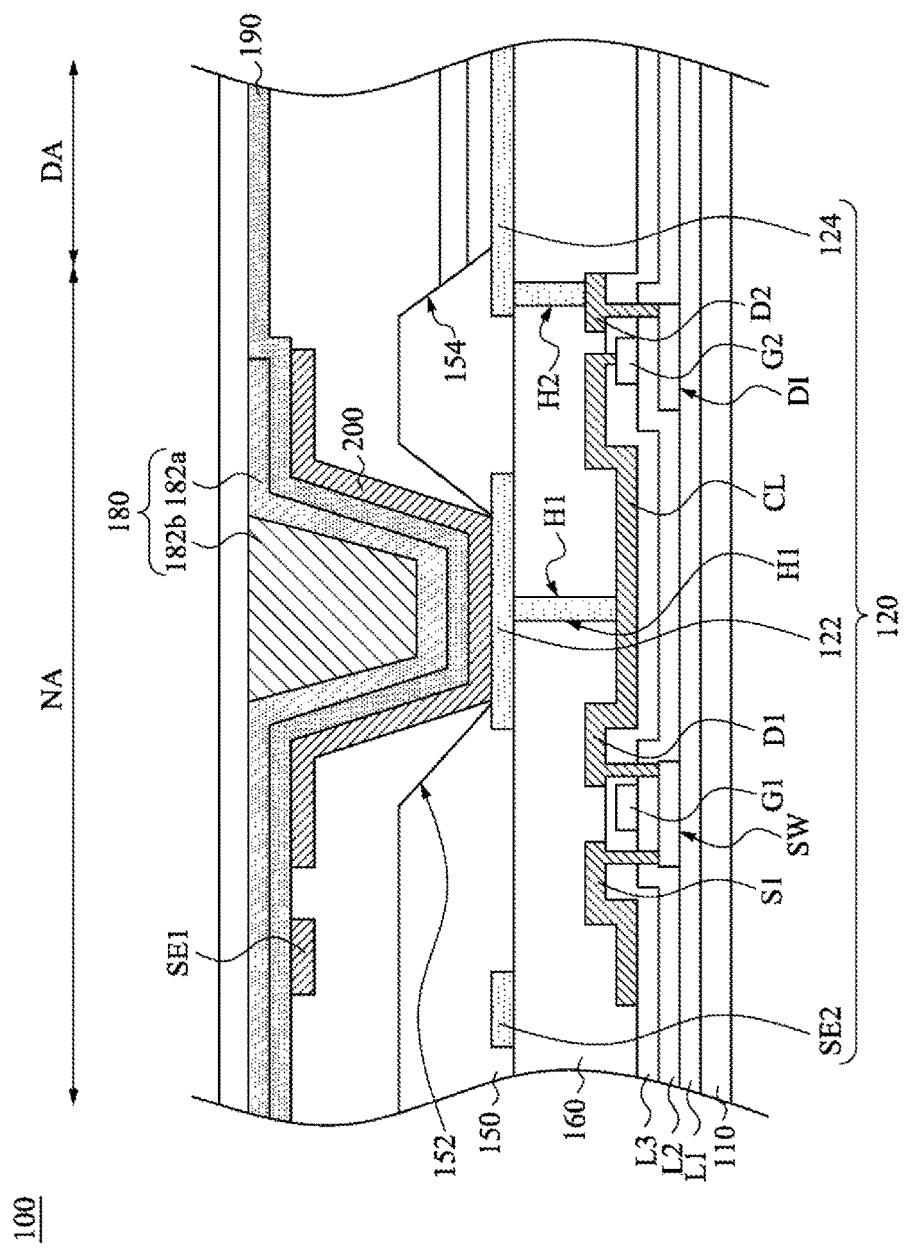
FIG. 18A is a sectional view of a sub-pixel at an interlacing region of a display panel according to a fifteenth implementation manner of the present disclosure.
Figure 18B:
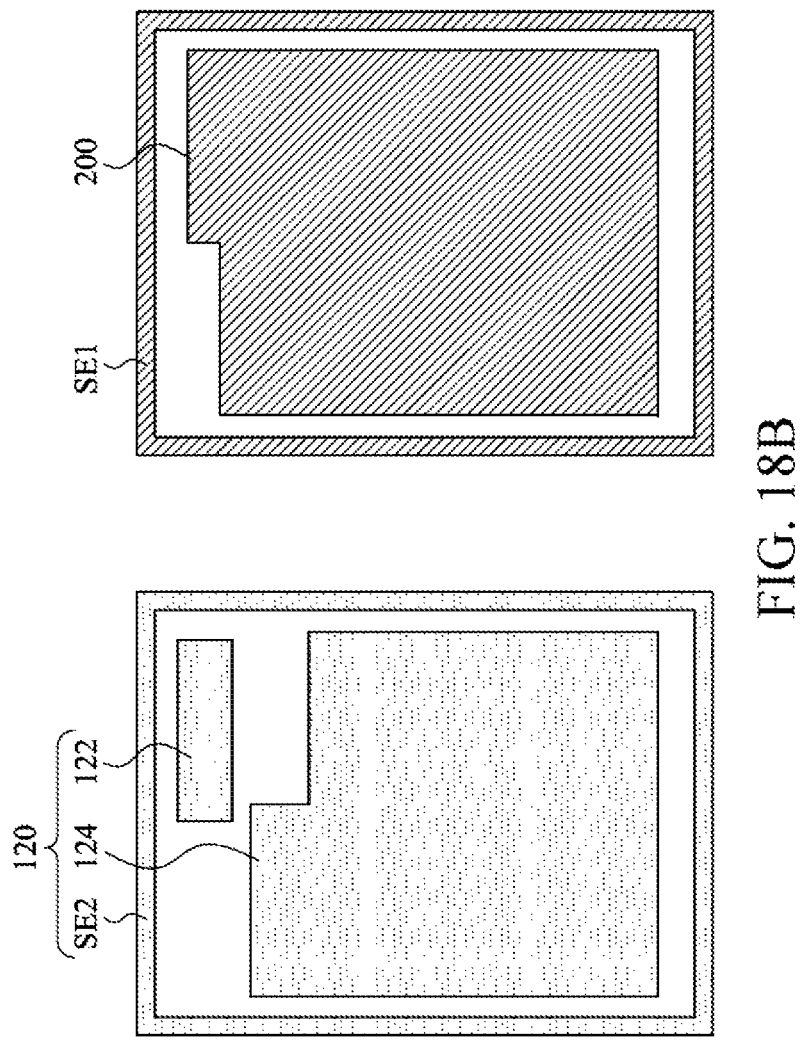
FIG. 18B is a top view of some elements of a second substrate and some elements of a first substrate of the sub-pixel of the display panel according to FIG. 18A.

FIG. 18A is a sectional view of a sub-pixel 100 at an interlacing region IT (referring to FIG. 15A) of a display panel according to a fifteenth implementation manner of the present disclosure. FIG. 18B is a top view of some elements of the second substrate 170 of the sub-pixel 100 (at a right side of the figure) and some elements of the first substrate 110 of the sub-pixel 100 of the display panel (at a left side of the figure) according to FIG. 18A. The sub-pixel 100 of this implementation manner is similar to the sub-pixel 100 of the implementation manner of FIG. 13A, and differs from the sub-pixel 100 of the implementation manner of FIG. 13A in that: in a plurality of implementation manners of the present disclosure, the display panel includes at least one first sensing electrode SE1 at the second substrate 170 and at least one second sensing electrode SE2 at the first substrate 110. However, in the implementation manner of FIG. 13A and FIG. 13B, a sensing electrode SE is located at the first substrate 110.

Referring to FIG. 15A and FIG. 18A at the same time, an interlacing (or namely crossing) position (or namely region) of the first sensing electrode region GR1 and the second sensing electrode region GR2 has at least one interlacing region (or namely crossing region) IT, and the first and the second sensing electrodes SE1, SE2 are interlaced (or namely crossed) at the interlacing region (or namely crossing region) IT. The first sensing electrodes SE1 are separately disposed at the sub-pixels 100 of the first sensing electrode region GR1 (referring to FIG. 15A) of the second substrate 170. The first sensing electrodes SE1 are connected to each other, and the first sensing electrodes SE1 partially overlap the non-light emitting region NA, wherein the upper capacitor electrode 182a and the second capacitor electrode 200 of each sub-pixel 100 are separated from the corresponding first sensing electrode SE1. The second sensing electrodes SE2 are disposed at the sub-pixels 100 of the second sensing electrode region GR2 (referring to FIG. 15A) of the first substrate 110 and are connected to each other, and the second sensing electrodes SE2 partially overlap the non-light emitting region NA, wherein the pixel electrode 124 and the first capacitor electrode 122 of each sub-pixel 100 are separated from the corresponding second sensing electrode SE2, and the first sensing electrodes SE1 are separated from the second sensing electrodes SE2.

Reference is made to FIG. 15A, FIG. 18A, and FIG. 18B at the same time. It should be noted that besides the interlacing region (or namely crossing region) IT, the first sensing electrode region (extending along the first direction DR1) GR1 includes at least one first sensing electrode SE1 and other relevant elements (using some elements on the second substrate 170 as examples: the upper capacitor electrode 182a, the second capacitor electrode 200, and the like), but does not include the second sensing electrode SE2 on the first substrate 110. Besides the interlacing region (or namely crossing region) IT, the second sensing electrode region (extending along the second direction DR2) GR2 includes at least one second sensing electrode SE2 and other relevant elements (using some elements on the first substrate 110 as examples: the TFT, the pixel electrode 124, the first capacitor electrode 122, the counter electrode 140, and the like), but does not include the at least one first sensing electrodes SE1 on the second substrate 170. Therefore, in addition to the elements forming one of the foregoing embodiments of the present disclosure (e.g. one of FIG. 1 to FIG. 8), each sub-pixel at the interlacing region (or namely crossing region) IT further includes the first sensing electrode SE1, the second sensing electrode SE2, and relevant elements.

As shown in FIG. 18A, the first sensing electrode SE1 is located at the capacitor dielectric layer 190, and the bank 150 covers a portion of the second sensing electrode SE2. For the remaining relevant details, reference is made to the foregoing description. In a plurality of implementation manners, as shown in FIG. 18B, the first sensing electrode SE1 on the second substrate 170 is located around at least part of the second capacitor electrode 200, for example, the first sensing electrode SE1 surrounds at least part of the second capacitor electrode 200, the second sensing electrode SE2 on the first substrate 110 is located around at least part of the first capacitor electrode 122 and the pixel electrode 124, for example, the second sensing electrode SE2 surrounds at least part of the first capacitor electrode 122 and the pixel electrode 124, wherein a vertical projection of the first sensing electrode SE1 on the patterned electrode layer 120 (that is, the first substrate 110) partially overlaps the second sensing electrode SE2. Other details of this implementation manner are approximately as described earlier, and details are not described herein again.

Figure 19A:
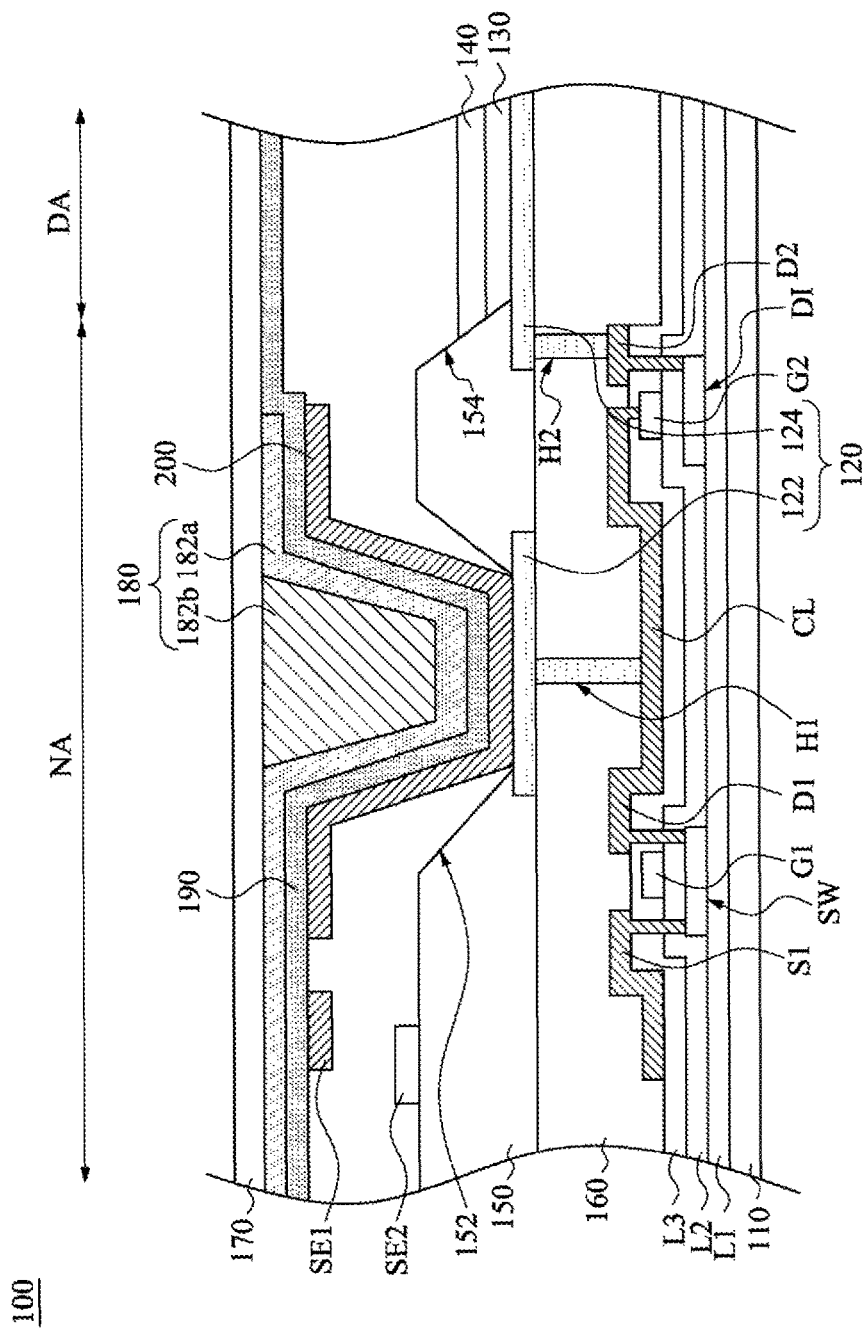
FIG. 19A is a sectional view of a sub-pixel at an interlacing region of a display panel according to a sixteenth implementation manner of the present disclosure.
Figure 19B:
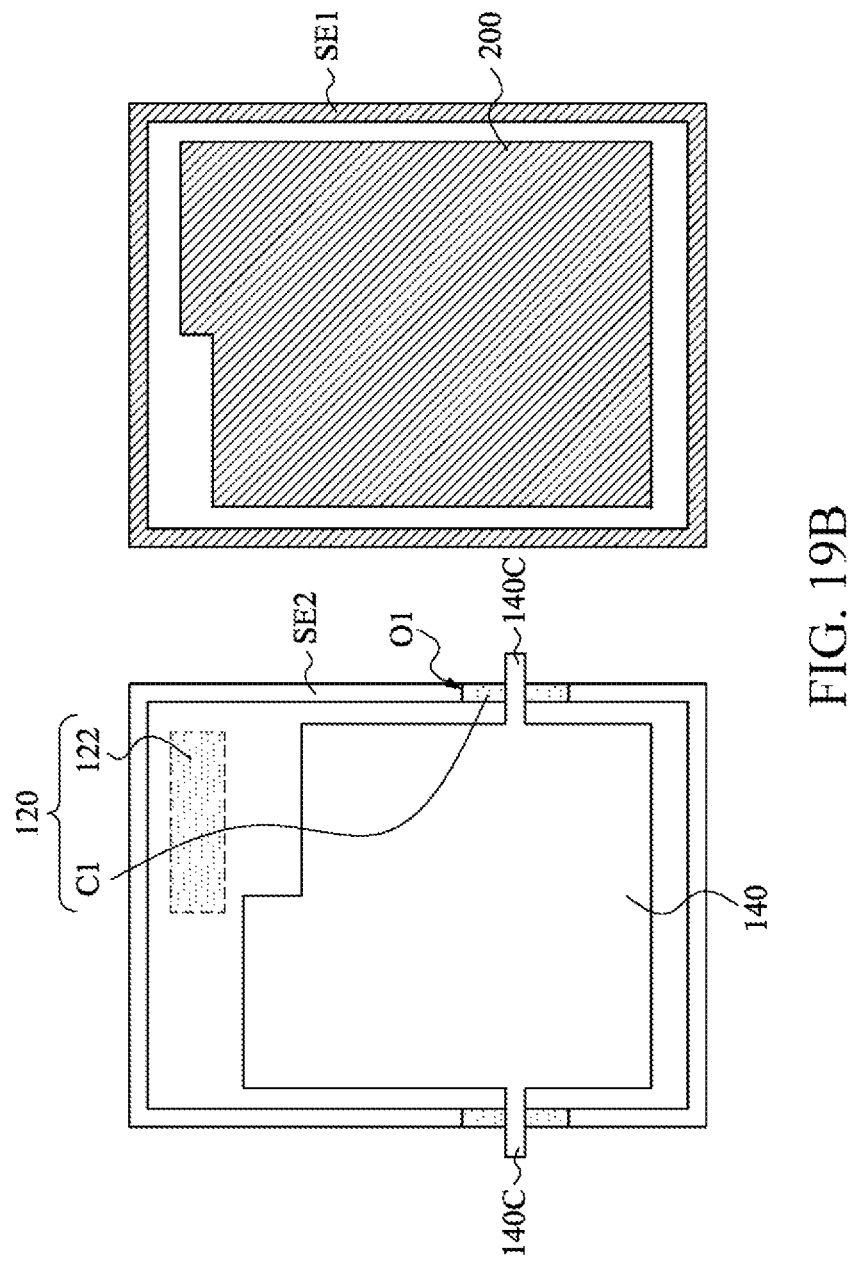
FIG. 19B is a top view of some elements of a second substrate and some elements of a first substrate of the sub-pixel of the display panel according to FIG. 19A.

FIG. 19A is a sectional view of a sub-pixel 100 at an interlacing region IT (referring to FIG. 15A) of a display panel according to a sixteenth implementation manner of the present disclosure. FIG. 19B is a top view of some elements of the second substrate 170 of the sub-pixel 100 (at a right side of the figure) and some elements of the first substrate 110 of the sub-pixel 100 of the display panel (at a left side of the figure) according to FIG. 19A. The sub-pixel 100 of this implementation manner is similar to the sub-pixel 100 of the implementation manner of FIG. 14A, and mainly differs from the sub-pixel 100 of the implementation manner of FIG. 14A in that: the display panel includes at least one first sensing electrode SE1 on the second substrate 170 and at least one second sensing electrode SE2 on the first substrate 110. However, in the implementation manner of FIG. 14A and FIG. 14B, a sensing electrode SE is located at the first substrate 110.

Referring to FIG. 15A and FIG. 19A at the same time, an interlacing (or namely crossing) position (or namely region) of the first sensing electrode region GR1 and the second sensing electrode region GR2 has at least one interlacing region (or namely crossing region) IT, and the first and the second sensing electrodes SE1, SE2 are interlaced (or namely crossed) at the interlacing region (or namely crossing region) IT. The first sensing electrodes SE1 are separately disposed at each sub-pixel 100 of the first sensing electrode region GR1 (referring to FIG. 15A) of the second substrate 170. The first sensing electrodes SE1 are connected to each other, and the first sensing electrodes SE1 partially overlap a non-light emitting region NA, wherein the upper capacitor electrode 182a and the second capacitor electrode 200 of each of the sub-pixels 100 are separated from the corresponding first sensing electrode SE1. The second sensing electrodes SE2 are disposed at the sub-pixels 100 of the second sensing electrode region GR2 (referring to FIG. 15A) of the first substrate 110 and are connected to each other, and the second sensing electrodes SE2 partially overlap the non-light emitting region NA, wherein the pixel electrode 124 and the first capacitor electrode 122 of each of the sub-pixels 100 are separated from the corresponding second sensing electrode SE2, and the first sensing electrodes SE1 are separated from the second sensing electrodes SE2.

In this implementation manner, the display panel further includes at least one first connection electrode C1 and at least one second connection electrode 140C. The first connection electrode C1 is disposed at each of the sub-pixels 100 of the first substrate 110, so as to be connected to the second sensing electrode SE2 of the sub-pixel 100, and the first capacitor electrode 122 of the sub-pixel 100 is separated from the first connection electrode C1 at which the sub-pixel 100 is located. The second connection electrode 140C is disposed at each of the sub-pixels 100 of the first substrate 110 and is connected to counter electrodes 140 of two adjacent sub-pixels 100, and the first connection electrode C1 is interlaced (or namely crossed) with the second connection electrode 140C. Preferably, the second sensing electrode SE2, the second connection electrode 140C, and the counter electrode 140 are formed by a same patterned layer, and the pixel electrode 124, the first connection electrode C1, and the first capacitor electrode 122 are formed by a same patterned layer, but the present disclosure is not limited thereto. In some implementation manners of the present disclosure, the first sensing electrode is located at the capacitor dielectric layer, the second sensing electrode SE2 and the second connection electrode 140C are located at the bank 150 (e.g. a top surface), and the bank 150 covers a portion of the first connection electrode C1, as shown in FIG. 19A.

Reference is made to FIG. 15A, FIG. 19A, and FIG. 19B at the same time. It should be noted that besides the interlacing region (or namely crossing region), the first sensing electrode region (extending along the first direction DR1) GR1 includes at least one first sensing electrode SE1 and other relevant elements (using some elements on the second substrate 170 as examples: the upper capacitor electrode 182a, the second capacitor electrode 200, and the like), but does not include the second sensing electrode SE2 on the first substrate 110. Besides the interlacing region (or namely crossing region) IT, the second sensing electrode region (extending along the second direction DR2) GR2 includes at least one second sensing electrode SE2 and other relevant elements (using some components on the first substrate 110 as examples: the TFT, the pixel electrode 124, the first capacitor electrode 122, the first connection electrode C1, the second connection electrode 140C, the counter electrode 140, and the like), but does not include the at least one first sensing electrodes SE1 on the second substrate 170. Therefore, in addition to the elements forming one of the foregoing embodiments of the present disclosure (e.g. one of FIG. 1 to FIG. 8), each sub-pixel at the interlacing region (or namely crossing region) IT further includes the first sensing electrode SE1, the second sensing electrode SE2, the first connection electrode C1, the second connection electrode 140C, and relevant elements. In another embodiment, in order to connect upper capacitor electrodes 182a of two adjacent sub-pixels, a third connection electrode (not shown) may be further included for connection.

In a plurality of implementation manners of the present disclosure, the first sensing electrode SE1 is located around at least part of the second capacitor electrode 200, for example, the first sensing electrode SE1 surrounds at least part of the second capacitor electrode 200, and the second sensing electrode SE2 is located around at least part of the counter electrode 140, for example, the second sensing electrode SE2 surrounds at least part of the counter electrode 140, wherein a vertical projection of the first sensing electrode SE1 on the first substrate 110 partially overlaps a vertical projection of the second sensing electrode SE2 on the first substrate 110.

In some implementation manners of the present disclosure, the patterned electrode layer 120 further includes the first connection electrode C1. The first sensing electrode SE1 includes an opening O1, and the second connection electrode 140C passes through (extends through) the opening O1, so as to be electrically connected to the counter electrode 140 and a counter electrode of another sub-pixel. The first connection electrode C1 may pass through the opening O1, so as to be electrically connected to the first sensing electrodes SE1 at two sides of the second connection electrode 140C. Other details of this implementation manner are approximately as described earlier, and details are not described herein again.

It should be understood that in the plurality of implementation manners above, vertical projections of the first sensing electrode SE1 and the second sensing electrode SE2 on the first substrate 110 may partially overlap a vertical projection of the scan line SL, the power line PL, or the data line DL on the first substrate 110, so as to reduce an impact on a light transmitting region (for example, the light emitting region DA), but the present disclosure is not limited thereto. Besides, if the foregoing sensing electrodes are required to be made as closed loop type sensing electrodes (e.g. an electromagnetic sensing element), a connection electrode may be additionally disposed between two adjacent sensing electrodes or at an end of each sensing electrode; or a connection electrode may be additionally disposed between the first or the second sensing electrodes or at an end of each of the first or the second sensing electrodes, such that the first or the second sensing electrodes can form the closed loop type sensing electrodes. The plurality of implementation manners of the present disclosure provide a sub-pixel of a display panel, and by means of design of a capacitor dielectric layer in the sub-pixel, an area of a storage capacitor is increased, that is, a storage capacitor element (e.g. solid-state capacitor element) is located between two substrates, and an aperture ratio is increased. In some implementation manners, a self-capacitance or mutual-capacitance sensing electrode is designed, and the sensing electrode and a patterned conductive layer in the sub-pixel are together formed, such that the sub-pixel has a sensing (e.g. touch) function and a display function, thereby simplifying steps of a manufacturing process and reducing the costs. Besides, the sensing electrode is designed to be near a wire, so as to prevent the sensing electrode from affecting a light emitting region.

Although the present disclosure is described above by means of a plurality of implementation manners, the above description is not intended to limit the present disclosure. A person skilled in the art may make various variations and modifications without departing from the spirit and scope of the present disclosure. Therefore, the protection scope of the present disclosure is as defined by the appended claims.

What is claimed is:

1. A display panel, having a first substrate and a second substrate disposed on the first substrate, wherein the display panel is defined to comprise a plurality of sub-pixels, and each of the sub-pixels comprises:
   a data line, disposed on the first substrate, and extending along a first direction;
   a scan line, disposed on the first substrate, and extending along a second direction, wherein the second direction is not parallel to the first direction;
   a power line, disposed on the first substrate, and electrically connected to a first voltage source;
   a switching element, disposed on the first substrate, and comprising two end points and a first gate electrode, wherein one of the two end points of the switching element is electrically connected to the data line, and the first gate electrode is electrically connected to the scan line;

a driving element, comprising two end points and a second gate electrode, wherein one of the two end points of the driving element is electrically connected to the power line, and the second gate electrode is electrically connected to the other end point of the switching element through a connecting wire;

a protective layer, covering the scan line, the data line, the power line, the switching element, the driving element, the connecting wire, and the first substrate, and the protective layer comprises a first through hole and a second through hole;

a patterned electrode layer, disposed on the protective layer and located at a region of the sub-pixel, wherein the patterned electrode layer comprises a first capacitor electrode and a pixel electrode separated from the first capacitor electrode, the pixel electrode is electrically connected to the other end point of the driving element through the first through hole, and the first capacitor electrode is electrically connected to the connecting wire through the second through hole;

an electroluminescent layer, located at the pixel electrode;

a counter electrode, disposed on the electroluminescent layer and electrically connected to a second voltage source, wherein the second voltage source is different from the first voltage source;

a conductive bump, protruding from an inner surface of the second substrate, wherein the conductive bump comprises a conductive material, and the conductive bump is disposed corresponding to the first capacitor electrode in a vertical projection direction; and a capacitor dielectric layer, covering the conductive bump and the inner surface of the second substrate, wherein the conductive bump, the capacitor dielectric layer, and the first capacitor electrode form a storage capacitor.

2. The display panel according to claim 1, further comprising:

a second capacitor electrode, disposed on the capacitor dielectric layer, wherein the second capacitor electrode is located at a top portion of the conductive bump, two opposite surfaces of the second capacitor electrode are in contact with the capacitor dielectric layer and the first capacitor electrode, respectively, and the conductive bump, the capacitor dielectric layer, the second capacitor electrode, and the first capacitor electrode form the storage capacitor.

3. The display panel according to claim 2, wherein the second capacitor electrode further extends to cover the capacitor dielectric layer at a lateral side of the conductive bump or to cover the capacitor dielectric layer at the side of the conductive bump and on the inner surface of the second substrate.

4. The display panel according to claim 1, further comprising:

a conductive buffer layer, disposed on the first capacitor electrode, wherein the conductive buffer layer is in contact with the first capacitor electrode, and the conductive bump, the capacitor dielectric layer, the conductive buffer layer, and the first capacitor electrode form the storage capacitor.

5. The display panel according to claim 4, further comprising:

a second capacitor electrode, disposed on the capacitor dielectric layer, wherein two opposite surfaces of the second capacitor electrode are in contact with the capacitor dielectric layer and the conductive buffer layer, respectively, and the conductive bump, the capacitor dielectric layer, the second capacitor electrode, the conductive buffer layer, and the first capacitor electrode form the storage capacitor.

6. The display panel according to claim 1, wherein the conductive bump comprises an upper capacitor electrode and a bump, each of the sub-pixels has a light emitting region corresponding to the electroluminescent layer and a non-light emitting region at least disposed at a side of the light emitting region, the bump is located at the non-light emitting region, and the upper capacitor electrode at least covers the bump.

7. The display panel according to claim 6, wherein the upper capacitor electrode completely covers the second substrate and the bump.

8. The display panel according to claim 6, further comprising:

a second capacitor electrode, disposed on the capacitor dielectric layer, wherein two opposite surfaces of the second capacitor electrode are in contact with the capacitor dielectric layer and the first capacitor electrode, respectively, and the upper capacitor electrode, the capacitor dielectric layer, the second capacitor electrode, and the first capacitor electrode form the storage capacitor.

9. The display panel according to claim 6, wherein the sub-pixels are defined with at least two first sensing electrode regions and at least two second sensing electrode regions separated from the first sensing electrode regions, and the display panel further comprises:

a plurality of sensing electrodes, disposed on the first sensing electrode regions and the second sensing electrode regions on the second substrate, respectively, wherein each of the sensing electrodes partially overlaps the non-light emitting region, and the sensing electrodes at the first sensing electrode regions are separated from the sensing electrodes at the second sensing electrode regions.

10. The display panel according to claim 9, further comprising:

at least one first connection electrode, disposed on the second substrate, wherein the first connection electrode is connected to upper capacitor electrodes of two adjacent sub-pixels, and the first connection electrode is separated from and partially overlaps the sensing electrodes of the two adjacent sub-pixels; and a second capacitor electrode, disposed on the second substrate and located at a side of the capacitor dielectric layer, wherein the side of the capacitor dielectric layer faces the patterned electrode layer, and the second capacitor electrode at least partially overlaps the upper capacitor electrode.

11. The display panel according to claim 10, wherein the sub-pixels are defined with a first bridge electrode region and a second bridge electrode region separated from and interlaced with the first bridge electrode region, and the display panel further comprises:

a second connection electrode, disposed on the second substrate, and located at each of the sub-pixels of the first bridge electrode region, so as to be connected to one of the sensing electrodes at each of the first sensing electrode regions; and a third connection electrode, disposed on the second substrate, and located at each of the sub-pixels of the second bridge electrode region, so as to be connected to another one of the sensing electrodes at each of the second sensing electrode regions, wherein the second connection electrode is separated from and interlaced with the third connection electrode.

12. The display panel according to claim 11, wherein the second connection electrode comprises:
- at least one first sub-electrode segment, located between two adjacent sub-pixels of the first bridge electrode region, wherein the first sub-electrode segment partially overlaps the sensing electrodes of the two adjacent sub-pixels at the first bridge electrode region; and
- at least one second sub-electrode segment, located at each of the sub-pixels of the first bridge electrode region, so as to be connected to the first sub-electrode segment.

13. The display panel according to claim 6, wherein the sub-pixels are defined with at least two first sensing electrode regions and at least two second sensing electrode regions separated from the first sensing electrode regions, wherein the display panel further comprises:
- a plurality of sensing electrodes, disposed at the first sensing electrode regions and the second sensing electrode regions on the second substrate, respectively, and partially overlapping the light emitting region, wherein the sensing electrodes at the first sensing electrode regions are separated from the sensing electrodes at the second sensing electrode regions; and
- at least one first connection electrode, disposed on the second substrate, wherein the first connection electrode is connected to the sensing electrodes of two adjacent sub-pixels.

14. The display panel according to claim 13, further comprising:
- a second capacitor electrode, disposed on the second substrate, and located at a side of the capacitor dielectric layer, wherein the side of the capacitor dielectric layer faces the patterned electrode layer, and the second capacitor electrode partially overlaps the upper capacitor electrode; and
- at least one second connection electrode, disposed on the second substrate, wherein the second connection electrode is connected to the upper capacitor electrodes of two adjacent sub-pixels, and the second connection electrode is separated from the first connection electrode.

15. The display panel according to claim 14, wherein the sub-pixels are defined with a first bridge electrode region and a second bridge electrode region separated from and interlaced with the first bridge electrode region, wherein the display panel further comprises:
- a third connection electrode, disposed on the second substrate, and located at each of the sub-pixels of the second bridge electrode region, so as to be connected to one of the sensing electrodes located at each of the second sensing electrode regions, wherein the third connection electrode is separated from another one of the sensing electrodes of each of the sub-pixels at the second bridge electrode region.

16. The display panel according to claim 13, wherein the sub-pixels are defined with a first bridge electrode region and a second bridge electrode region separated from and interlaced with the first bridge electrode region, wherein the display panel further comprises:
- a second capacitor electrode, disposed on the second substrate, and located at a side of the capacitor dielectric layer, wherein the side of the capacitor dielectric layer faces the patterned electrode layer, and the second capacitor electrode partially overlaps the upper capacitor electrode; and
- at least one second connection electrode, disposed on the second substrate, and extending to pass through the sub-pixels at the second bridge electrode region, so as to be electrically connected to one of sensing electrodes at each of the second sensing electrode regions, wherein the second connection electrode is separated from the first connection electrode, and the second connection electrode is not connected to any sensing electrodes at the second bridge electrode region.

17. The display panel according to claim 6, wherein the sub-pixels are defined with at least two first sensing electrode regions and at least two second sensing electrode regions separated from the first sensing electrode regions, the patterned electrode layer further comprises a sensing electrode, disposed on each of the first sensing electrode regions and the second sensing electrode regions on the first substrate, each of the sensing electrodes partially overlaps the non-light emitting region, the pixel electrode and the first capacitor electrode of each of the sub-pixels are separated from the sensing electrode of each of the sub-pixels; and the sensing electrodes of the first sensing electrode regions are separated from the sensing electrodes of the second sensing electrode regions.

18. The display panel according to claim 17, further comprising:
- a bank, disposed on the protective layer, and having a first opening and a second opening, wherein the first opening does not shelter at least a portion of the first capacitor electrode; the second opening does not shelter at least a portion of the pixel electrode; the electroluminescent layer and the counter electrode are located in the second opening; and the bank covers the sensing electrode.

19. The display panel according to claim 6, wherein the sub-pixels are defined with at least two first sensing electrode regions and at least two second sensing electrode regions separated from the first sensing electrode regions, the display panel further comprises a plurality of sensing electrodes, disposed on the first sensing electrode regions and the second sensing electrode regions on the first substrate, respectively, the sensing electrodes partially overlaps the non-light emitting region; the pixel electrode, the counter electrode, and the first capacitor electrode of each of the sub-pixels are separated from the sensing electrode of each of the sub-pixels; and the sensing electrodes of the first sensing electrode regions are separated from the sensing electrodes of the second sensing electrode regions.

20. The display panel according to claim 19, further comprising:
- at least one first connection electrode, disposed between two adjacent sub-pixels of each of the first sensing electrode regions and the second sensing electrode regions respectively, so as to be connected to the counter electrodes of the two adjacent sub-pixels, wherein the pixel electrode, the sensing electrode, and the first capacitor electrode of each of the sub-pixels are separated from the first connection electrode.

21. The display panel according to claim 20, further comprising:
- a bank, disposed on the protective layer, and having a first opening and a second opening, wherein the first opening does not shelter at least a portion of the first capacitor electrode, the second opening does not shelter at least a portion of the pixel electrode, the electroluminescent layer and the counter electrode are located in the second opening, the sensing electrode is disposed on the bank, and the bank covers the first connection electrode.

22. The display panel according to claim 6, wherein the sub-pixels are defined with at least one first sensing electrode region and at least one second sensing electrode region interlaced with and separated from the first sensing electrode region, the patterned electrode layer further comprises
- at least one first sensing electrode, disposed on each of the sub-pixels of the first sensing electrode region of the first substrate and connected to each other, the first sensing electrode partially overlaps the non-light emitting region, the pixel electrode and the first capacitor electrode of each of the sub-pixels are separated from the first sensing electrode, the display panel further comprises a bank, disposed on the protective layer, and having a first opening and a second opening, the first opening does not shelter at least a portion of the first capacitor electrode, the second opening does not shelter at least a portion of the pixel electrode, the electroluminescent layer and the counter electrode are located in the second opening, and the bank covers the first sensing electrode; and
- at least one second sensing electrode, disposed on each of the sub-pixels of the second sensing electrode region of the first substrate, respectively, and connected to each other, the second sensing electrode partially overlaps the non-light emitting region, the second sensing electrode is disposed on the bank, the counter electrode of each of the sub-pixels is separated from the second sensing electrode, and the first sensing electrode is separated from the second sensing electrode.

23. The display panel according to claim 22, wherein at least one interlacing region is provided at an interlacing position of the first sensing electrode region and the second sensing electrode region, the first and the second sensing electrodes are interlaced at the interlacing region, and the display panel further comprises:
- at least one first connection electrode, disposed at each of the sub-pixels of the first substrate, so as to be connected to the second sensing electrode of each of the sub-pixels, wherein the second sensing electrode of each of the sub-pixels is separated from the pixel electrode of the sub-pixel; and
- at least one second connection electrode, disposed at each of the sub-pixels of the first substrate, wherein the second connection electrode is located at the bank and is connected to the counter electrodes of two adjacent sub-pixels in the interlacing region; and the first connection electrode and the second connection electrode are interlaced at the interlacing region.

24. The display panel according to claim 23, wherein the bank further covers the first sensing electrode and a portion of the first connection electrode, and the second connection electrode is located at the bank.

25. The display panel according to claim 6, wherein the sub-pixels are defined with at least one first sensing electrode region and at least one second sensing electrode region interlaced with and separated from the first sensing electrode region, wherein the display panel further comprises:
- at least one first sensing electrode, disposed on each of the sub-pixels of the first sensing electrode region of the second substrate, respectively, and connected to each other, wherein the first sensing electrode partially overlaps the non-light emitting region, and the upper capacitor electrode and a second capacitor electrode of each of the sub-pixels are separated from the first sensing electrode; and
- at least one second sensing electrode, disposed on each of the sub-pixels of the second sensing electrode region of the first substrate, respectively, and connected to each other, wherein the second sensing electrode partially overlaps the non-light emitting region, the pixel electrode and the first capacitor electrode of each of the sub-pixels are separated from the second sensing electrode, and the first sensing electrode is separated from the second sensing electrode.

26. The display panel according to claim 25, further comprising:
- a bank, disposed on the protective layer, and having a first opening and a second opening, wherein the first opening does not shelter at least a portion of the first capacitor electrode; the second opening does not shelter at least a portion of the pixel electrode; and the electroluminescent layer and the counter electrode are located in the second opening.

27. The display panel according to claim 26, wherein at least one interlacing region is provided at an interlacing position of the first sensing electrode region and the second sensing electrode region, the first and the second sensing electrodes are interlaced at the interlacing region, and the display panel further comprises:
- at least one first connection electrode, disposed at each of the sub-pixels of the second substrate, so as to be connected to the first sensing electrode of each of the sub-pixels, wherein a second capacitor electrode of each of the sub-pixels is separated from the first connection electrode; and
- at least one second connection electrode, disposed at each of the sub-pixels of the second substrate and connected to the upper capacitor electrodes of two adjacent sub-pixels, wherein the first connection electrode is interlaced with the second connection electrode.

28. The display panel according to claim 27, wherein the bank covers the second sensing electrode, the capacitor dielectric layer covers the first sensing electrode, the second connection electrode, and the upper capacitor electrode, and the first connection electrode is located at the capacitor dielectric layer.

29. The display panel according to claim 27, further comprising:
- at least one third connection electrode, disposed at each of the sub-pixels of the first substrate and connected to the counter electrodes of two adjacent sub-pixels, wherein the pixel electrode is separated from the third connection electrode, and the third connection electrode is interlaced with the second sensing electrode.

30. The display panel according to claim 29, wherein the second sensing electrode is located at the bank, the bank covers a portion of the third connection electrode, the capacitor dielectric layer covers the first sensing electrode, the second connection electrode, and the upper capacitor electrode, and the first connection electrode is located at the capacitor dielectric layer.

31. The display panel according to claim 26, wherein at least one interlacing region is provided at an interlacing position of the first sensing electrode region and the second sensing electrode region, the first and the second sensing electrodes are interlaced at the interlacing region, the first sensing electrode is located at the capacitor dielectric layer, and the bank covers a portion of the second sensing electrode.

32. The display panel according to claim 26, wherein at least one interlacing region is provided at an interlacing position of the first sensing electrode region and the second sensing electrode region, the first and the second sensing electrodes are interlaced at the interlacing region, and the display panel further comprises:

at least one first connection electrode, disposed at each of the sub-pixels of the first substrate, so as to be connected to the second sensing electrode of each of the sub-pixels, wherein the first capacitor electrode of each of the sub-pixels is separated from the first connection electrode; and at least one second connection electrode, disposed at each of the sub-pixels of the first substrate and connected to the counter electrodes of two adjacent sub-pixels, wherein the first connection electrode is interlaced with the second connection electrode.

33. The display panel according to claim 1, further comprising:

a bank, disposed on the protective layer, and having a first opening and a second opening, wherein the first opening does not shelter at least a portion of the first capacitor electrode; the second opening does not shelter at least a portion of the pixel electrode; and the electroluminescent layer and the counter electrode are located in the second opening.

34. A display panel, comprising:

a substrate;

a conductive bump protruding from an inner surface of the substrate, wherein the conductive bump comprises an upper capacitor electrode and a bump covered by the upper capacitor electrode, and the bump is disposed between the inner surface of the substrate and the upper capacitor electrode;

a capacitor dielectric layer, covering the conductive bump and a portion of the inner surface of the substrate;

a first sensing electrode, disposed on the inner surface of the substrate;

a counter substrate, disposed opposite to the substrate, wherein the counter substrate has at least one pixel electrode and one first capacitor electrode separated from the pixel electrode, the pixel electrode is connected to an end point of a driving element, a gate electrode of the driving element is connected to an end point of a switching element through a connecting wire, and the first capacitor electrode is connected to the connecting wire;

an electroluminescent layer, disposed between the substrate and the counter substrate, and located at the pixel electrode; and a counter electrode, disposed on the electroluminescent layer.

35. The display panel according to claim 34, wherein the first sensing electrode surrounds the upper capacitor electrode.

36. The display panel according to claim 34, further comprising:

a first connection electrode, disposed on the inner surface of the substrate and electrically connected to the upper capacitor electrode or the first sensing electrode; and a second capacitor electrode, disposed on the inner surface of the substrate, and located at a side of the capacitor dielectric layer, wherein the side of the capacitor dielectric layer faces an inner surface of the counter substrate.

37. The display panel according to claim 34, further comprising:

a second sensing electrode, disposed on the inner surface of the substrate or an inner surface of the counter substrate, wherein the second sensing electrode is interlaced with the first sensing electrode.

38. The display panel according to claim 34, wherein the upper capacitor electrode surrounds the first sensing electrode.

39. A display panel, comprising:

a substrate;

a conductive bump protruding from an inner surface of the substrate, wherein the conductive bump comprises an upper capacitor electrode and a bump covered by the upper capacitor electrode, and the bump is disposed between the inner surface of the substrate and the upper capacitor electrode;

a capacitor dielectric layer, covering the conductive bump and a portion of the inner surface of the substrate;

a counter substrate, disposed opposite to the substrate;

a patterned electrode layer, disposed on an inner surface of the counter substrate, wherein the patterned electrode layer comprises a first capacitor electrode and a pixel electrode separated from the first capacitor electrode, the pixel electrode is connected to an end point of a driving element, a gate electrode of the driving element is connected to an end point of a switching element through a connecting wire, and the first capacitor electrode is connected to the connecting wire;

an electroluminescent layer, located at the pixel electrode;

a counter electrode, disposed on the electroluminescent layer; and a first sensing electrode, disposed on the inner surface of the counter substrate.

40. The display panel according to claim 39, wherein the patterned electrode layer further comprises a first connection electrode, disposed on the counter substrate and electrically connected to the counter electrode.

41. The display panel according to claim 40, further comprising:

a second sensing electrode, disposed on the counter substrate and interlaced with the first sensing electrode.

42. The display panel according to claim 41, wherein the patterned electrode layer further comprises a second connection electrode, electrically connected to the second sensing electrode.

43. The display panel according to claim 39, further comprising:

a bank, disposed on the patterned electrode layer, and having a first opening and a second opening, wherein the first opening does not shelter at least a portion of the first capacitor electrode, the second opening does not shelter at least a portion of the pixel electrode, and the electroluminescent layer and the counter electrode are located in the second opening.

* * * * *